(12) United States Patent
Jang

(10) Patent No.: US 12,389,715 B2
(45) Date of Patent: Aug. 12, 2025

(54) METHOD FOR MANUFACTURING SEMICONDUCTOR LIGHT-EMITTING DEVICE

(71) Applicant: WAVELORD CO., LTD, Gyeonggi-do (KR)

(72) Inventor: Tae Jin Jang, Gyeonggi-do (KR)

(73) Assignee: WAVELORD CO., LTD, Gyeonggi-do (KR)

(*) Notice: Subject to any disclaimer, the term of this patent is extended or adjusted under 35 U.S.C. 154(b) by 616 days.

(21) Appl. No.: 17/781,398

(22) PCT Filed: Dec. 7, 2020

(86) PCT No.: PCT/KR2020/017767
§ 371 (c)(1),
(2) Date: Oct. 27, 2022

(87) PCT Pub. No.: WO2021/112648
PCT Pub. Date: Jun. 10, 2021

(65) Prior Publication Data
US 2023/0069883 A1 Mar. 9, 2023

(30) Foreign Application Priority Data

Dec. 5, 2019 (KR) .................. 10-2019-0161050
Dec. 5, 2019 (KR) .................. 10-2019-0161052
(Continued)

(51) Int. Cl.
*H10H 20/01* (2025.01)
*H10H 20/857* (2025.01)

(52) U.S. Cl.
CPC ........ *H10H 20/018* (2025.01); *H10H 20/857* (2025.01); *H10H 20/0364* (2025.01)

(58) Field of Classification Search
CPC . H10H 20/018; H10H 20/857; H10H 20/0364
See application file for complete search history.

(56) References Cited

U.S. PATENT DOCUMENTS

| 7,067,340 B1* | 6/2006 | Tsai | H10H 20/018 438/47 |
| 2008/0142813 A1* | 6/2008 | Chang | H10H 20/018 438/45 |
| 2018/0286734 A1* | 10/2018 | Meitl | H01L 21/6835 |

FOREIGN PATENT DOCUMENTS

| JP | 2002-338398 A | 11/2002 |
| KR | 10-2011-0021569 A | 3/2011 |

(Continued)

OTHER PUBLICATIONS

International Search Report from corresponding PCT Application No. PCT/KR2020/017767, dated Mar. 22, 2021.

*Primary Examiner* — Joshua Benitez Rosario
*Assistant Examiner* — Jacob T Nelson
(74) *Attorney, Agent, or Firm* — Harness, Dickey & Pierce, P.L.C.

(57) ABSTRACT

The present disclosure relates to a method of manufacturing a semiconductor light emitting device, the method comprising: providing a growth substrate on which a first semiconductor region, an active region and a second semiconductor region are sequentially formed; bonding a first light transmitting substrate to the second semiconductor region; removing the growth substrate from the first semiconductor region; attaching a second light transmitting substrate through an adhesive layer to the first semiconductor region from which the growth substrate is removed; laser ablating the first light transmitting substrate from the second semiconductor region; exposing part of the first semiconductor region, and forming a first flip chip electrode and a second flip chip electrode on the exposed first semiconductor region and the exposed second semiconductor region, respectively.

5 Claims, 52 Drawing Sheets

(30) Foreign Application Priority Data

| Dec. 5, 2019 | (KR) | ......................... 10-2019-0161053 |
| Dec. 27, 2019 | (KR) | ......................... 10-2019-0177108 |
| Dec. 27, 2019 | (KR) | ......................... 10-2019-0177111 |
| Dec. 27, 2019 | (KR) | ......................... 10-2019-0177113 |
| Dec. 27, 2019 | (KR) | ......................... 10-2019-0177116 |
| Jan. 8, 2020 | (KR) | ......................... 10-2020-0002810 |
| Jan. 8, 2020 | (KR) | ......................... 10-2020-0002811 |
| Jan. 8, 2020 | (KR) | ......................... 10-2020-0002812 |
| Jan. 8, 2020 | (KR) | ......................... 10-2020-0002813 |
| Mar. 6, 2020 | (KR) | ......................... 10-2020-0028465 |
| Mar. 6, 2020 | (KR) | ......................... 10-2020-0028468 |
| Mar. 6, 2020 | (KR) | ......................... 10-2020-0028473 |
| Apr. 14, 2020 | (KR) | ......................... 10-2020-0045508 |
| Apr. 14, 2020 | (KR) | ......................... 10-2020-0045510 |

(56) References Cited

FOREIGN PATENT DOCUMENTS

| KR | 10-1068864 B1 | 9/2011 |
| KR | 10-2015-0107165 A | 9/2015 |

* cited by examiner (a)

(b)

(c)

(a)

(b)

(a)

(b)

(a)

(b)

(a)

(b)

(c)

(a)

(b)

(c)

(a)

(b)

(c)

(a)

(b)

(c)

(e)

(f)

(g)

(h)

(a)

(b)

(c)

METHOD FOR MANUFACTURING SEMICONDUCTOR LIGHT-EMITTING DEVICE

CROSS-REFERENCE TO RELATED APPLICATIONS

This application is a national phase application of PCT Application No. PCT/KR2020/017767, filed on 7 Dec. 2020, which claims the benefit and priority to Korean Patent Application Nos. 10-2019-0161050, filed on 5 Dec. 2019, 10-2019-0161052, filed on 5 Dec. 2019, 10-2019-0161053, filed on 5 Dec. 2019, 10-2019-0177108 filed on 27 Dec. 2019, 10-2019-0177111, filed on 27 Dec. 2019, 10-2019-0177113, filed on 27 Dec. 2019, 10-2019-0177116, filed on 27 Dec. 2019, 10-2020-0002810, filed on 8 Jan. 2020, 10-2020-0002811, filed on 8 Jan. 2020, 10-2020-0002812, filed on 10-2020-0002813, filed 8 Jan. 2020, 10-2020-0028465, filed on 6 Mar. 2020, 10-2020-0028468, filed on 6 Mar. 2020, 10-2020-0028473, filed on 6 Mar. 2020, 10-2020-0045508, filed on 14 Apr. 2020, and 10-2020-0045510, filed on 14 Apr. 2020. The entire disclosures of the applications identified in this paragraph are incorporated herein by references.

TECHNICAL FIELD

This disclosure relates generally to a semiconductor light emitting device and methods of manufacturing such a semiconductor light emitting device. In particular, it relates to a semiconductor light emitting device for use in mini-LED (having a width of approximately 100 μm (up to 300 μm)) displays or micro-LED (having a width less than 100 μm) displays, and methods of manufacturing such a semiconductor light emitting device. Unlike those conventional LED-backlit LCDs where a semiconductor light emitting device is used as a backlight, micro-LED displays utilize a semiconductor light emitting device for direct light emission as in those OLED displays. In the context herein, the term "semiconductor light emitting device" refers to a semiconductor optoelectronic device which generates light by electron-hole recombination. One example thereof an AlGaInN-based semiconductor light emitting device used for UV, blue and green emissions, and an AlGaInP(As)-based semiconductor light emitting device used for red emission.

BACKGROUND

This section provides background information related to the present disclosure which is not necessarily prior art.

FIG. 1 shows an example of a semiconductor light emitting structure described in US Patent Application Publication No. US 2019/0067255, wherein the semiconductor light emitting structure comprises a first semiconductor light emitting device 101 (e.g., a red light emitting LED flip chip), a second semiconductor light emitting device 103 (e.g., a blue light emitting LED flip chip), a third semiconductor light emitting device 105 (e.g., a green light emitting LED flip chip), and a wiring board 107 on which the three semiconductor light emitting devices 101, 103 and 105 are arranged.

FIG. 2 shows an example of a semiconductor light emitting device described in US Patent Application Publication No. US 2019/0067525, which can be used in the semiconductor light emitting structure of FIG. 1. Here, the semiconductor light emitting device comprises a P-type GaP window layer 104, a P-type confinement layer 106, an MQW active layer 108, an N-type confinement layer 110 and an N-type current expansion layer 112. The semiconductor light emitting device further comprises a metal reflective layer 164, an N-side electrode 182 and a P-side electrode 180, which are provided on a side where the growth substrate has been removed. On the opposite side of the device from them, there are provided a P-type current expansion layer 118 (e.g., ITO), a transparent bonding layer 130 and a transparent substrate 102. Hence, the semiconductor light emitting device with this configuration can emit red light. However, when an N-type AlGaInP(As)-based semiconductor layer is placed on the side where the electrodes 180 and 182 are disposed, i.e. on the side where flip chip bonding with the lead electrode, wiring or wiring board (i.e., N-side flip chip) is performed, in particular, with chips currently available being ultrasmall, it is hard to perform electrical connection and the MESA etching process for removing the thick N-type semiconductor regions 110 and 112 and the MQW active region 108 to inject current from the P-side electrode 180 to the P-type semiconductor regions 104 and 106, and it is known that excessive heat is produced by non-uniform current flow in the N-type semiconductor regions 110 and 112. In order to overcome this problem, P-side up flip chips have been considered and there are two conventional techniques known in the art.

FIG. 3 shows an example of a semiconductor light emitting device described in U.S. Pat. No. 5,376,580. Here, the semiconductor light emitting device comprises a P-type GaAs substrate 14, a P-type semiconductor region 11 (e.g., AlGaAs), an active region 12 and an N-type semiconductor region 13 (e.g., AlGaAs). When this type of semiconductor light emitting device (e.g., the P-type semiconductor region 11 is grown first during the epitaxial growth process) undergoes the electrode formation process illustrated in FIG. 2, a so-called P-side up flip can be manufactured. However, whether it is for AlGaInN-based semiconductor light emitting device or for an AlGaInP(As)-based semiconductor light-emitting device, if the P-type semiconductor region 11 is grown before the N-type semiconductor region 13, the resulting surface becomes rough, which negatively affects the subsequent growth of the active region, causing deterioration in electrical/optical properties of the active region during its growth. Nevertheless, many semiconductor light emitting devices commercially available nowadays are manufactured by growing the P-type semiconductor region 11 before the N-type semiconductor region 13 during the epitaxial growth.

FIGS. 4 to 7 illustrate a method of manufacturing a semiconductor light emitting device described in U.S. Pat. No. 7,067,340. First, as shown in FIG. 4, an N-type semiconductor region 302, an active region 304 and a P-type semiconductor region 306 are sequentially formed on a growth substrate 300 (e.g., a GaAs substrate), and then a temporary substrate 310 (e.g., glass, silicon, ceramic or Al₂O₃) is attached to the P-type semiconductor region 306 using a soft transparent adhesive layer 308 (e.g., BCB (Bisbenzocyclobutene), polyimide, glass, or epoxy). Referring next to FIG. 5, the growth substrate 300 is removed, with the temporary substrate 310 serving as a support substrate. Following the removal of the growth substrate 300 from the N-type semiconductor region 302, as shown in FIG. 6, a light transmitting substrate 314 (e.g., any substrate having light transmitting properties, such as sapphire, glass, GaP or SiC) is attached to the N-type semiconductor region 302, using a soft transparent adhesive layer 312 (e.g., BCB, polyimide, glass, or epoxy). Subsequently, the soft transparent adhesive layer 308 and the temporary substrate 310 are removed. Lastly, referring to FIG. 7, the P-type semiconductor region 306 and the active region 304 are partly removed by etching, and N-side electrodes 316, 318 and 320 and P-side electrodes 316, 318 and 322 are formed on the N-type semiconductor region 302 and the P-type semiconductor region 306, respectively, to obtain a semiconductor light emitting device. The electrode 316 is a metal reflective layer (e.g., Au, Al, Ag or an Ag alloy), the electrode 318 is a barrier layer (e.g., Ni, W, TiN, WN, Pt, ZnO or ITO), the electrodes 320 and 322 are bonding pad layers (e.g., Au or Al). The semiconductor light emitting device shown in FIGS. 4 to 7 differs from the one shown in FIG. 3 in that it is manufactured into a P-side up flip chip through the chip process, rather than the epitaxial growth process. However, since the same type of a soft transparent adhesive layer 308, 312 is used for attaching the temporary substrate 310 and the light transmitting substrate 314, during the attachment of the light transmitting substrate 314, the soft transparent adhesive layer 308 may be deformed and voids may possible be formed in the local bonding interface. Moreover, when the temporary substrate 310 and the soft transparent adhesive layer 308 are removed, the soft transparent adhesive layer 312 can be damaged as well. These together need some improvement. In addition, differences in lattice constants and CTEs (Coefficients of Thermal Expansion) between the growth substrate 300 (e.g., the GaAs substrate) and the materials of the N-type semiconductor region 302, the active region 304 and the P-type semiconductor region 306 that are grown on the growth substrate 300 create stress, causing severe wafer bowing. When the growth substrate 300 having such a great stress is to be attached to the temporary substrate 310 through the soft transparent adhesive layer 308, the weak bonding strength of the soft transparent adhesive layer 308 and voids present in the local bonding interface can often bring damages, in particular, breaking and microcracks to the substrate, during the process.

FIG. 12 shows an example of a semiconductor light emitting device described in U.S. Pat. No. 7,262,436. Here, the semiconductor light emitting device comprises a growth substrate 100, a first semiconductor region 300 (e.g., an N-type semiconductor region) grown on the growth substrate 100, an active region 400 grown on the first semiconductor region 300, a second semiconductor region 500 (e.g., a P-type semiconductor region) grown on the active region 400, electrodes 901, 902 and 903 formed on the second semiconductor region 500, the electrodes serving as a reflective film, and an electrode 800 formed on an etched-exposed portion of the first semiconductor region 300. The conductivity of the first semiconductor region 300 and the second semiconductor region 500 may be reversed. Preferably, a buffer region (not shown) is provided between the growth substrate 100 and the first semiconductor region 300. A chip having this configuration, i.e., where all of the electrodes 901, 902 and 903 and the electrode 800 are positioned on the opposite side of the growth substrate 100 and the electrodes 901, 902 and 903 may serve as a reflective film is called a flip chip. The electrodes 901, 902 and 903 are comprised of the electrode 901 having high reflectivity (e.g., Ag), the electrode 903 for bonding (e.g., Au) and the electrode 902 (e.g., Ni) for preventing diffusion between a material of the electrode 901 and a material of the electrode 903. This metal reflective film structure exhibits a high reflectance and is advantageous for current spreading. However, as the electrodes 901, 902 and 903 and the electrode 800, rather than the growth substrate 100, are to be bonded, a difference in heights between the electrodes 901, 902 and 903 and the electrodes 800 may cause structural tilting to the flip chip during the bonding process.

FIG. 13 shows an example of a semiconductor light emitting device described in U.S. Pat. No. 9,466,768. Here, the semiconductor light emitting device is provided with a growth substrate 100, a buffer region 200 grown on the growth substrate 100, a first semiconductor region 300 grown on the buffer region 200, an active region 400 grown on the first semiconductor region 300, the active region generating light by electron-hole recombination, and a second semiconductor region 500 grown on the active region 400. For the growth substrate 100, sapphire, Si or GaN is usually used. The growth substrate 100 can eventually be removed, and the buffer region 200 can be omitted. The position of the first semiconductor region 300 and the position of the second semiconductor region 50 can be swapped. In general, the first and second semiconductor regions may be made of GaN in the case of a Group 3 nitride semiconductor light emitting device. Each of the semiconductor regions 200, 300, 400 and 500 may be configured in multiple layers, and may have an additional layer. Unlike the example shown in FIG. 12, a non-conducting reflective film 910 is provided in place of the electrodes 901, 902 and 903 that serve as a reflective film. This non-conducting reflective film 910 may be made of a single-layered dielectric film (e.g., $SiO_x$, $TiO_x$, $Ta_2O_5$ or $MgF_2$), a multi-layered dielectric film, a DBR reflective film (e.g., $SiO_2/TiO_2$), or a combination thereof. The electrodes 920, 930, 800 and 810 are provided for the supply of current, and the electrode 920 and the electrode 930 are connected by an electrical connection 940 that passes through the non-conducting reflective film 910 for the connection. A branch electrode 810 and another branch electrode 930 may be provided for current spreading of the first semiconductor region 300 and the second semiconductor region 500. A light transmitting conductive film 600 (e.g., ITO or TCO) is also provided to facilitate current spreading of the second semiconductor region 500 even more. However, structural tiling (height difference) between the electrodes 920 and 800 still exist in this configuration. In the drawing, the reference numeral 950 denotes a CBL (Current Blocking Layer).

FIG. 14 shows an example of a semiconductor light emitting device described in Japanese Patent Application Publication No. 2006-120913. Here, the semiconductor light emitting device comprises a growth substrate 100, a buffer region 200 grown on the growth substrate 100, a first semiconductor region 300 grown on the buffer region 200, an active region 400 grown on the first semiconductor region 300, a second semiconductor region 500 grown on the active region 400, a light transmitting conductive film 600 (e.g., ITO or TCO) formed on the second semiconductor region 500 for current spreading, an electrode 700 formed on the light transmitting conductive film 600, and an electrode 800 formed on an etched-exposed portion of the first semiconductor region 300. Further, a DBR (Distributed Bragg Reflector) 900 and a metal reflective film 904 are provided on the light transmitting conductive film 600. With the electrode 800 being level with the electrode 700, it is possible to overcome structural tilting (height difference) of a flip chip during the bonding process. However, this has a disadvantage that the electrode 700 and the electrode 800 should be formed separately.

FIG. 15 shows an example of a semiconductor light emitting device described in US Patent No. U.S. Pat. No. 9,748,446. Here, the semiconductor light emitting device, similar to the one shown in FIG. 2, comprises a growth substrate 100, a buffer region 200, a first semiconductor region 300, an active region 400, a second semiconductor region 500, a light transmitting conductive film 600, a non-conducting reflective film 910, electrodes 920, 930 and 940, electrodes 800 and 810, and a current blocking layer 950. The electrode 800 is formed on the non-conducting reflective film 920 in order to reduce structural tilting (height difference) between the electrode 800 and the electrode 920, and an electrical connection 820 passing through the non-conducting reflective film 910 is used for electrical connection of the branch electrode 810 and the electrode 800.

Additionally, the semiconductor regions are etched to form a via hole, in which an N-side electrode is formed such that any height difference with the P-side electrode can be eliminated. Such examples can be found in Japanese Patent Laid-Open Publication No. S55-009442, for example.

FIG. 16 shows an example of a semiconductor light emitting device described in U.S. Pat. No. 9,236,524. Here, the semiconductor light emitting device has a configuration similar to the one shown in FIG. 15, except for the structure of the non-conducting reflective film 910. Besides dielectric films 910d and 910e forming a DBR, the non-conducting reflective film 910 also includes a thick dielectric film 910c in order to eliminate structural tilting (height difference) between the electrode 800 and the electrode 920. Particularly, in this technique, the dielectric films 910d and 910e forming a DBR are provided by PVD (Physical Vapor Deposition) while the thick dielectric film 910c is provided by CVD (Chemical Vapor Deposition) such that step coverage is improved and the non-conducting reflective film 910 thus formed is stable overall.

FIG. 29 shows an example of a semiconductor light emitting device or display described in US Patent Application Publication No. US 2017-0323873. Here, the semiconductor light emitting device 100f comprises a substrate 10f serving as an external power supply and an epitaxial structure 120e. The epitaxial structure 120e is transferred onto the substrate 10f by a carrier 110 provided with an adhesive 130. A TFT (Thin Film Transistor) structure 16f is formed on the substrate 10f. The TFT structure 16f is a driving mechanism for the epitaxial structure 120e. The epitaxial structure 120e is provided with electrodes 142e and 144e serving as bonding pads. These electrodes 142 and 144e are physically and electrically connected to a circuit electrode 12f provided in the TFT structure 16f.

FIG. 30 shows an example of a micro-LED display unit described in Korean Patent Application Publication No. 10-2019-0078945. Here, the micro-LED display unit comprises a substrate 110 and a micro-LED 140. TFTs 101, 103, 105 and 107 are formed on the substrate 110 (e.g., glass). The TFTs 101, 103, 105 and 107 are comprised of a gate electrode 101, a semiconductor layer 103, a source electrode 105 and a drain electrode 107. An insulation layer 112 is provided between the gate electrode 101 and the electrodes 105 and 107. The semiconductor layer 103 may be made of an amorphous semiconductor such as amorphous silicon, or polysilicon such as LTPS. Alternatively, the semiconductor layer 103 may be made of an oxide semiconductor such as IGZO (Indium Gallium Zinc Oxide), $TiO_2$, ZnO, $WO_3$ or $SnO_2$. The semiconductor layer 103 made of an oxide semiconductor can be advantageous for reducing the dimensions of a TFT, for lowering driving power and for improving electric mobility.

After the TFTs 101, 103, 105 and 107 are formed on the substrate 110, the insulation layer 114 is formed and the micro-LED 140 is transferred onto the insulation layer 114. Subsequently, another insulation layer 116 is formed, holes 114a, 114b, 116a and 116b are formed, the drain electrode 107 and the P-side electrode 141 are connected through a connection electrode 117a, and the N-type electrode 143 and the electrode 109 are connected through a connection electrode 117b. Lastly, an insulation layer 118 is formed. When the gate electrode 101 is turned on, the semiconductor layer 103 is activated, which in turn causes the source electrode 105 and the drain electrode 107 to conduct with each other, and the current to be supplied to the micro-LED 140 for light emission. In the drawing, the reference numeral 152 denotes an electrode. An operation signal is provided to the gate electrode 101 through this electrode 152, and the current that passed through the micro-LED 140 exits through the electrode 109.

As described above, a display that combines TFTs (in particular, TFTs made of oxide semiconductors) and mini- or micro-LEDs is already available, and techniques for improving electric mobility have been proposed. Nevertheless, as shown in FIGS. 29 and 30, with TFTs being provided to the substrate 10f, 110, there are still a number of problems with their applications to a display unit that uses extremely small pixels such as micro-LEDs.

SUMMARY

The present invention is specified in the below description.

This section provides a general summary of the disclosure and is not a comprehensive disclosure of its full scope or all of its features.

According to one aspect of the present disclosure, there is provided a method of manufacturing a flip chip semiconductor light emitting device, the method comprising: providing a growth substrate on which a first N-type semiconductor region, an active region for generating light by electron-hole recombination, and a second P-type semiconductor region are sequentially grown; bonding a first light transmitting substrate to the second semiconductor region; removing the growth substrate from the first semiconductor region; attaching a second light transmitting substrate through an adhesive layer to the first semiconductor region from which the growth substrate is removed; laser ablating the first light transmitting substrate from the second semiconductor region; partially removing the second semiconductor region and the active region to expose part of the first semiconductor region; and forming a first flip chip electrode and a second flip chip electrode on the exposed first semiconductor region and the exposed second semiconductor region, respectively.

According to another aspect of the present disclosure, there is provided a semiconductor light emitting device comprising: a first semiconductor region having a first conductivity; a second semiconductor region having a second conductivity different from the first conductivity; an active region being interposed between the first semiconductor region and generating light by electron-hole recombination; a first electrode being positioned in an exposed portion of the first semiconductor region, being in electrical communication with the first semiconductor region and serving as a flip chip bonding pad, with the exposed portion being obtained by removing part of the first semiconductor region, the active region and the second semiconductor region; and a second electrode being positioned in another exposed portion of the first semiconductor region, being insulated from the first semiconductor region through an insulation layer interposed therein, being in electrical communication with the second semiconductor region and serving as a flip chip bonding pad, with the another exposed portion being obtained by removing part of the first semiconductor region, the active region and the second semiconductor region.

According to another aspect of the present disclosure, there is provided a semiconductor light emitting device comprising: a first semiconductor region having a first conductivity; a second semiconductor region having a second conductivity different from the first conductivity; an active region being interposed between the first semiconductor region and generating light by electron-hole recombination; a first electrode being positioned in an exposed portion of the first semiconductor region, being in electrical communication with the first semiconductor region and serving as a flip chip bonding pad, with the exposed portion being obtained by removing part of the first semiconductor region, the active region and the second semiconductor region; and a second electrode being in electrical communication with the second semiconductor region and serving as a flip chip bonding pad, wherein the first electrode is extended over the second semiconductor region which is a non-emission region.

According to another aspect of the present disclosure, there is provided a semiconductor light emitting device comprising: a first semiconductor region having a first conductivity; a second semiconductor region having a second conductivity different from the first conductivity; an active region being interposed between the first semiconductor region and generating light by electron-hole recombination; a first electrode being in electrical communication with an exposed portion of the first semiconductor region and serving as a flip chip bonding pad, with the exposed portion being obtained by removing part of the first semiconductor region, the active region and the second semiconductor region; a second electrode being in electrical communication with the second semiconductor region and serving as a flip chip bonding pad; and an insulation layer being positioned under the first and second electrodes and filling in the exposed portion of the first semiconductor region obtained by removing part of the first semiconductor region, the active region and the second semiconductor region.

According to another aspect of the present disclosure, there is provided a semiconductor light emitting device comprising: a light transmitting substrate; a first semiconductor light emitting device chip provided with a first semiconductor region having a first conductivity, an active region for generating light by electron-hole recombination and a second semiconductor region having a second conductivity different from the first conductivity, which are sequentially grown, the first semiconductor light emitting device chip including a first electrode electrically connected to the first semiconductor region and a second electrode electrically connected to the second semiconductor region; an adhesive layer for bonding the light transmitting substrate with the first semiconductor region of the first semiconductor light emitting device chip; and a passivation layer for covering at least the first semiconductor light emitting device chip and the adhesive layer.

According to another aspect of the present disclosure, there is provided a semiconductor light emitting device chip comprising: a light transmitting substrate; a first semiconductor light emitting device chip provided with a first semiconductor region having a first conductivity, an active region for generating light by electron-hole recombination and a second semiconductor region having a second conductivity different from the first conductivity, which are sequentially grown, the first semiconductor light emitting device chip including a first electrode electrically connected to the first semiconductor region and a second electrode electrically connected to the second semiconductor region, wherein the light transmitting substrate serves as a window through which the light is emitted; and a first thin film transistor for controlling light emission of the first semiconductor light emitting device chip, the first thin film transistor being deposited on the light transmitting substrate.

According to another aspect of the present disclosure, there is provided a semiconductor light emitting device comprising: a light transmitting substrate having a first surface and a second surface opposite to the first surface; a semiconductor light emitting device chip provided with a first semiconductor region having a first conductivity, an active region for generating light by electron-hole recombination and a second semiconductor region having a second conductivity different from the first conductivity, which are sequentially grown, the semiconductor light emitting device chip including a first electrode electrically connected to the first semiconductor region and a second electrode electrically connected to the second semiconductor region, wherein a first surface of the light transmitting substrate is where the semiconductor light emitting device chip is formed and a second surface of the light transmitting substrate serves as a window through which the light is emitted; and a black matrix material provided at least the first or the second surface of the light transmitting substrate.

According to another aspect of the present disclosure, there is provided a method of manufacturing a semiconductor light emitting device, the method comprising: preparing three semiconductor light emitting device chips, each chip being provided with an N-type semiconductor region, a P-type semiconductor region and an active region being interposed between the N-type semiconductor region and the P-type semiconductor region and generating light by electron-hole recombination; and bonding the three semiconductor light emitting device chips to a light transmitting substrate provided with an adhesive layer, with the N-type semiconductor region of each of the three semiconductor light emitting device chips being positioned on the adhesive layer side.

According to another aspect of the present disclosure, there is provided a method of manufacturing a semiconductor light emitting device, the method comprising: preparing a plurality of semiconductor light emitting device chips, each of the chips being provided with an N-type semiconductor region, a P-type semiconductor region, an active region being interposed between the N-type semiconductor region and the P-type semiconductor region and generating light by electron-hole recombination and a light transmitting substrate on which the N-type semiconductor region, the active region and the P-type semiconductor region are disposed, wherein in a semiconductor light emitting device of at least one of the plurality of semiconductor light emitting device chips, the corresponding light transmitting substrate is bonded after the corresponding N-type semiconductor region, active region and P-type semiconductor region are grown; bonding the plurality of semiconductor light emitting device chips to a first substrate; and removing the light transmitting substrate from a corresponding side of each of the plurality of semiconductor light emitting device chips by laser ablation.

According to another aspect of the present disclosure, there is provided a method of manufacturing a micro-LED display having a plurality of pixels, the method comprising: preparing a plurality of semiconductor light emitting devices, each device including an N-type semiconductor region, a P-type semiconductor region, an active region being interposed between the N-type semiconductor region and the P-type semiconductor region and generating light by electron-hole recombination, a first and a second electrode serving as bonding electrodes and being electrically connected to the N-type semiconductor region and the P-type semiconductor region, respectively, and a substrate on which the N-type semiconductor region, the active region and the P-type semiconductor region are disposed; and placing the plurality of semiconductor light emitting device chips on one of the plurality of pixels.

According to another aspect of the present disclosure, there is provided a method for transferring a plurality of semiconductor light emitting device chips, in which a plurality of first semiconductor light emitting device chips that emits a first color and a plurality of second semiconductor light emitting device chips that emits a second color different from the first color are transferred and arranged on a transfer receiving substrate in an alternate manner, the method comprising: preparing a first carrier to which the plurality of first semiconductor light emitting device chips that emits the first color is attached using a laser reactive material as a medium; transferring, by laser irradiation, the plurality of first semiconductor light emitting chips from the first carrier to the transfer receiving substrate provided with a mask for securing the postures and positions of the plurality of first semiconductor light emitting device chips; preparing a second carrier to which the plurality of second semiconductor light emitting device chips that emits the second color different from the first color is attached using a laser reactive material as a medium; and transferring, by laser irradiation, the plurality of second semiconductor light emitting chips from the second carrier to the transfer receiving substrate provided with a mask for securing the postures and positions of the plurality of second semiconductor light emitting device chips.

According to another aspect of the present disclosure, there is provided a semiconductor light emitting device structure comprising: a transfer receiving substrate provided with an adhesive layer and a mask for securing the posture of a semiconductor light emitting device; and the semiconductor light emitting device attached to the adhesive layer, with the posture of the device being secured by the mask, wherein the transfer receiving substrate is a light transmitting substrate and the adhesive layer is made of a detachable material to enable the re-transfer of the semiconductor light emitting device.

According to another aspect of the present disclosure, there is provided a method of manufacturing a semiconductor light emitting device, the method comprising: sequentially growing an N-type semiconductor region, an active region and a P-type semiconductor region on a growth substrate, wherein the growth substrate has a convex up shape after the growing is over; bonding a first support substrate to the P-type semiconductor region using one of a metal bonding material or an organic adhesive; removing the growth substrate; performing direct wafer bonding of a second support substrate to the N-type semiconductor region where the growth substrate has been removed; and removing the first support substrate. Here, in general, the semiconductor light emitting device has a semiconductor wafer state and may be formed into a semiconductor light emitting device die, a semiconductor light emitting device chip or a semiconductor light emitting package.

According to another aspect of the present disclosure, there is provided a semiconductor light emitting device comprising: a light transmitting substrate; an inorganic light transmitting adhesive layer provided on the light transmitting substrate; an N-type semiconductor region provided on the light transmitting adhesive layer; an active region provided on the N-type semiconductor region; and a P-type semiconductor region provided on the active region.

According to another aspect of the present disclosure, there is provided a method of manufacturing a semiconductor light emitting device, the method comprising: preparing a plurality of semiconductor light emitting device dies, each die including a sequence of a substrate, a N-type semiconductor region, an active region and a P-type semiconductor region; bonding the plurality of semiconductor light emitting device dies to a temporary substrate provided with an adhesive layer, with the substrate of each of the plurality of semiconductor light emitting device dies facing up to be bonded; removing the substrate of each of the plurality of semiconductor light emitting device dies; performing direct wafer bonding of a light transmitting substrate to the N-type semiconductor region of each of the dies where the substrate has been removed; and removing the temporary substrate.

According to another aspect of the present disclosure, there is provided a semiconductor light emitting device comprising: a light transmitting substrate; an inorganic light transmitting adhesive layer provided on the light transmitting substrate; and a plurality of semiconductor light emitting device chips bonded onto the light transmitting adhesive layer, each chip including an N-type semiconductor region, an active region provided on the N-type semiconductor region and a P-type semiconductor region provided on the active region, wherein the N-type semiconductor region is positioned on the light transmitting adhesive layer side.

According to another aspect of the present disclosure, there is provided a method of manufacturing a semiconductor light emitting device, the method comprising: preparing a light emitting unit including a sequence of a substrate, an N-type semiconductor region, an active region and a P-type semiconductor region, the light emitting unit having a first area; bonding the light emitting unit to a temporary substrate provided with an adhesive layer, with the substrate of the light emitting unit facing up to be bonded; removing the substrate of the light emitting unit; bonding a light transmitting substrate to the N-type semiconductor region side where the substrate of the light emitting unit has been removed; removing the temporary substrate; and reducing the light emitting unit to a second area smaller than the first area through etching which is performed while the light emitting unit is being bonded to the light transmitting substrate.

According to another aspect of the present disclosure, there is provided a method of manufacturing a semiconductor light emitting device, the method comprising: preparing three semiconductor light emitting device dies emitting blue, green and red, respectively, each die including a substrate, an N-type semiconductor region, an active region, and a P-type semiconductor region; attaching the three semiconductor light emitting dies to a temporary substrate, with the substrate of each of the three semiconductor light emitting device dies facing up to be attached; removing the substrate of each of the three semiconductor light emitting device dies; attaching a light transmitting substrate to the side where the substrate of each of the three semiconductor light emitting device dies has been removed; and removing the temporary substrate, wherein the substrate is a growth substrate on which the N-type semiconductor region, the active region and the P-type semiconductor region are grown, removing the substrate of each die involves removing, in one process, surface oxides on the growth substrate of each of the three semiconductor light emitting device dies.

According to another aspect of the present disclosure, there is provided a semiconductor light emitting device comprising: at least one light emitting unit, each unit including a first semiconductor region having a first conductivity, a second semiconductor region having a second conductivity different from the first conductivity and an active region being interposed between the first semiconductor region and the second semiconductor region and generating light by electron-hole recombination; a light transmitting substrate for supporting the at least one light emitting unit; a first electrode formed on the light transmitting substrate and electrically connected to the first semiconductor region; an adhesive layer being formed on the first electrode and bonding the at least one light emitting unit and the light transmitting substrate; and a second electrode electrically connected to the second semiconductor region.

According to another aspect of the present disclosure, there is provided a semiconductor light emitting device constituting a pixel light source, the device comprising: at least one semiconductor light emitting unit, each unit including a first light transmitting substrate having a first thickness, a first semiconductor region being formed on the first light transmitting substrate and having a first conductivity, a second semiconductor region having a second conductivity different from the first conductivity, an active region being interposed between the first semiconductor region and the second semiconductor region and generating light, a first electrode part electrically connected to the first semiconductor region and a second electrode part electrically connected to the second semiconductor region; a second light transmitting substrate having a second thickness greater than the first thickness; and a lower adhesive layer for bonding the first light transmitting substrate of the at least one semiconductor light emitting unit and the second light transmitting substrate.

According to another aspect of the present disclosure, there is provided a semiconductor light emitting device constituting a pixel light source, the device comprising: at least two semiconductor light emitting units, each unit including a first light transmitting substrate, a first semiconductor region being formed on the first light transmitting substrate and having a first conductivity, a second semiconductor region having a second conductivity different from the first conductivity, an active region being interposed between the first semiconductor region and the second semiconductor region and generating light, a first electrode part electrically connected to the first semiconductor region and a second electrode part electrically connected to the second semiconductor region; and a lower adhesive layer on the opposite side of the first semiconductor region with respect to the first light transmitting substrate, the lower adhesive layer bonded to the first light transmitting substrate of each unit to secure the at least two semiconductor light emitting units and adapted to open a portion of the first light transmitting substrate of each unit to allow light generated by the active region of each unit to be emitted outside.

Various features and advantages of the invention will be described in further detail below.

DETAILED DESCRIPTION

Figure 1:
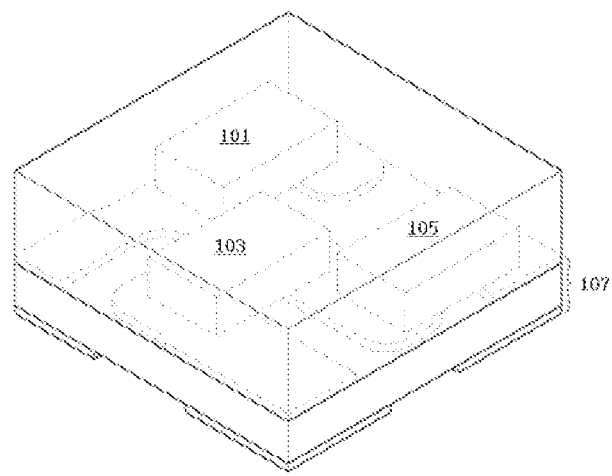
FIG. 1 shows an example of a semiconductor light emitting structure described in US Patent Application Publication No. US 2019/0067255.

The present disclosure will now be described in detail with reference the accompanying drawing(s).

FIGS. 8 to 11 illustrate a method of manufacturing a semiconductor light emitting device according to the present disclosure.

First, as shown in FIG. 8A, a first semiconductor region 30 (e.g., an N-type semiconductor region), an active layer 40 (e.g., MQWs) and a second semiconductor region 50 (e.g., a P-type semiconductor region) are sequentially grown on a growth substrate 10. Each of the first semiconductor region 30, the active region 40 and the second semiconductor region 50 may be formed of either a single layer or multiple layers. Additionally, other layers such as a buffer region 20 may be provided as needed. In general, a GaAs substrate and an AlGaInP(As)-based semiconductor are available for a semiconductor light emitting device that emits red light. A sapphire substrate and an AlGaInN-based semiconductor are available for semiconductor light emitting devices that emit green, blue or UV light. The buffer region 20 may typically have a thickness of around 4 µm, including a nucleation layer 22 and an undoped semiconductor region 23 for reducing the stress and improving the quality of a semiconductor thin film. Further, the first semiconductor region 30 may have a thickness of 2.5 µm, the active region 40 may have a thickness of several tens of nm, and the second semiconductor region 50 may have a thickness ranging from several tens of nm to several µm, making up a total thickness of about 6 µm to 10 µm. When laser ablation is employed, a sacrificial layer (not shown) may be provided between the nucleation layer 22 and the undoped semiconductor region 23. Alternatively, the nucleation layer 22 may serve as a sacrificial layer.

Next, as shown in FIG. 8B, a protective layer 60 is provided on the second semiconductor region 50. The protective layer 60 is preferably made of a dielectric material such as $SiO_2$ or $SiN_x$, in order to protect the semiconductor regions 30, 40 and 50 in subsequent steps including an etching process. The protective layer 60 may be designed as a single layer or multiple layers and may be made of a combination of dielectric/conductive materials ($SiO_2$/Ti) or dielectric/dielectric materials ($SiO_2$/$SiN_x$). Here, the conductive material is preferably a metal (e.g., Ti, Cr, Ni or the like) that is easy to remove later and has excellent adhesion to the dielectric material. Alternatively, a light transmitting conductive material (e.g., $In_2O_3$, $SnO_2$, ITO, ZnO or the like) may also be used as the conductive material.

Referring next to FIGS. 8C and 8D, a first light transmitting substrate 70 is prepared, and the semiconductor regions 30, 40 and 50 are then bonded to the first light transmitting substrate 70. For the bonding between the first light transmitting substrate 70 and the semiconductor regions 30, 40 and 50, rather than the conventional organic adhesives such as BCB or silicone in the art, a metal bonding (e.g., eutectic) process is used to provide high bonding strength, to prevent any change in the physical properties of the semiconductor regions in subsequent steps including dry & wet etching and to protect the semiconductor regions from mechanical damages (cracking, breaking) during the process. A metal bonding layer 71 may be provided either on the side of the first light transmitting substrate 70 or on the side of the semiconductor regions 30, 40 and 50, preferably on both. Further, the first light transmitting substrate 70 must have a sacrificial layer 72 as it is going to be subjected to layer ablation for removal. It is important that the semiconductor regions 30, 40 and 50 are not cracked or broken during the bonding process. Hence, the first light transmitting substrate 70 is preferably a sapphire substrate which is light transmitting and has a coefficient of thermal expansion substantially similar to that of the growth substrate 10. In general, eutectic materials for metal bonding have different applications based on temperature. For example, any eutectic material for use in the present disclosure should have a process temperature between 250° C. and 350° C., such as AuSn (300° C.), AuIn (275° C.), NiSn (300° C.), or CuSn (270° C.). However, the BCB organic adhesive is preferably bonded at 250° C. or lower. It should be noted that besides the BCB organic adhesives, other types of organic adhesives can also be applied for wafer bonding, which may include polyimide (160° C.), SU-8 (90° C.), parylene (230° C.), and epoxy (150° C.), for example. The sacrificial layer 72 may be made of epitaxial or polycrystalline compounds, in particular, oxide- and nitride-semiconductors, which has an energy bandgap of 6.2 eV or less and can absorb laser photons entering through the rear side of the first light transmitting substrate 70, easily causing an instantaneous photo-thermochemical decomposition interaction. Examples of the oxide semiconductor include $In_2O_3$, $SnO_2$, ITO, ZnO, CdO, PbO, PZT, and alloys thereof. Examples of the nitride semiconductor include InN, GaN, AlN, and alloys thereof As for the first light transmitting substrate 70, any optically transparent material that has a coefficient of thermal expansion differing from that of the growth substrate (GaAs or Sapphire) by 2 ppm or less may be used. For example, a suitable material for a GaAs growth substrate (of which a coefficient of thermal expansion is 5.7 ppm) used in a semiconductor light emitting device that emits red light will be an optically transparent material having a coefficient of thermal expansion between 3.7 and 7.7 ppm. Likewise, a suitable material for a sapphire substrate (monocrystalline $Al_2O_3$) (of which a coefficient of thermal expansion is 6.5 ppm) used in a semiconductor light emitting device that emits blue, green or UV light will be an optically transparent material having a coefficient of thermal expansion between 4.5 and 8.5 ppm. Some of the best candidates that satisfy both requirements include, other than monocrystalline $Al_2O_3$ as used for the growth substrate, E glass (5.5 ppm), AlN (4.5 ppm), SiC (4.8 ppm), Borosilicate glass (4.6 ppm) or the like.

Continuing to FIG. 8E, the growth substrate 10 is removed. If the growth substrate 10 is a GaAs substrate, it can be removed by wet etching. If the growth substrate 10 is a sapphire substrate, it can be removed by laser ablation. The present of the metal bonding between the first light transmitting substrate 70 and the semiconductor regions 30, 40 and 50 and of the protective layer 60 provided on the semiconductor regions 30, 40 and 50 allow the metal bonding layer 71 as well as the semiconductor regions 30, 40 and 50 to withstand better during the dry & wet etching or laser ablation process. Preferably, a portion or all of the undoped semiconductor region 23 may be removed (e.g., by etching) before a second light transmitting substrate 80 (see FIG. 9) and the semiconductor regions 30, 40 and 50 are attached, such that the light emitting device may have reduced stress, improved performances (e.g., in terms of an optical output, an operating voltage, etc.), and facilitated subsequent steps including the formation of a passivation layer.

As shown in FIG. 9A, a second light transmitting substrate 80 is prepared. An adhesive layer 81 is provided either on the side of the second light transmitting substrate 80 or on the side of the semiconductor regions 30, 40 and 50, preferably on both. The adhesive layer 81 may be made of light transmitting materials such as BCB resins in the art. Among other well-known organic adhesives for wafer bonding, there are polyimide (160° C.), SU-8 (90° C.), parylene (230° C.), epoxy (150° C.), silicone (100-300° C.), OCA (Optical Clear Adhesive), OCR (Optical Clear Resin) and the like. Moreover, before boding with an organic adhesive, if needed, a reflector (that is, a reflective material or a reflector structure) (e.g., Ag, Al, Au, Cu, Pt, Cr, Ti, TiW, DBR or ODR) or an uneven structure may be provided, such that optical extraction may be facilitated or the surface area may be increased, providing better adhesion. In addition, as for the adhesive layer 81 for wafer bonding, a light transmitting inorganic material such as $SiO_2$, SOC (Spin On Glass) may be favored over the organic adhesive materials for wafer bonding described above, on account of its stronger bonding and better thermal durability when processed at a temperature of at least 300° C., thereby contributing to an increased mass production yield and higher reliability of the light emitting device. When such a light transmitting inorganic material is used as the adhesive layer 81 for wafer bonding, a key process factor is to maintain the flatness of two wafer substrate structures prepared 70/72/71/60/50/40/30/81 and 80/81. With the two wafer substrate structures prepared and implemented according to the present disclosure, however, it is possible to reduce stress caused in the process of growing semiconductor regions and to form a broader, tighter and more uniform contact across with the light transmitting inorganic adhesive layer(s) 81 for wafer bonding, which leads to very successful bonding overall.

Next, as shown in FIG. 9B, the second light transmitting substrate 80 and the semiconductor regions 30, 40 and 50 are attached. Although heat (corresponding to the process temperature of the organic adhesive material used) may be generated during adhesion, the first light transmitting substrate 70 and the semiconductor regions 30, 40 and 50 having high mutual bonding strength through the metal bonding stay bonded together without any problem. Additionally or alternatively, the first and second light transmitting substrates 70 and 80 may be made of the same material, hence having the same coefficient of thermal expansion (e.g., sapphire) and compressed firmly against the adhesive layer 81, such that the second light transmitting substrate 80 and the semiconductor regions 30, 40 and 50 can be adhered together without cracking or getting damaged.

Now, referring to FIG. 9C, the first light transmitting substrate 70 is removed from the semiconductor regions 30, 40 and 50 by laser ablation. Laser ablation allows to prevent any damage on the adhesive layer 81 during the removal of the first light transmitting substrate 70.

Continuing to FIGS. 10A and 10B, the metal bonding layer 71 and the protective layer 60 are removed one after another to prepare a P-side up flip chip. It should be noted that up to this point, every process has been carried out at the wafer level from the beginning, without causing damage on the adhesive layer 81, without using the photolithography process, and without etching the semiconductor regions 30, 40 and 50 which are the core of the formation of electrodes or light emitting devices. This fact explains how the semiconductor regions 30, 40 and 50 can be prevented from cracking or breaking as much as possible despite that the wafer bonding process has been performed twice. Further, following the removal of the growth substrate 10, a portion or all of the undoped semiconductor region 23 is etched such that the light emitting device as an end product may have even higher performances and qualities. To get this result, several key factors play together, i.e. the protective layer 60 is provided, the metal bonding layer 71 is used, the first light transmitting substrate 70 is removed by laser ablation, and the first and second light transmitting substrates 70 and 80 have coefficients of thermal expansion with a minimal difference (in case of wafer bonding between heterogeneous materials, the greatest possible difference of coefficients of thermal expansion for preventing cracks is 2 ppm or less).

Referring next to FIGS. 11A and 11B, the second semiconductor region 50 and the active region 40 are partially removed to expose the first semiconductor region 30.

Figure 7:
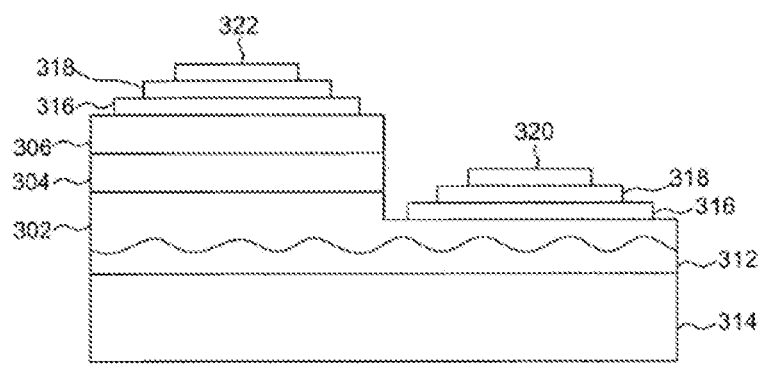

Then, as shown in FIG. 11C, a light transmitting electrode 91, a first electrode 92 and a second electrode 93 are formed. The light transmitting electrode 91 serves to facilitate current spreading across the second semiconductor region 50 where current was poorly spread and it is mainly comprised of a light transmitting conducting oxide (TCO) (e.g., ITO). The first electrode 92 and the second electrode 93 are electrically connected to the first semiconductor region 30 and the second semiconductor region 50, respectively, and have the same configuration as the electrodes 316, 318, 320 and 322 shown in FIG. 7, possibly serving as reflectors.

Continuing to FIG. 11D, the semiconductor light emitting device in the form of a wafer is then isolated into individual chips. At this time, the adhesive layer 81 is also removed to expose the second light transmitting substrate 80. Accordingly, this makes it easier for the subsequent scribing & breaking process of the second light transmitting substrate 80.

Lastly, referring to FIG. 11E, a passivation layer 94 (e.g., $SiO_2$, $Al_2O_3$, $SiN_x$) is formed to protect the device. With a smaller electrode 93, a dielectric reflector (a DBR) can be provided into the passivation layer 94 and serve as a reflector in place of the electrode 93. One example of such a dielectric reflector is illustrated in U.S. Pat. No. 9,236,524. Alternatively, the passivation layer 94 may have a multilayered structure, which is basically obtained by covering the top and lateral surfaces of the semiconductor regions 30, 40 and 50 with a dielectric material (e.g., $SiO_2$, $Al_2O_3$, $SiN_x$), followed by consecutively depositing metals having high reflectivity (e.g., Ag, Al, Au, Cu, Pt, Cr, Ti, TiW).

It would be apparent to a person skilled in the art that the sequence of steps illustrated in FIGS. 11B to 11E may be changed. However, compared with conventional chips (typically their side lengths are at least 300 μm), a mini- or micro-LED chip has sidewalls of the isolation and mesa processes that are larger than the light emitting area. Hence, it is crucial to prevent electrical flow through the isolated mesa sidewalls (passivation) in order to ensure required light brightness and reliability. Therefore, it is desirable that the passivation process should be performed immediately after the isolation and mesa processes to avoid exposure to the atmosphere for an extended period of time until the next step.

Figure 17:
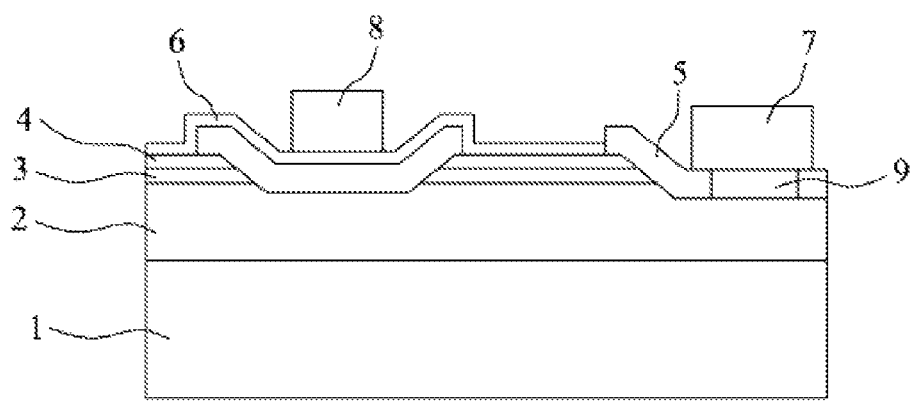
FIG. 17 shows an example of a semiconductor light emitting device according to the present disclosure.

FIG. 17 shows an example of a semiconductor light emitting device according to the present disclosure. The semiconductor light emitting device includes a light transmitting substrate 1, a first semiconductor region 2, an active region 3, a second semiconductor region 4, an insulation layer 5, a current spreading electrode 6, a first electrode 7 and a second electrode 8.

Figure 11:
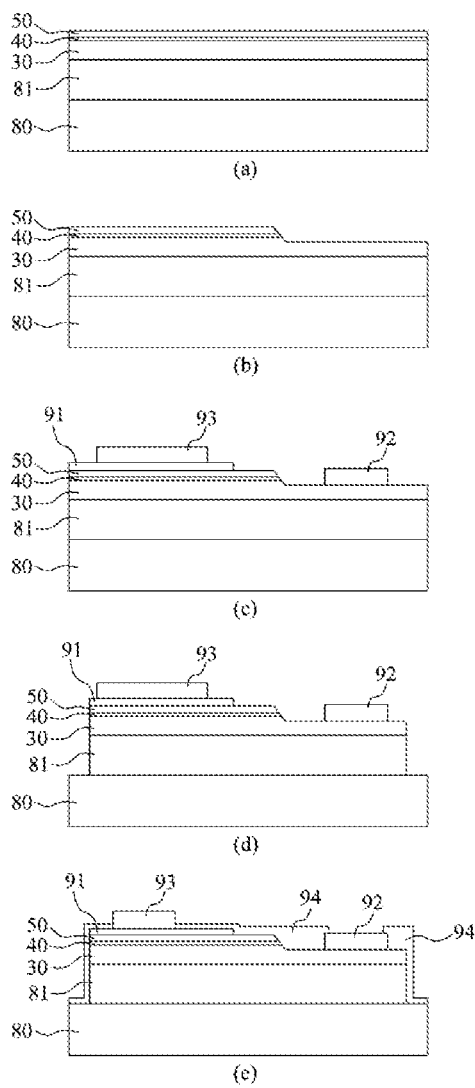
Figure 12:
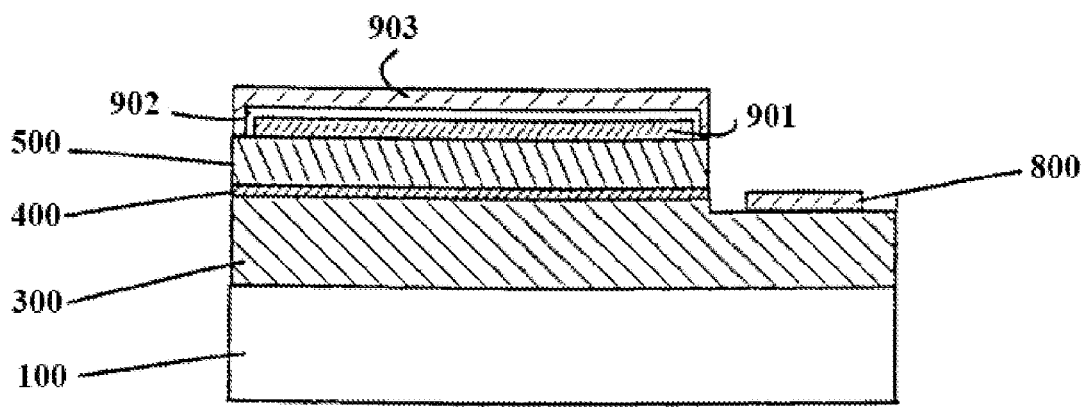
FIG. 12 shows an example of a semiconductor light emitting device described in U.S. Pat. No. 7,262,436.
Figure 13:
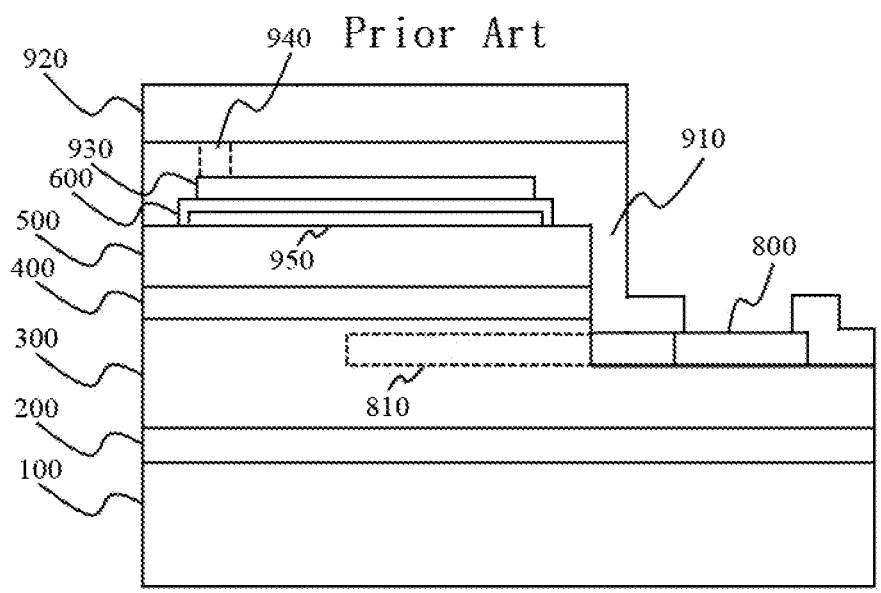
FIG. 13 shows an example of a semiconductor light emitting device described in U.S. Pat. No. 9,466,768.
Figure 14:
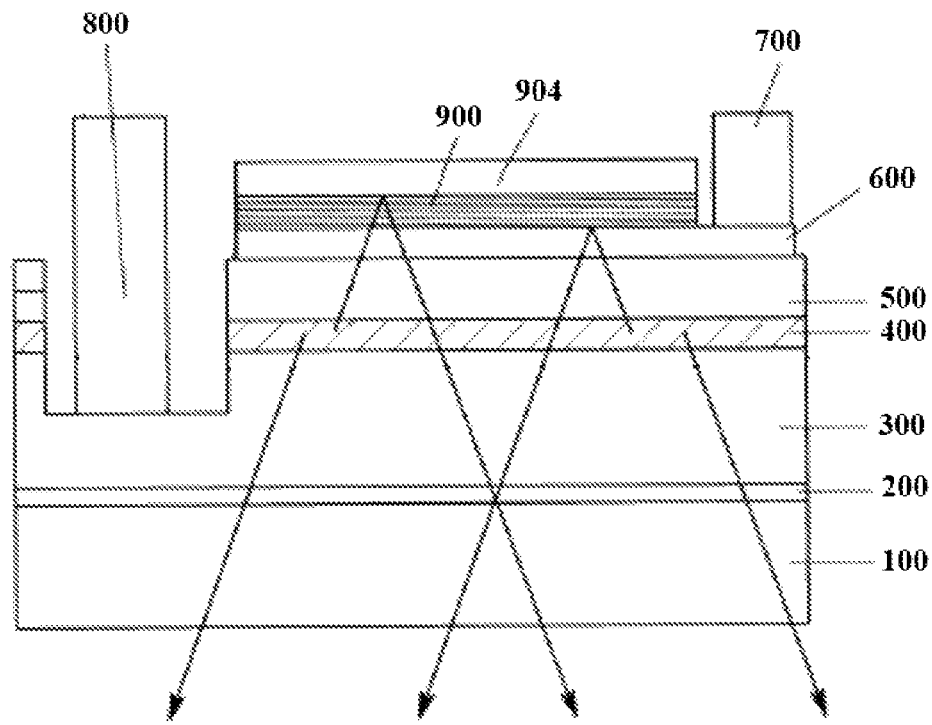
FIG. 14 shows an example of a semiconductor light emitting device described in Japanese Patent Application Publication No. 2006-120913.
Figure 15:
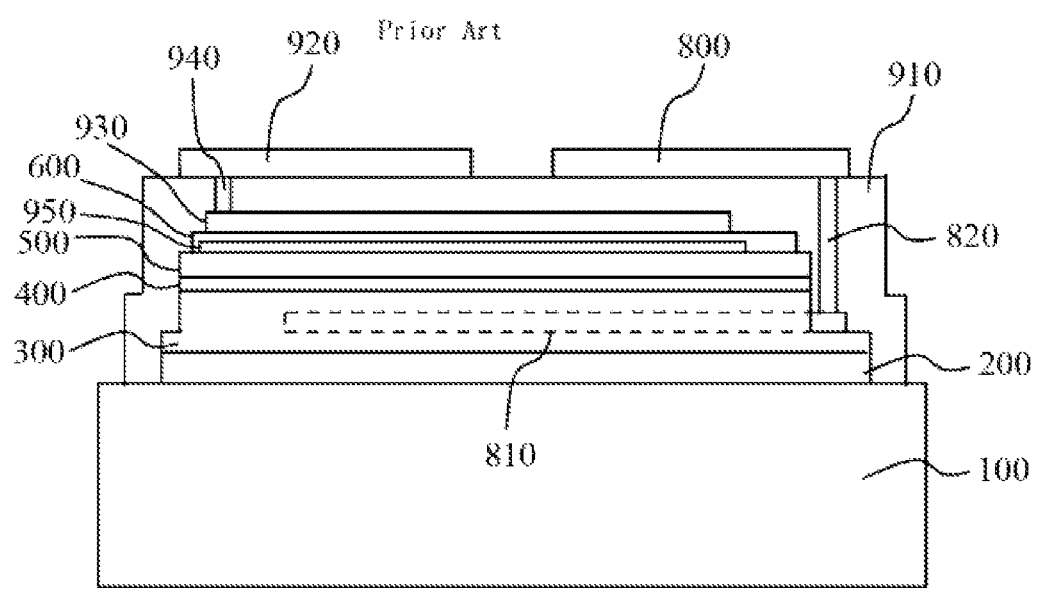
FIG. 15 shows an example of a semiconductor light emitting device described in U.S. Pat. No. 9,748,446.
Figure 16:
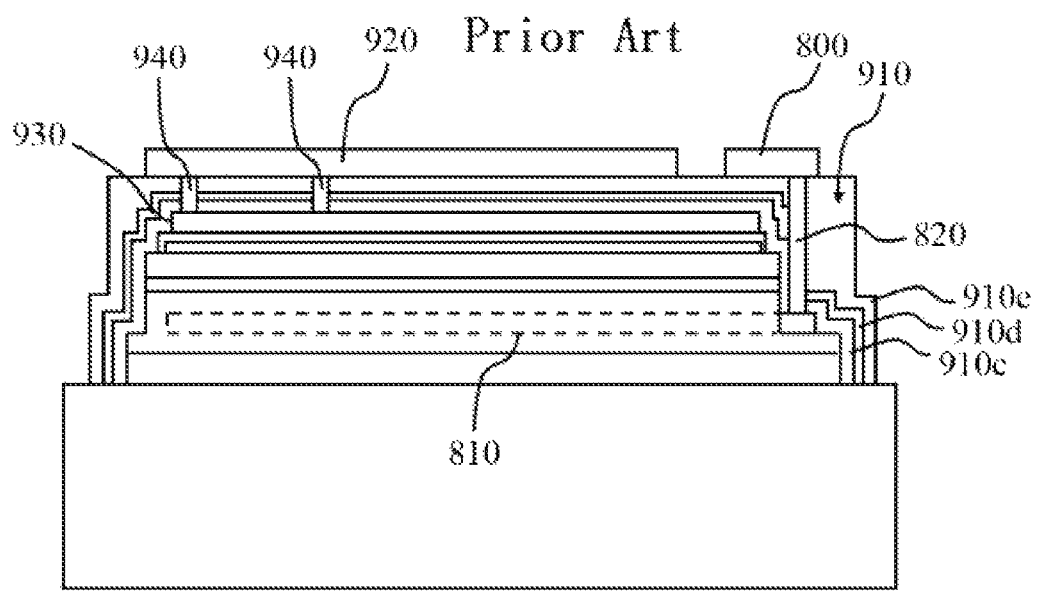
FIG. 16 shows an example of a semiconductor light emitting device described in U.S. Pat. No. 9,236,524.

The light transmitting substrate 1 may be a growth substrate (e.g., sapphire, or SiC) or a light transmitting substrate that is attached to the semiconductor regions 2, 3 and 4 after the growth substrate is removed. This light transmitting substrate can also be made of sapphire or SiC. Such substrates are illustrated in FIGS. 4 to 11. The light transmitting substrate 1 can be a growth substrate or may be made of the second light transmitting substrate 80 as shown in FIG. 11.

The first semiconductor region 2, the active region 3 and the second semiconductor region 4 may be made of N-type GaN, InGaN/(In)GaN MQWs, and P-type GaN. Additionally or alternatively, they can be made of AlGaInN-based semiconductors for emitting UV, blue or green light, or AlGaInP(As)-based semiconductors for emitting red light. Each of the regions may be a single layer or multiple layers and their conductivity can be interchanged. If the light transmitting substrate 1 is a growth substrate, a buffer region 20 (see FIG. 8) is preferably provided between the first semiconductor region 2 and the light transmitting substrate 1. Further, as the semiconductor light emitting device may be transferred onto a panel (a glass substrate with an array of TFTs, or a PCB) that controls the brightness of light through electric injection for use in a micro-LED display by direct light emission, it may be configured with the first semiconductor region 2, the active region 3, the second semiconductor region 4, the insulation layer 5, the current spreading electrode 6, the first electrode 7 and the second electrode 8, without the light transmitting substrate 1 being removed.

The insulation layer 5 provides passivation. As the insulation layer 5 is made of a dielectric material (e.g., $SiO_2$, $Al_2O_3$ or $SiN_x$), it also blocks electric flow and minimizes light absorption.

Figure 2:
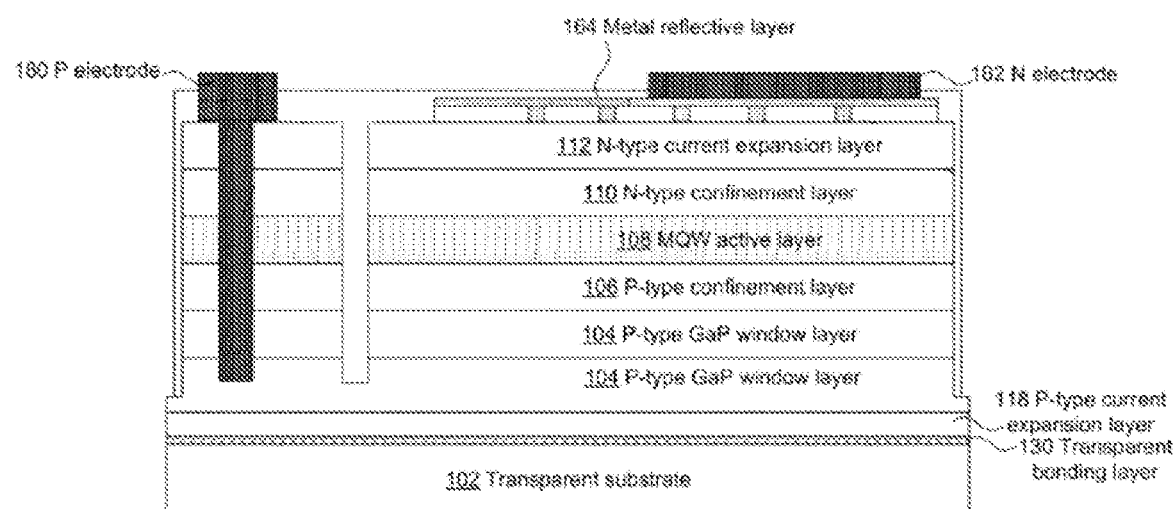
FIG. 2 shows an example of a semiconductor light emitting device described in US Patent Application Publication No. US 2019/0067525.
Figure 3:
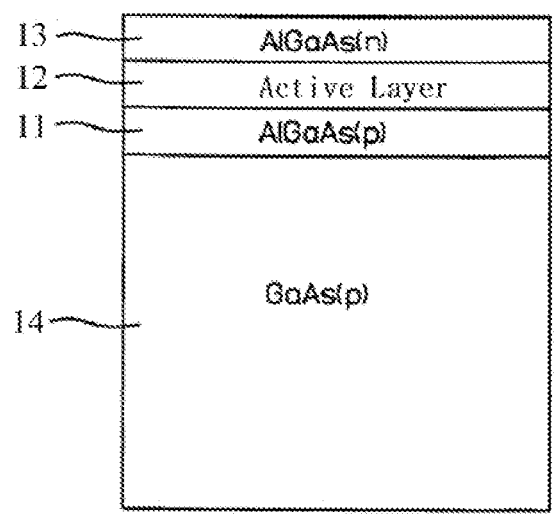
FIG. 3 shows an example of a semiconductor light emitting device described in U.S. Pat. No. 5,376,580.
Figure 4:
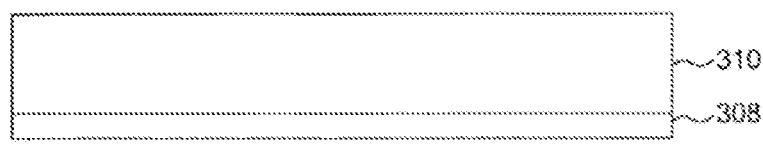
FIGS. 4, 5, 6 and 7 illustrate methods of manufacturing a semiconductor light emitting device described in U.S. Pat. No. 7,067,340.
Figure 4:
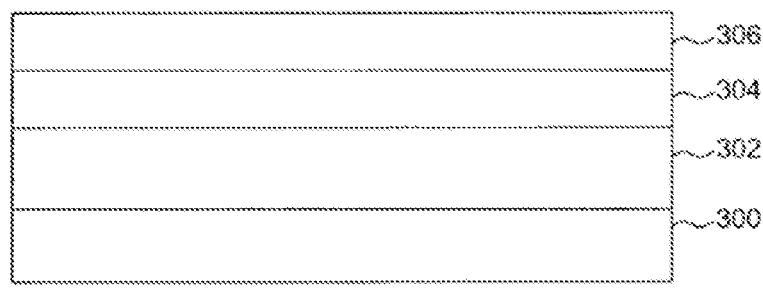
Figure 5:
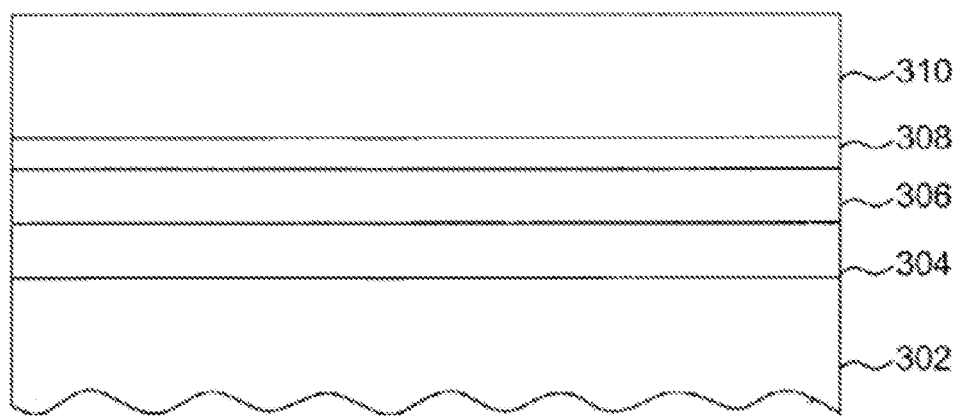
Figure 6:
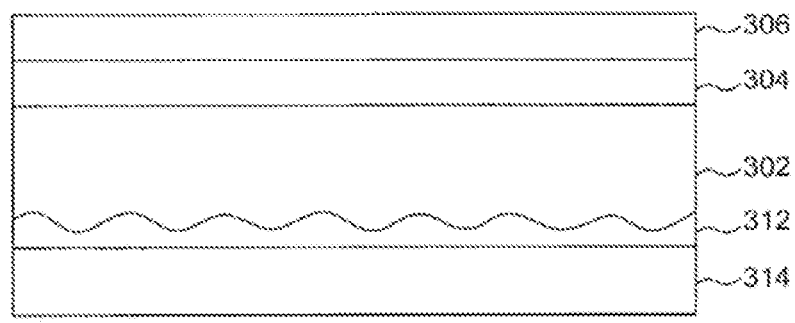

The current spreading electrode 6 supplies a current from the second electrode 8 to the second semiconductor region 5 and provides an ohmic contact. It may be formed of a light transmitting conductive film (e.g., ITO), a metal having excellent reflectivity (e.g., Ag, Au, Al or Ag/Ni/Au), a non-conducting reflective film (e.g., DBR), or any combination thereof (e.g., ITO, ITO/Ag or ITO/DBR). When the current spreading electrode 6 comprises a non-conducting reflective film, an electrical connection 94 is provided for electrical communication between the current spreading electrode 6 and the second electrode 8, as shown in FIG. 2. Additionally or alternatively, the non-conducting reflective film may also be provided on the insulation layer 5 on the etched and exposed first semiconductor region 2.

The first electrode 7 and the second electrode 8 can be formed in the same process. They serve as a bonding pad and may be made of Ti/Ni/Au, for example.

Preferably, an ohmic contact electrode 9 (e.g., Cr/Al/Ni/Au or Ti/Al/Ni/Au) is provided under the first electrode 7, such that it may lower the driving voltage and reduce structural tilting (height difference) between the first electrode 7 and the second electrode 8.

As shown, the second semiconductor region 4, the active region 3 and the first semiconductor region 2 are partially removed to allow the first electrode 7 as well as the second electrode 8 to be formed in their places. With an ohmic contact electrode, the height difference between the first electrode 7 and the second electrode 8 can be reduced, and therefore any issue caused by tilting of the semiconductor light emitting device during bonding can be resolved. In the case of mini-LEDs or micro-LEDs which have very small dimensions, the same amount of a bonding material is usually used during flip chip bonding and thus, some quality risks including an electrical short are likely to occur. In particular, as for a flip chip without the light transmitting substrate 1 (once the light transmitting substrate 1 is removed, the semiconductor light emitting device becomes very thin, that is, its total thickness changes from 150-200 μm to 10 μm or less), it is more likely to be susceptible of having cracks, in addition to the issues mentioned previously. Among others, when such a flip chip is used as a display light source, distorted emission patterns may lead to color deviation and color mixing, and structural unbalance may lead to misalignment of the flip chip during the flip bonding and transfer processes, thereby causing deterioration of the electrical and optical qualities.

Figure 18:
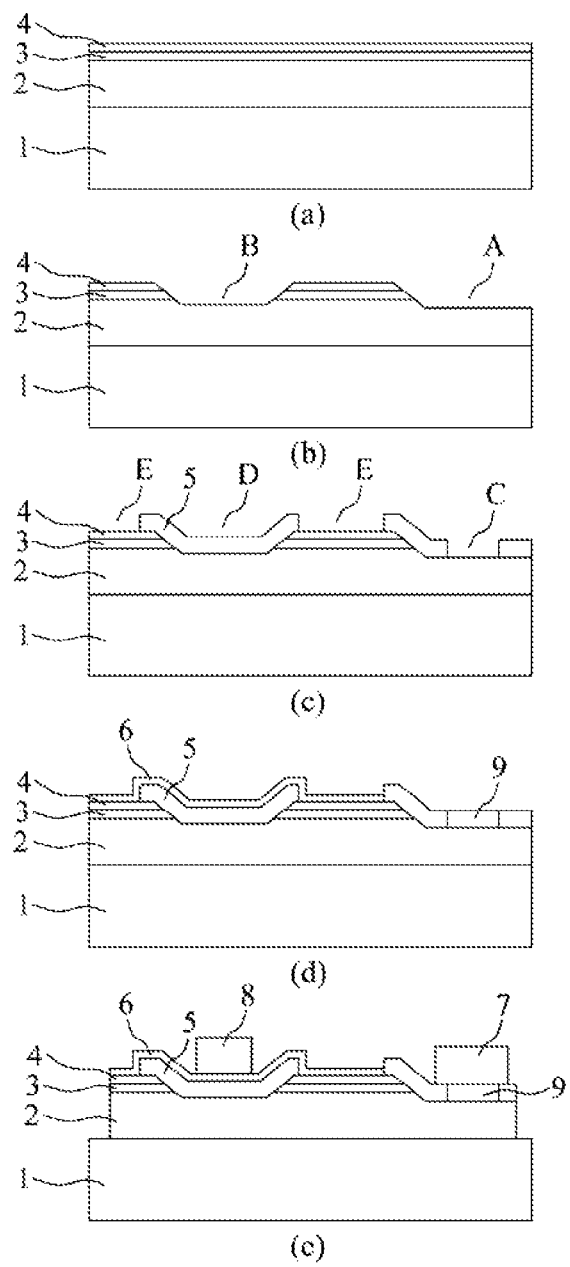
FIG. 18 illustrates a method of manufacturing the semiconductor light emitting device of FIG. 17.

FIG. 18 illustrates an example of a method of manufacturing the semiconductor light emitting device of FIG. 17. First, as shown in FIG. 18A, a sequence of the first semiconductor region 2, the active region 3 and the second semiconductor region 4 can be provided on the light transmitting substrate 1. Next, as shown in FIG. 18B, the second semiconductor region 4, the active region 3 and the first semiconductor region 2 are partially removed by etching (e.g., ICP) in positions A and B where the first electrode 7 and the second electrode 8 are to be formed. Continuing to FIG. 8C, the insulation layer 5 is formed and then part of the insulation layer 5 is removed by the photolithography process. In particular, a portion of the insulation layer 5 in position C where the first electrode 7 is to be placed is open, a portion of the insulation layer 5 in position D where the second electrode 2 is to be placed is left as it is, and a portion of the insulation layer 5 is removed to ensure an area E in which the current spreading electrode 6 and the second semiconductor region 4 are able to electrically communicate with each other, thereby leaving a portion of the second semiconductor region 4 exposed. Referring next to FIG. 18D, the current spreading electrode 6 and the ohmic contact electrode 9 are formed. Then as shown in FIG. 18E, the first electrode 7 and the second electrode 8 are formed. Preferably, the passivation layer 94 may also be provided, as shown in FIG. 11E.

Figure 19:
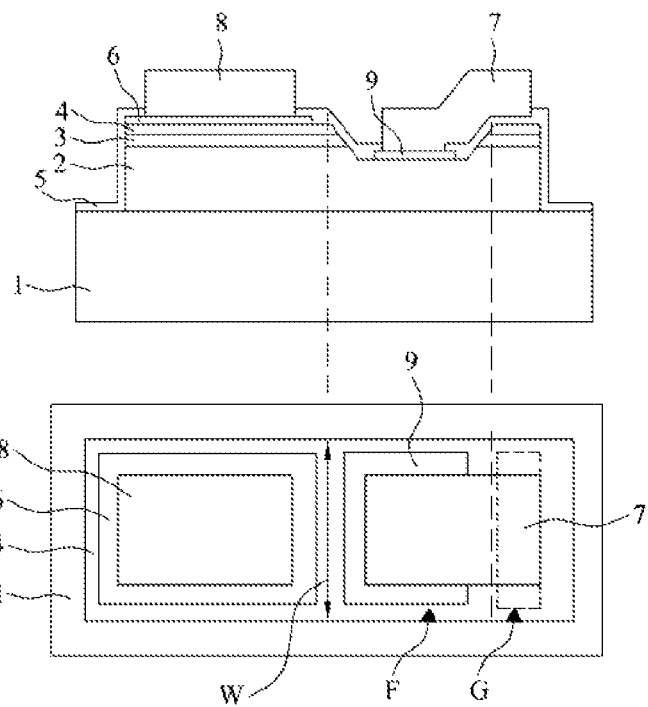
FIG. 19 shows another example of a semiconductor light emitting device according to the present disclosure.

FIG. 19 shows another example of a semiconductor light emitting device according to the present disclosure. This semiconductor light emitting device differs from the semiconductor light emitting device shown in FIG. 17 in that (i) the second electrode 8 is formed on the second semiconductor region 4 without etching the semiconductor regions 2, 3 and 4, (ii) the first electrode 1 is extended from the etched and hence exposed first semiconductor region defined by 2 and F to the second semiconductor region defined by 4 and G, and (iii) the insulation layer 5 and the current spreading electrode 6 are formed in reverse order. With this configuration, the first and second electrodes 7 and 8 have no height difference. As the first electrode 7 and the ohmic contact electrode 9 are wide enough to cover all or nearly all the width W of the semiconductor light emitting device, the supply of a current from the second electrode 8 to the region G is blocked and hence, the region G becomes a non-emission region although it has an active region 4 therein. That is, in the semiconductor light emitting device shown in FIG. 19, the first electrode 1 is extended from the etched and exposed first semiconductor region 2; F towards the non-emission region G (the first electrode 7 and the ohmic contact electrode 9 are elongated along the width W of the semiconductor light emitting device by at least 50%, effectively blocking the supply of a current from the second electrode 8, and in the area G, the insulation layer 5 positioned under the first electrode 7 also cuts off the supply of a current) over the second semiconductor region 4 such that there is no height difference between the first electrode 7 and the second electrode 8. The insulation layer 5 is not indicated in the top view of FIG. 19.

Figure 20:
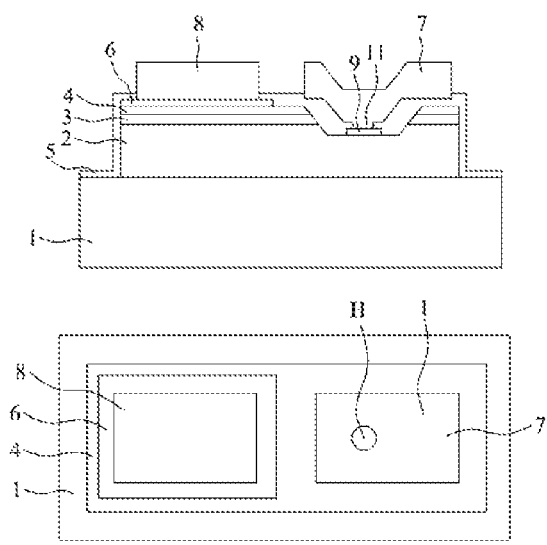
FIG. 20 shows another example of a semiconductor light emitting device according to the present disclosure.

FIG. 20 shows another example of a semiconductor light emitting device according to the present disclosure. This semiconductor light emitting device differs from the semiconductor light emitting device shown in FIG. 19 in that (i) the entire first electrode 7 is formed on the second semiconductor region 4, and (ii) the electrical connection 11 is formed through a via hole H in the insulation layer 5 for electrical communication between the first electrode 7 and the ohmic contact electrode 9. Again in this case, a region opposite to the second electrode 8 with respect to the via hole H is a non-emission region. Thus, the first electrode 7 is formed in the non-emission region G to reduce the height difference between the first electrode 7 and the second electrode 8. The insulation layer 5 is not indicated in the top view of FIG. 20.

Figure 21:
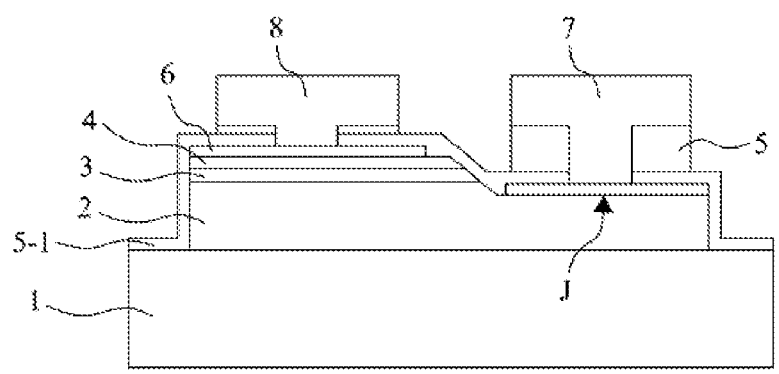
FIG. 21 shows another example of a semiconductor light emitting device according to the present disclosure.

FIG. 21 shows another example of a semiconductor light emitting device according to the present disclosure. Here, rather than following the contour of the semiconductor regions 2, 3 and 4, the insulation layer 5 is formed generally flat, covering the semiconductor regions 2, 3 and 4, the current spreading electrode 6 and the ohmic contact electrode 9. With this configuration, the height of the first electrode 7 can be matched with the height of the second electrode 8, independent of the shape of a mesa etched region J on the side of the first electrode 7. This configuration is made possible by applying a liquid insulation layer 5 (e.g., a thermosetting plastic including BCB, SU-8, acrylate, or SOG). Alternatively, the insulation layer 5 can be applied by a different approach (e.g., spin coating) from the conventional deposition process (e.g., CVD or PVD). Moreover, the insulation layer 5 can be provided under the second electrode 8 as well (e.g., planarization under the electrodes 7 and 8). Preferably, the insulation layer 5 is formed by a liquid phase process and planarized using various techniques such as spin and spray coating.

Figure 22:
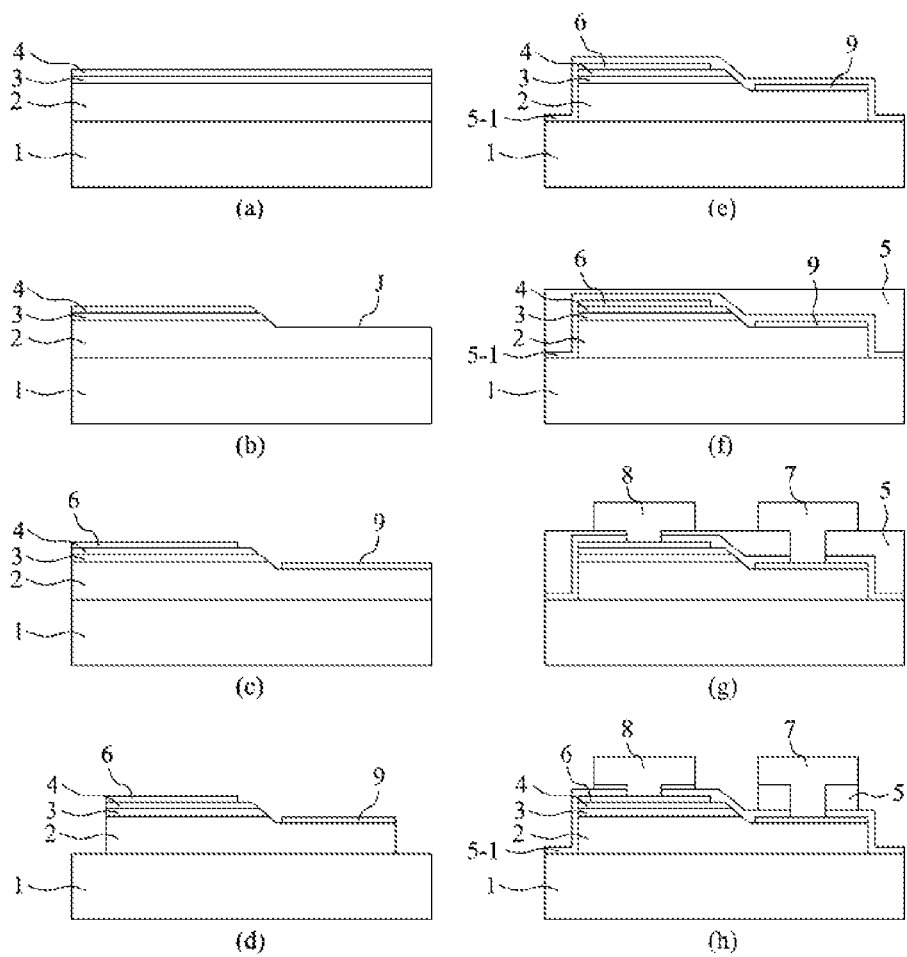
FIG. 22 illustrates a method of manufacturing the semiconductor light emitting device of FIG. 21.

FIG. 22 illustrates a method of manufacturing the semiconductor light emitting device of FIG. 21. First, as shown in FIG. 22A, a sequence of the first semiconductor region 2, the active region 3 and the second semiconductor region 4 can be provided on the light transmitting substrate 1. Then, as shown in FIG. 22B, a region J is prepared, where the first electrode 7 is to be formed. After that, the current spreading electrode 6 and the ohmic contact electrode 9 are formed, as shown in FIG. 22C. The current spreading electrode 6 and/or the ohmic contact electrode 9 preferably have a reflective film structure (a metal or DBR having excellent reflectivity). More preferably, they are formed of a metal reflective film in order to prevent a photochromic phenomenon (photodegradation due to light) in the insulation layer 5 to be formed later. Continuing to FIG. 22D, the semiconductor regions 2, 3 and 4 are isolated to expose the light transmitting substrate 1. Alternatively, this step may be performed prior to the steps illustrated in FIGS. 22B and 22C. Turning now to FIG. 22E, the insulation layer 5-1 (e.g., $SiO_2$) for increasing reliability of the semiconductor light emitting device may be formed by PVD or CVD (e.g., sputtering or PECVD). As shown in FIG. 22F, the insulation layer 5 is then formed. The insulation layer 5 may be obtained by spin coating. Additionally or alternatively, the spin coating process may be repeated twice or three times to achieve a higher degree of planarization. Referring to FIG. 22G, holes are formed in the insulation layer 5 and the first electrode 7 and the second electrode 8 are then formed. If needed, as shown in FIG. 22H, the insulation layer 5 is removed (e.g., by 02 plasma etching), except for the portions of the insulation layer in locations where the first and second electrodes 7 and 8 are positioned. Therefore, the semiconductor light emitting device in this example is similar to the one shown in FIG. 9, except that the insulation layer 5 is formed only under the electrodes 7 and 9.

Figure 23:
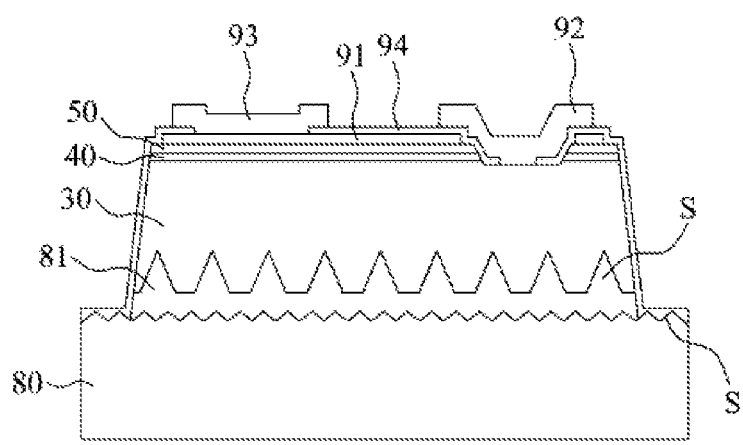
FIG. 23 shows another example of a semiconductor light emitting device according to the present disclosure.

FIG. 23 shows another example of a semiconductor light emitting device according to the present disclosure. This semiconductor light emitting device is substantially similar to the one shown in FIG. 11E. In the case of the prior art semiconductor light emitting device shown in FIG. 7, bonding is not that strong because the light transmitting substrate 314 and the semiconductor regions 302, 304 and 306 are bonded together by the soft transparent adhesive layer 312. If the N-type semiconductor region 302 has a rough surface, it might increase the bonding area between the transparent adhesive layer 312 and the N-type semiconductor region 302, but still this is not enough to completely resolve the weak bonding issue. Likewise, in the prior art semiconductor light emitting device shown in FIG. 2, the transparent substrate 102 and the semiconductor regions 104 to 112 are bonded together utilizing the P-type current expansion layer 118 (e.g., ITO) and the transparent bonding layer 130. Again, both sides are not bonded sufficiently strong, and it is not easy to maintain the bonding state. That is, when the semiconductor regions 302, 304 and 306 are supported on the light transmitting substrate 314 by going through the wafer bonding process once or twice and by employing the soft transparent adhesive 312 (an organic adhesive, such as BCB), a difference in coefficients of thermal expansion between the semiconductor regions 302, 304 and 306 and the light transmitting substrate 314 may induce thermosmechanical stress during or after the SMT process, which then may cause peeling at the relatively weak upper and lower interfaces of the transparent adhesive 312 due to the stress. Particularly, in the case of a red Mini-LED where bonding involves a transparent heterogeneous substrate, not a growth substrate, the peeling issue is very likely to occur at the organic adhesive bonding area which is known to be the weakest part. Similar to the semiconductor light emitting device shown in FIG. 11, the semiconductor light emitting device in this example includes a light transmitting substrate 80, an adhesive layer 81, a first semiconductor region 30, an active region 40, a second semiconductor region 50, a first electrode 92, a second electrode 93 and a passivation layer 94. Here, the formation of the passivation layer 94 is preceded by the formation of the first and second electrodes 92 and 93, which is different from the case of the semiconductor light emitting device in FIG. 11, but they may be formed in reverse order. Preferably, the semiconductor light emitting device further includes a light transmitting electrode 91. Various types of electrode configurations are available, as illustrated in FIGS. 12 to 22. Additionally or alternatively, the first semiconductor region 30 and/or the light transmitting substrate 80 may be provided with a rough surface S, respectively, similar to the example in FIG. 7, such that the contact area of the adhesive layer 81 as well as the optical extraction efficiency can be increased. Referring back to the example in FIG. 23, the passivation layer 94 is extended to the exposed portion of the light transmitting substrate 80 after the second semiconductor region 50, the active region 40, the first semiconductor region 30 and the adhesive layer 81 had been removed therefrom. In this manner, the passivation layer 94 is bonded to the light transmitting substrate 80, and this bonding ensures that the adhesive layer 81 is not detached from the first semiconductor region 30 and/or the light transmitting substrate 80. The passivation layer 94 can be made of a single layer or multiple layers (e.g., ODR or DBR), comprising $SiO_2$, $SiN_x$, $TiO_2$, $Al_2O_3$ or the like. For example, with the passivation layer 94 being at least 1 μm thick, it is possible to prevent peeling. The passivation layer 94 may have a multilayered structure, which is basically obtained by covering the top and lateral surfaces of the semiconductor regions 30, 40 and 50 with a dielectric material (e.g., $SiO_2$, $Al_2O_3$, $SiN_x$), followed by consecutively depositing metals having high reflectivity (e.g., Ag, Al, Au, Cu, Pt, Cr, Ti, TiW). Other examples of a material for the adhesive layer 81 may include BCB, silicone, SU-8, $SiO_2$, SOG, acrylate, urethane, OCA, OCR, etc.

Figure 24:
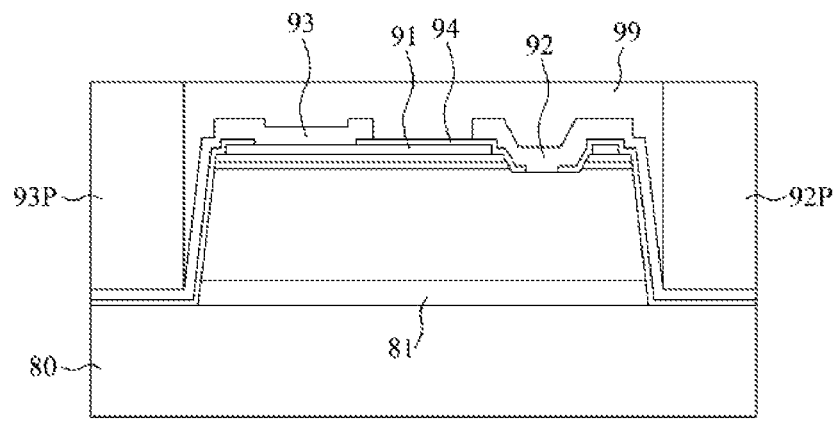
FIGS. 24 and 25 show another example of a semiconductor light emitting devices according to the present disclosure.
Figure 25:
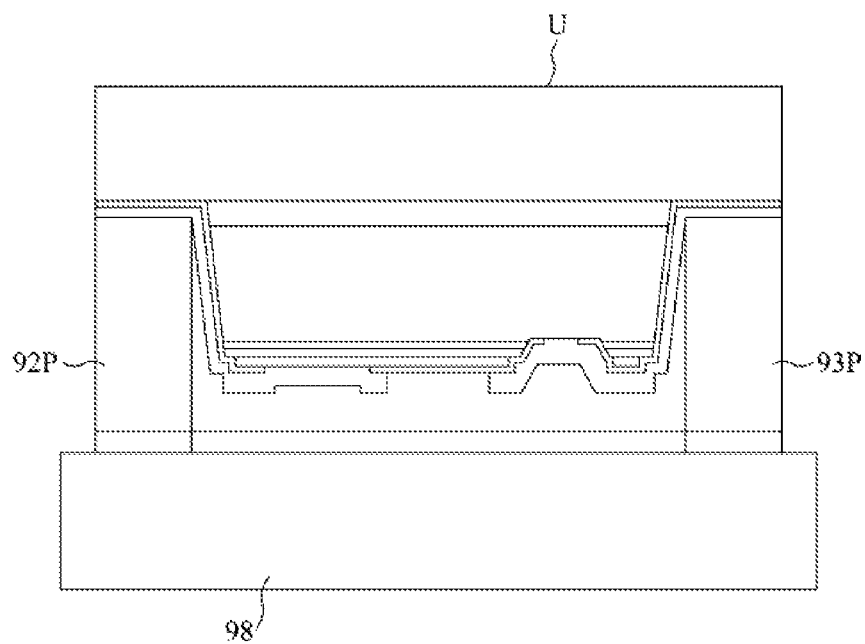

FIGS. 24 and 25 show another example of a semiconductor light emitting device according to the present disclosure. Here, the first electrode 92 and the second electrode 93 are extended over the light transmitting substrate 80, through the passivation layer 94. This configuration (that is, the passivation layer 94 covers at least the semiconductor regions 30, 40 and 50, and the adhesive layer 81 and the first and second electrodes 92 and 93 on the passivation layer 94 are extended to the light transmitting substrate 80) can effectively prevent peeling at either side of the adhesive layer 81. In this case, the passivation layer 94 may be extended over the light transmitting substrate 80 or may be extended only up to the interface between the adhesive layer 81 and the light transmitting substrate 80. Additionally, the semiconductor light emitting device may further include a first electrode post 92P and a second electrode post 93P on the first electrode 92 and the second electrode 93 formed on the light transmitting substrate 80, respectively. With the first and second electrode posts 92P and 93P, the semiconductor light emitting device can be electrically and mechanically connected to an external power supply 98 (e.g., a submount, an interposer, a wiring board, a display pixel or the like), as shown in FIG. 25. The first electrode post 92P and the second electrode post 93P may have a height greater than the semiconductor regions 30, 40 and 50 (approximately 4-5 μm) and less than 10 μm. Preferably, in order to support the first electrode post 92P and the second electrode post 93P, an encapsulant 99 (e.g., white silicone) can be filled (e.g., screen printed) into the space where the first electrode post 92P and the second electrode post 93P are not formed. Further, the semiconductor light emitting device can be formed into a single package. The first electrode post 92P and the second electrode post 93P may be formed by copper plating. If needed, the surface U of the light transmitting substrate 80 opposite to the adhesive layer 81 may have a rough surface for light scattering or a carbon-based epoxy coating may be applied thereon.

Figure 26:
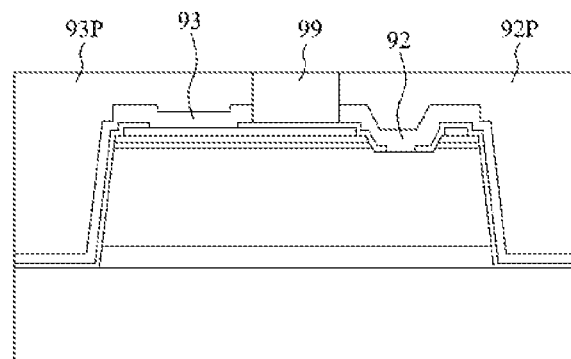
FIG. 26 shows other examples of a semiconductor light emitting device according to the present disclosure.
Figure 26:
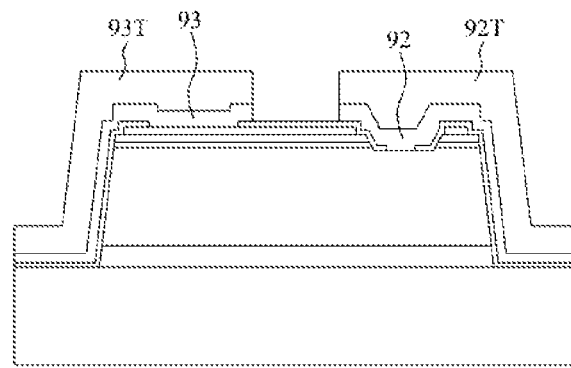

FIG. 26 shows other examples of a semiconductor light emitting device according to the present disclosure. FIG. 26A shows an example in which the first electrode post 92P and the second electrode post 93P are overlapped with the first electrode 92 and the second electrode 93 formed on the semiconductor regions 30, 40 and 50. FIG. 26B shows an example in which, through PVD (e.g., sputtering, E-beam deposition) rather than copper plating, a first electrode reinforcement part 92T and a second electrode reinforcement part 93T are overlapped with the first electrode 92 and the second electrode 93 formed on the semiconductor regions 30, 40 and 50 (accordingly, the first reinforcement part 92T and the second electrode reinforcement part 93T are formed along the overall contour of the semiconductor regions 30, 40 and 50). This configuration is highly effective in preventing the peeling problem at either side of the adhesive layer 80.

Figure 27:
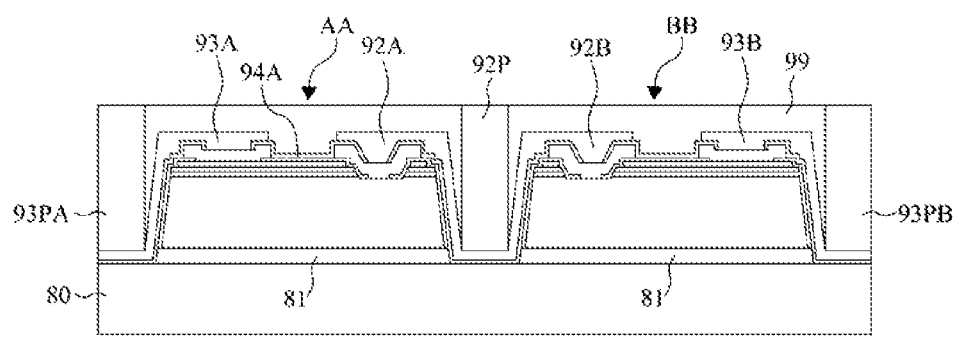
FIG. 27 shows another example of a semiconductor light emitting device according to the present disclosure.

FIG. 27 shows another example of a semiconductor light emitting device according to the present disclosure, in which two semiconductor light emitting device chips AA and BB are provided onto one light transmitting substrate 80 using an adhesive layer 81 as a medium. Here, the first electrode post 92P and the second electrode posts 93PA and 93PB are formed by the same method illustrated in FIG. 24. The first electrode post 92P functions as a common electrode, being connected to the first electrode 92A of the semiconductor light emitting device chip AA and to the first electrode 92B of the semiconductor light emitting device chip BB. The first electrode 92A and the first electrode 92B can be integrated into one or can be formed separately. The second electrode post 93PA is connected to the second electrode 93A of the semiconductor light emitting device chip AA, and the second electrode post 93PB is connected to the second electrode 93B of the semiconductor light emitting device chip BB. With this configuration, a plurality of semiconductor light emitting device chips can be combined into one package and connected to the external power supply 98 (e.g., the submount, the interposer, the wiring board, the display pixel or the like) as shown in FIG. 25. This is advantageous when the semiconductor light emitting device chips AA and BB are micro-LED chips, as the inspection and replacement process in case of failure will be performed at the package level, rather than on an individual semiconductor light emitting device chip in a respective panel (pixel). That is, a package is inspected, replaced if failure is detected, and put back to the panel (pixel). If two semiconductor light emitting device chips AA and BB emit light of the same color, they can be grown on one growth substrate and formed through the processes described above. If two semiconductor light emitting device chips AA and BB emit light of different colors, each chip AA or BB can be transferred onto the light transmitting substrate 80 using the respective adhesive layer 81 as a medium. Examples of transfer techniques used here include pick & place (which mechanically transfers and arranges chips), stamp (which uses a stamp structure patterned with an adhesive material (e.g., silicone-based PDMS) to transfer and arrange chips), a method of employing a structure of electrostatic or electromagnetic force to transfer and arrange chips, self-assembly (which employs fluid having a predefined uniform viscosity combined with a structure of electromagnetic force to transfer and arrange chips), laser-induced forward transfer (which employs a laser light source together with an explosive adhesive material to transfer and arrange chips) and the like. With the growth substrate 1 or 10, the support substrate or the light transmitting substrate 80 being removed (preferably, as shown in FIGS. 11E and 23, after the growth substrate 10 is removed, the passivation layer 94 is formed on the top and lateral surfaces of the semiconductor regions 30, 40 and 50, and the electrodes 91, 92 and 93 are formed), each of the semiconductor light emitting device chips AA and BB formed into the state shown in FIGS. 11E and 12 to 22 is transferred onto the light transmitting substrate 80. Once the semiconductor light emitting device chips AA and BB are transferred onto the light transmitting substrate 80 using the adhesive layer 80 as a medium, the passivation layer 94A is typically applied to prevent peeling of the semiconductor light emitting device chips AA and BB and/or the light transmitting substrate 80 from the adhesive layer 81, and the first electrodes 92A and 92B and the second electrodes 93A and 93B are then formed and extended over the light transmitting substrate 80, followed by the first electrode post 92P and the second electrode posts 93PA and 93PB. Besides BCB (250° C.) for the adhesive layer 81, other organic adhesives for wafer bonding may also be used, including, for example, polyimide (160° C.), SU-8 (90° C.), parylene (230° C.), epoxy (150° C.), silicone (100-300° C.), $SiO_2$, SOC (Spin On Glass) and so on.

Figure 28:
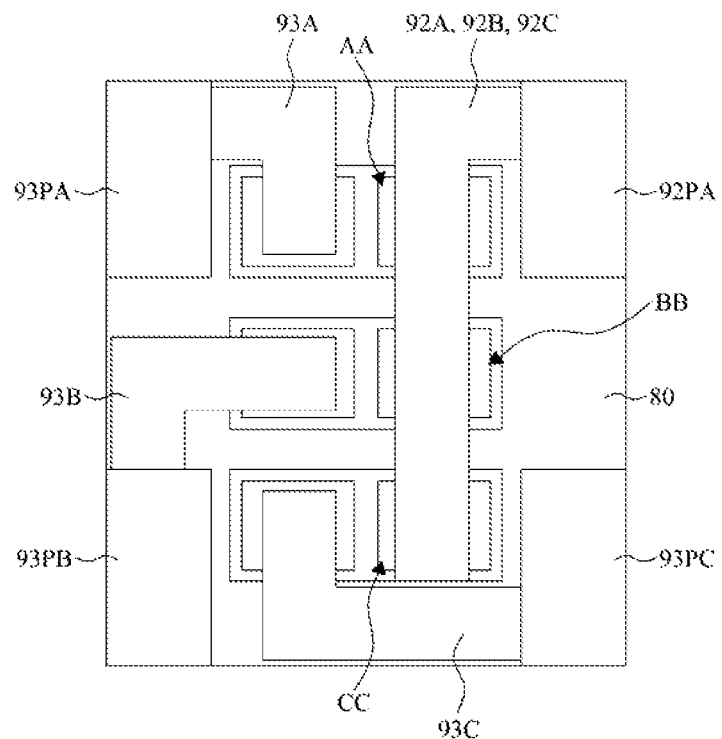
FIG. 28 shows another example of a semiconductor light emitting device according to the present disclosure.
Figure 29:
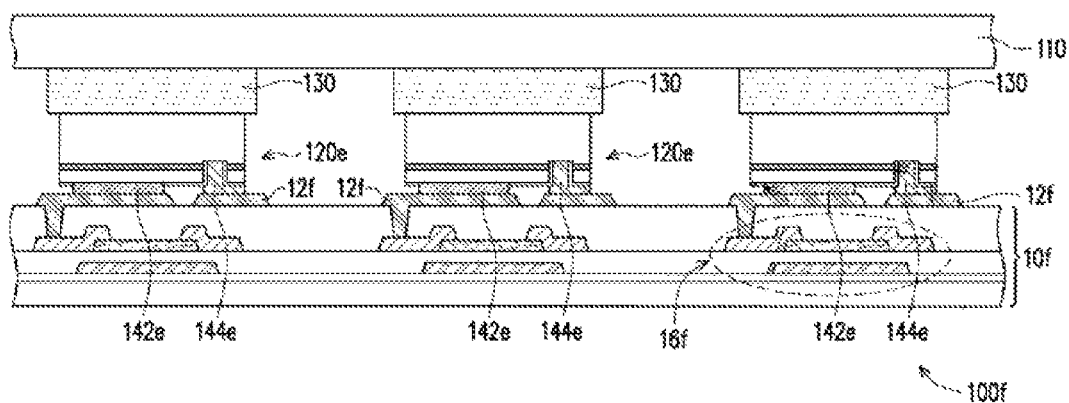
FIG. 29 shows an example of a semiconductor light emitting device or display described in US Patent Application Publication No. US 2017-0323873.
Figure 30:
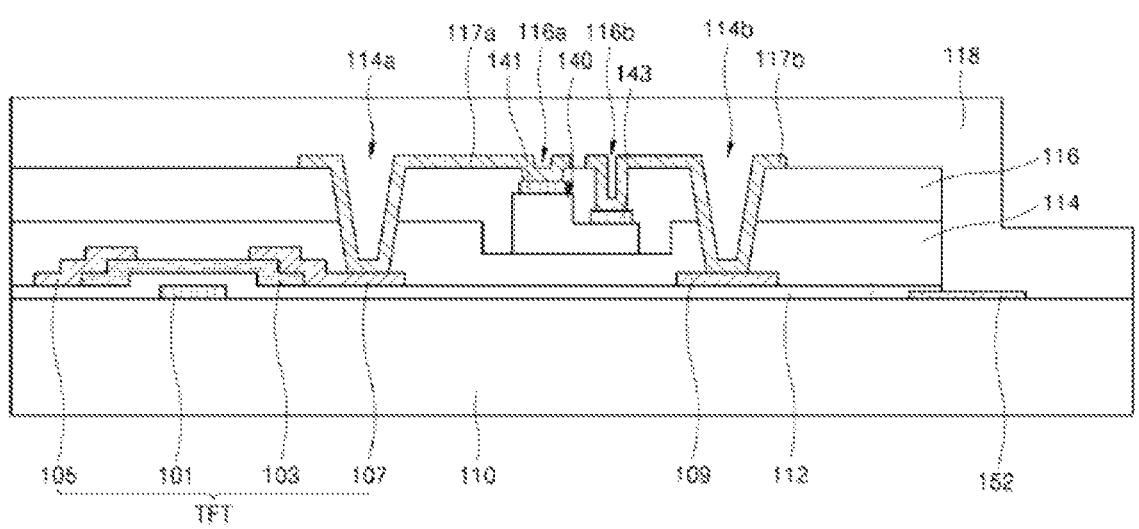
FIG. 30 shows an example of a micro-LED display described in Korean Patent Application Publication No. 10-2019-0078945.

FIG. 28 shows another example of a semiconductor light emitting device according to the present disclosure, in which three semiconductor light emitting device chips AA, BB and CC (e.g., an RGB LED) are provided on one light transmitting substrate 80. These chips can be transferred onto the light transmitting substrate 80 in the same manner described in FIG. 27. The semiconductor light emitting device in this example includes the first electrode post 92PA, and the second electrode posts 93PA, 93PB and 93PC. Each of these three semiconductor light-emitting device chips AA, BB and CC has the first electrode 92A, 92B and 92C and the second electrode 93A, 93B and 93C. As apparent from FIG. 28, the first electrode 92A, 92B and 92C is present in an integrated form, while the second electrodes 93A, 93B and 93C are present separately. In an alternative example, the first electrodes 91A, 92B and 92C may be present separately, while the second electrodes 93A, 93B and 93C may be present in an integrated form. The first electrode post 92PA is connected to the first electrode 92A, 92B and 92C and functions as a common electrode. The second electrode posts 93PA, 93PB and 93PC are connected to the second electrodes 93A, 93B and 93C, respectively, on the three semiconductor light emitting device chips AA, BB and CC. As described earlier, the three semiconductor light emitting device chips AA, BB and CC are first attached to the light transmitting substrate 80 using the adhesive layer 81 (see FIG. 27), respectively, and the passivation layer 94A (see FIG. 27) is then formed. Following that, the first electrode 92A, 92B and 93C and the second electrodes 93A, 93B and 93C are formed and extended over the light transmitting substrate 80, and the first electrode post 92PA as well as the second electrode posts 93PA, 93PB and 93PC are formed (e.g., copper plated). Preferably, the spaces between the first electrode post 92PA and the second electrode posts 93PA, 93PB and 93PC are filled with the encapsulant 99, as in FIG. 27.

In short, the configuration described above has the following advantages. Firstly, a mini- or micro-LED can have a window (the light transmitting substrate 80) that has a sufficient thickness.

Secondly, as mini- or micro-LEDs are put in the panel (pixel) in the form of a package, not in the form of chips, the assembly gets simplified, and the inspection and replacement process is facilitated.

Thirdly, with all of the RGB LED chips being configured with p-side up flip chips, those problems occurring in n-side up flips (e.g., as the size of chips gets smaller, excessive heat may be generated due to N-type nonuniform current flows) can be resolved.

Fourthly, the passivation layer 94 and/or the first electrode 92A, 92B, 92C and the second electrodes 93A, 93B and 93C are connected to the light transmitting substrate 80 without the adhesive layer 81, primarily eliminating the possibility of peeling at either side of the adhesive layer 81. Hence, mini- or micro-LEDs of higher reliability can be produced.

Fifthly, it is possible to manufacture a package for the mini- or micro-LED comprised of p-side up flip chips for all RGB chips, while ensuring high reliability for the device. Here, a red LED chip may undergo wafer boding twice to become a p-side up flip chip, while green and blue LED chips may not need wafer bonding at all or may undergo wafer bonding twice to become p-side up flip chips. Alternatively, wafer bonding may be conducted four times.

Figure 31:
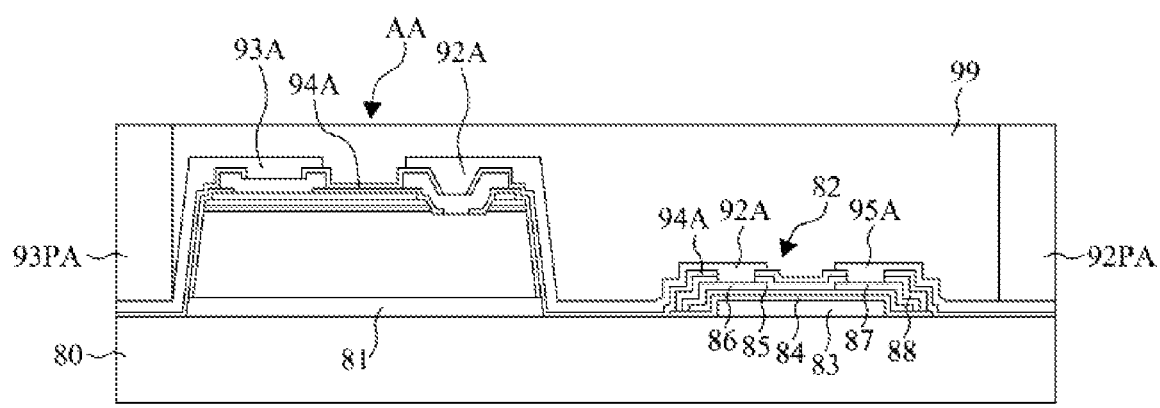
FIG. 31 shows another example of a semiconductor light emitting device according to the present disclosure.

FIG. 31 shows another example of a semiconductor light emitting device according to the present disclosure. This semiconductor light emitting device is different from the one shown in FIG. 27 in that a semiconductor light emitting device chip AA and a thin film transistor (TFT) 82 are provided on the light transmitting substrate 80. The TFT 82 can be formed using a well-known deposition technique, before the semiconductor light emitting device chip AA is transferred to the light transmitting substrate 90. The TFT 82 includes a gate electrode 83, an insulation layer 84, a semiconductor layer 85, a first electrode 86 (e.g., a source electrode) and a second electrode 87 (e.g., a drain electrode). Preferably, it further includes an insulation layer 88. The semiconductor layer 85 may be made of amorphous silicon (a-Si) or polysilicon (LTPS). Also, it may be made of an oxide semiconductor (e.g., IGZO (Indium Gallium Zinc Oxide), $TiO_2$, ZnO, $WO_3$ or $SnO_2$) if the light transmitting substrate 80 is made of a material that can withstand at least 500° C. (e.g., sapphire, quartz or glass). After the semiconductor light emitting device chip AA is transferred, the rest of the configuration is similar to the one in FIG. 27, i.e. the passivation layer 94A is formed, openings or holes are formed by etching, and a first electrode 94A, a second electrode 93A and a connection electrode 95A are formed. Subsequently, a first electrode post 92A, a second electrode post 93PA, and a third electrode post 94PA (see FIG. 32) are formed and finally, an encapsulant 99 is provided. The passivation layer 94A may be extended over the TFT 82. The first electrode 92A is connected to the first electrode 86 of the TFT 82. The connection electrode 95A electrically connects the second electrode 87 of the TFT 82 to the second electrode post 92PA. For convenience of description, the third electrode post 94PA is not shown in FIG. 31 but it can be referred to FIG. 32. When a driving signal is input through the third electrode post 94PA, the semiconductor layer 85 is activated through the gate electrode 83 connected to the third electrode post 94PA, and the first and second electrodes 86 and 87 become electrically conductive, allowing the current to flow to the second electrode post 93PA, the second electrode 93A, the first electrode 92A, the first and second electrodes 86 and 87 of the TFT 82, the connection electrode 95A and the first electrode post 92PA to cause the semiconductor light emitting device chip AA to emit light. When the light transmitting substrate 80 is a growth substrate for the semiconductor light emitting device chip AA, the TFT 82 can be formed after the formation of the semiconductor light emitting device chip AA. In this case, the adhesive layer 81 can be omitted.

Figure 32:
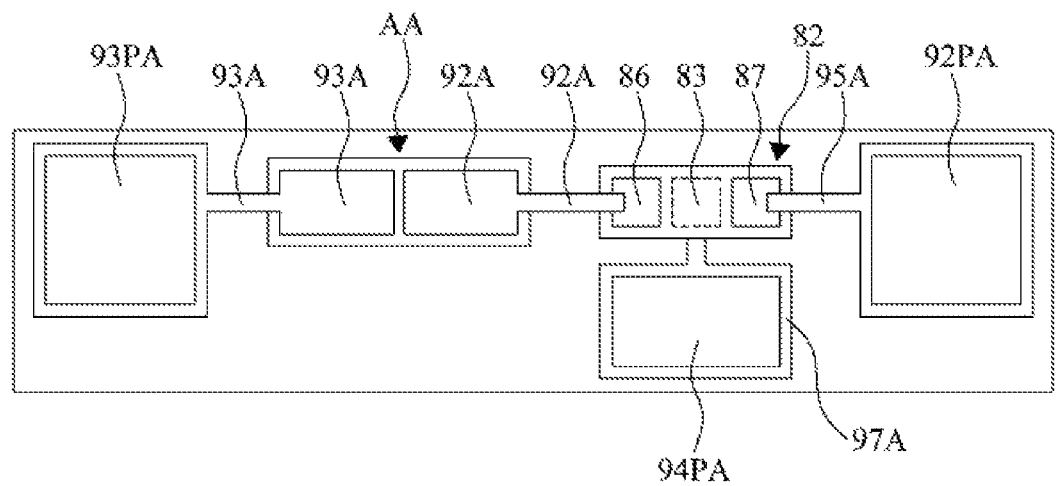
FIG. 32 shows an exemplary arrangement of the semiconductor light emitting device of FIG. 31.

FIG. 32 shows an example of the arrangement of the semiconductor light emitting device of FIG. 31. Here, the third electrode post 94PA or a gate electrode post is connected to the gate electrode 83 of the TFT 82, and the connection electrode 97A electrically connects the gate electrode 83 to the third electrode post 94PA. The connection electrode 97A can be formed separately or can be formed as a part of the gate electrode 83 during its formation. Moreover, the first electrode portion 92A that connects the first electrode 92A and the first electrode 86, and the second electrode portion 93A that connects the second electrode post 93PA and the second electrode 93 are connection electrodes, which can be formed separately.

Figure 33:
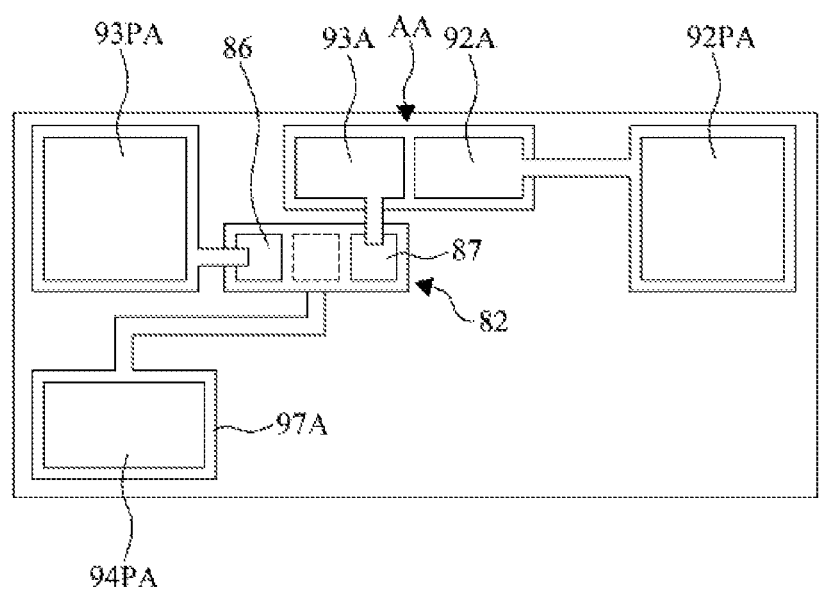
FIG. 33 shows a modified example of the semiconductor light emitting device of FIG. 31.

FIG. 33 shows a modified example of the semiconductor light emitting device of FIG. 31. This semiconductor light emitting device is different from those shown in FIGS. 31 and 32 in that the TFT 82 is provided between the second electrode 93PA and the second electrode 93A of the semiconductor light emitting device chip AA. The first electrode 86 of the TFT 82 is electrically connected to the second electrode post 93PA through the connection electrode, the second electrode 87 of the TFT 82 is electrically connected to the second electrode 93A of the semiconductor light emitting device chip AA, and the first electrode 92A of the semiconductor light emitting device chip AA is directly connected to the first electrode post 92PA.

Figure 34:
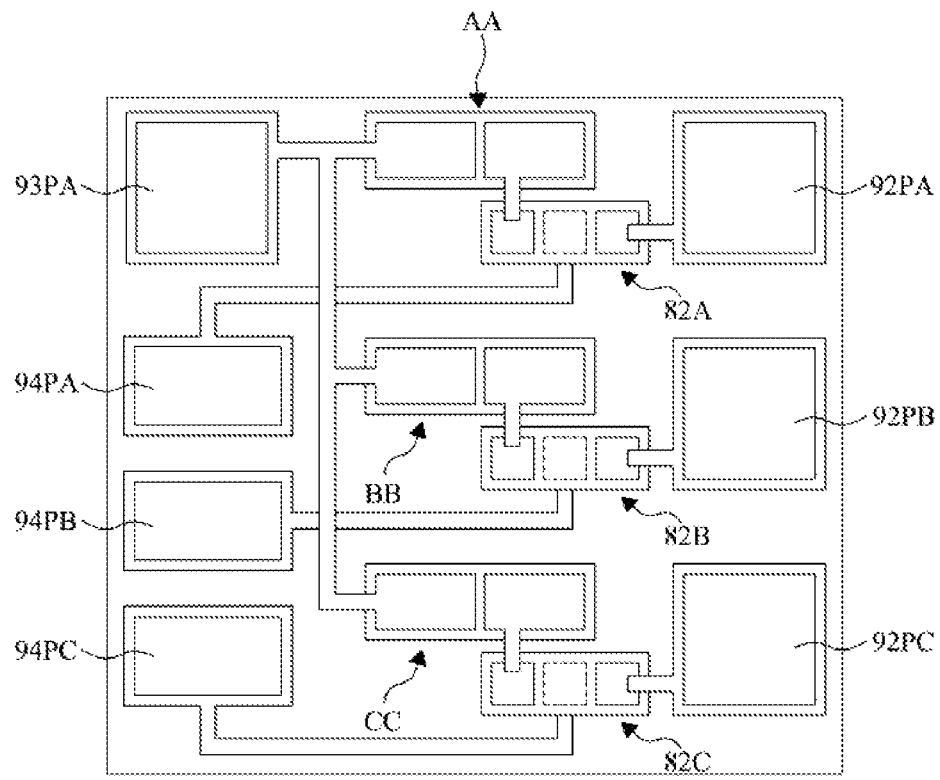
FIG. 34 shows another example of a semiconductor light emitting device according to the present disclosure.

FIG. 34 shows another example of a semiconductor light emitting device according to the present disclosure. In addition to the configuration of the semiconductor light emitting device shown in FIG. 28, the semiconductor light emitting device of this exmaple is provided with three TFTs 82A, 82B and 82C serving as switches for three semiconductor light emitting device chips AA, BB and CC, respectively. The semiconductor light emitting device is further provided with third electrode posts or gate electrode posts 94PA, 94PB and 94PC to receive a respective driving signal for each of the TFTs 82A, 82B and 82C from the external power supply 98 (e.g., the submount, the interposer, the wiring board, the display pixel or the like) as shown in FIG. 25. The third electrode posts or the gate electrode posts 94PA, 94PB and 94PC as well as the first and second electrode posts 92PA, 92PB, 92PC and 93PA can be formed together using the same method to have the same height. Here, the second electrode post 93PA functions as a common electrode. Alternatively, the configuration shown in FIG. 33 can also be applied here, in which case one of the first electrode posts 92PA, 92PB or 92PC can serve as a common electrode.

Therefore, the configurations shown in FIGS. 31 to 34 allow the TFTs 82A, 82B and 82C to be formed on the side of the semiconductor light emitting device where they are mounted in a package form (in particular, on the side of the light transmitting substrate 80 (an optical window) that is the light emission side of the semiconductor light emitting device), rather than on the side of the external power supply 98 (see FIG. 25). Moreover, with the configurations, the formation of the external power supply 98 (see FIG. 25) as required is not going to be deterred or impeded even when the semiconductor layer 84 needs to be made of an oxide semiconductor and should withstand a very high temperature (e.g., at least 500° C.) when it is deposited on the substrate. On one hand, one semiconductor light emitting device may be divided into individual semiconductor light emitting devices and coupled to the external power supply 98 (see FIG. 25) as shown in FIG. 34. On the other hand, the light transmitting substrate 80 may not be cut, or may be cut into specific dimensions, or may be transferred to the external power supply 98 (see FIG. 25) at the wafer level (two or more the semiconductor light emitting devices of FIG. 34 are connected consecutively), saving substantial amounts of time and resources required to transfer hundreds of thousands of chips or packages.

Referring back to FIG. 24, the passivation layer 94 may also be referred to as a non-conducting reflective film 94. As discussed earlier with reference to FIGS. 15 and 16, this non-conducting reflective film 94 may be made of a single-layered dielectric film (e.g., $SiO_x$, $TiO_x$, $Ta_2O_5$ or $MgF_2$), a multilayered dielectric film, a DBR reflective film (e.g., $SiO_2/TiO_2$) or a combination thereof.

Figure 35:
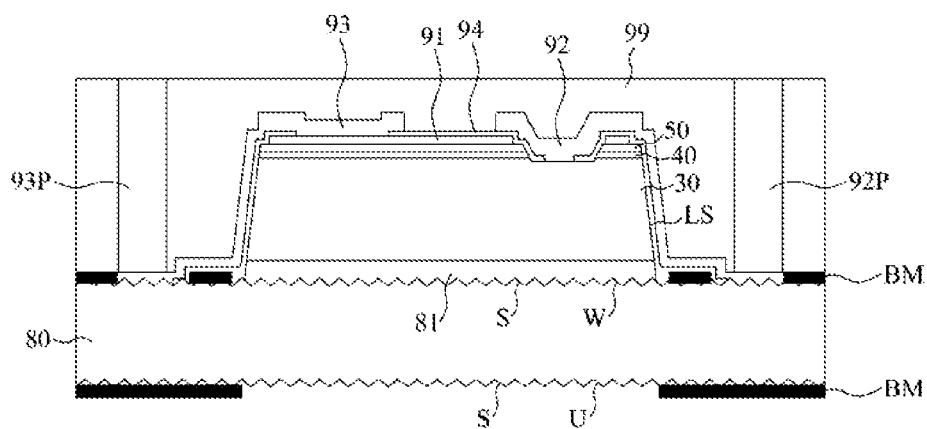
FIG. 35 shows another example of a semiconductor light emitting device according to the present disclosure.

FIG. 35 shows another example of a semiconductor light emitting device according to the present disclosure. This semiconductor light emitting device is substantially similar to the one shown in FIG. 24, except that a block matrix material BM is formed on the light transmitting substrate 80. The lateral surfaces LS of the semiconductor regions 30, 40 and 50 are tilted and hence guide the light generated by the active region 40 to be emitted towards the plane U of the light transmitting substrate 80. This becomes more effective if the non-conducting reflective film 94 comprises a DBR as the reflective film, as mentioned above. Rough surfaces S, S may be formed on the plane W and/or the plane U of the light-emitting substrate 80 in order to improve the optical extraction efficiency. These rough surfaces S, S also serve to increase the bonding area of the adhesive layer 81 and/or the black matrix material BM. Having a reflection property, the non-conducting reflective film 94 can advantageously minimize light absorption by the black matrix material BM formed on the plane W of the light transmitting substrate 80. For the semiconductor light emitting device with this configuration, therefore, the screen gets darkened in general when the display is not in operation, and black matrix material used is provided in the package (see FIG. 35) or interposer, rather than on the front glass screen of the display.

Figure 36:
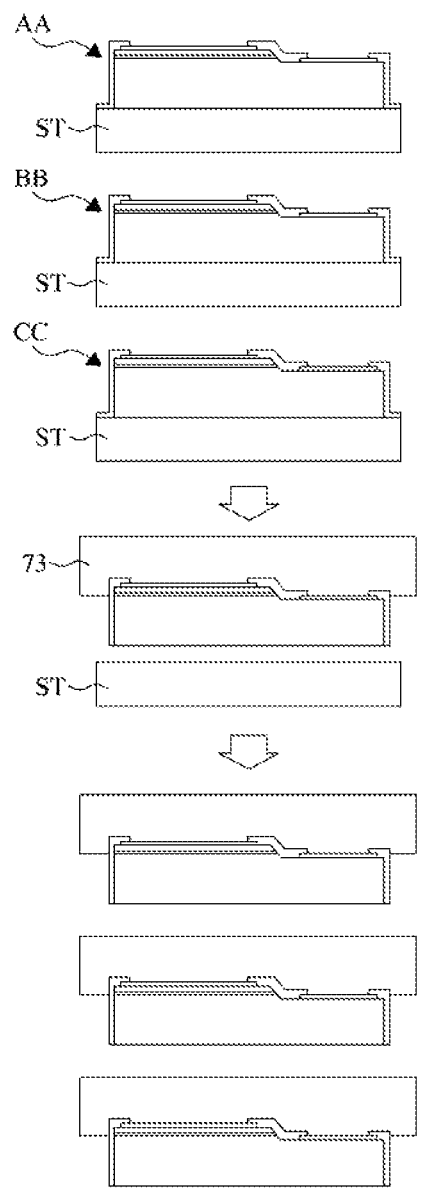
FIGS. 36, 37 and 38 illustrate a method of manufacturing the semiconductor light emitting device of FIG. 28.
Figure 37:
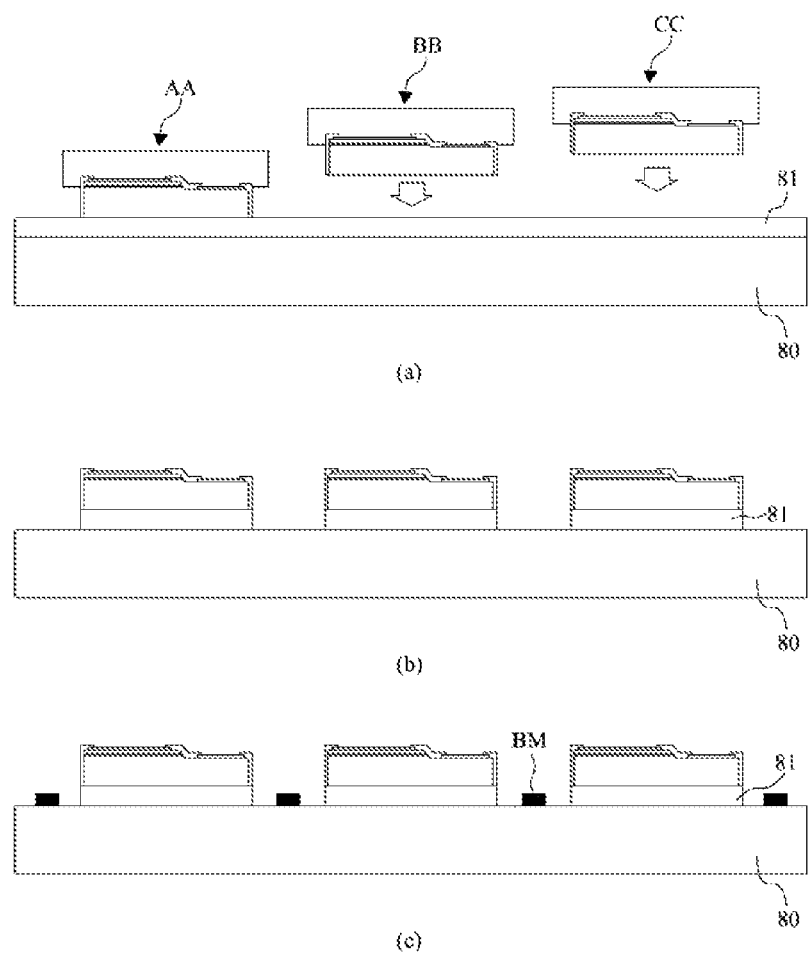
Figure 38:
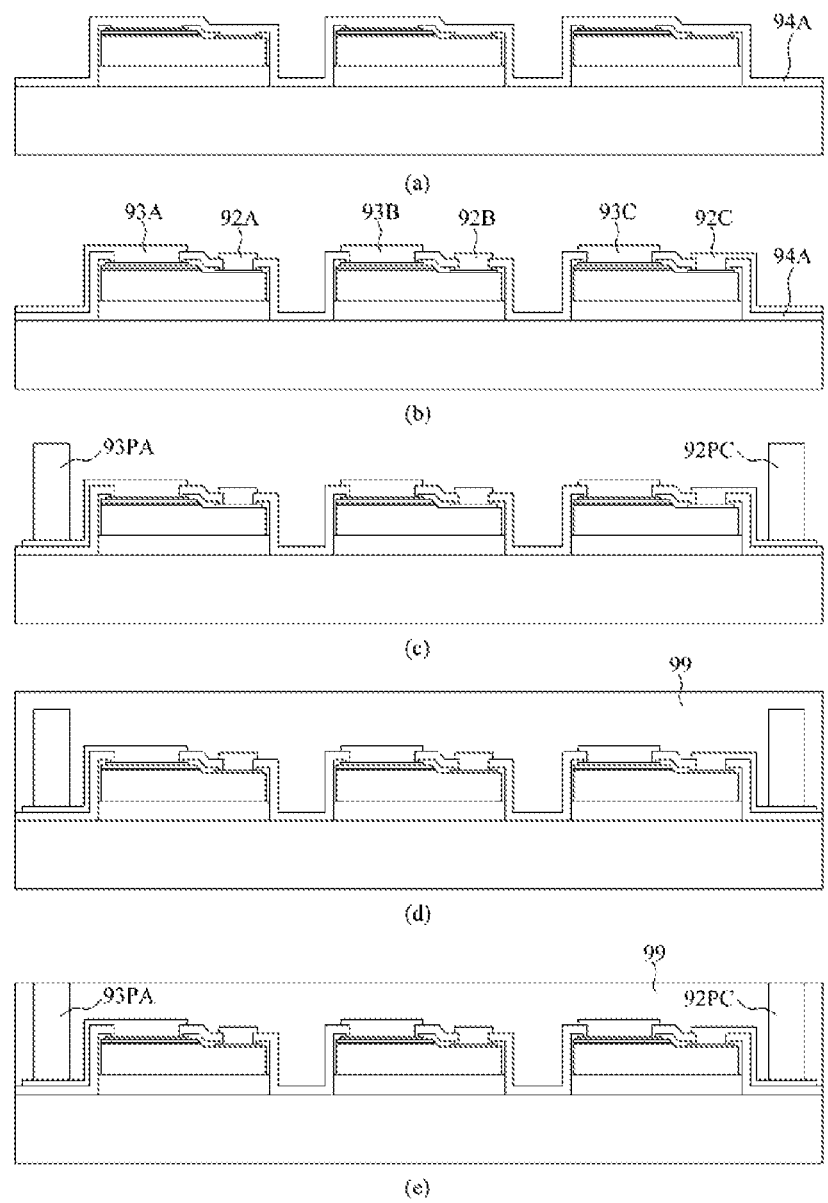

FIGS. 36 to 38 illustrate a method of manufacturing the semiconductor light emitting device shown in FIG. 28. First, as shown in FIG. 36, three semiconductor light emitting device chips AA, BB and CC are prepared. Each of the semiconductor light emitting device chips AA, BB and CC is prepared together with a substrate ST (e.g., the light transmitting substrate 80, the growth substrate 1 or 10, or the like), similar to the configuration shown in FIG. 11 or FIG. 22 (here, the insulation layer 5 can be omitted). Next, each of the three semiconductor light emitting device chips AA, BB and CC is attached to a temporary substrate 73 (e.g., a PDMS stamp), and the substrate ST is then removed by wet etching (e.g., in the case of a GaAs growth substrate) and/or laser ablation (e.g., in the case of a sapphire substrate). The wet etching process is also applicable for the light transmitting substrate 80 provided with an adhesive layer 81. In an example, if the transfer involves a GaAs growth substrate, the substrate can be separated from an etching sacrificial layer.

Continuing to FIG. 37A, the three semiconductor light emitting device chips AA, BB and CC are transferred to the light transmitting substrate 80 (e.g., sapphire, quartz or glass) provided with the adhesive layer 81 (e.g., an organic transparent adhesive such as BCB, SOG, silicone, or acrylate). Alternatively, the adhesive layer 81 may be made of an inorganic transparent adhesive (e.g., $SiO_2$), rather than an organic material.

A portion of the adhesive layer 81 in the region where the three semiconductor light emitting device chips AA, BB and CC are not provided is removed to expose to the light transmitting substrate 80, as shown in FIG. 37B. If the adhesive layer 81 is made of an organic transparent adhesive such as BCB, it is preferably removed by a dry etching process that employs $O_2$-containing plasma. If the adhesive layer 81 is made of an inorganic transparent adhesive such as $SiO_2$, it is preferably removed by a dry etching process that employs Cl-containing plasma.

If needed, a black matrix material BM (see FIG. 35) may also be formed as shown in FIG. 37C. If the black matrix material BM is photosensitive like a PR material, a photolithography patterning process can be performed. If the black matrix material BM is not photosensitive, however, chips need to be protected first with the PR material and then entirely with the black matrix material BM. The chips are dry etched until the chip-protecting PR material is exposed and removed.

Continuing to FIG. 38A, a passivation layer 94A is formed. The passivation layer 94A should be formed within a temperature range that does not cause thermal damage on the black matric material BM. It can be formed in a liquid phase (e.g., SOG) in which case planarization can be obtained.

Referring now to FIG. 38B, holes are formed in the passivation layer 94A as needed, and the first electrode 92A, 92B and 92C and the second electrode 93A, 93B and 93C are provided on each of the three semiconductor light emitting device chips AA, BB and CC, respectively.

Next, a first electrode post 92PC and a second electrode post 93PA are formed as pad electrodes, as shown in FIG. 38C.

The three semiconductor light emitting device chips AA, BB and CC, the first electrodes 92A, 92B and 92C, the second electrodes 93A, 93B and 93C, the first electrode posts 92PA, 92PB and 92PC, and the second electrode post 93PA as a common electrode can have the same arrangement as the one shown in FIG. 28.

Lastly, referring to FIGS. 38D and 38E, an encapsulant 99 (e.g., white or black silicone) is provided (e.g., screen printed) and planarized, and the first and second electrode posts 92PC and 93PA are exposed.

Figure 8:
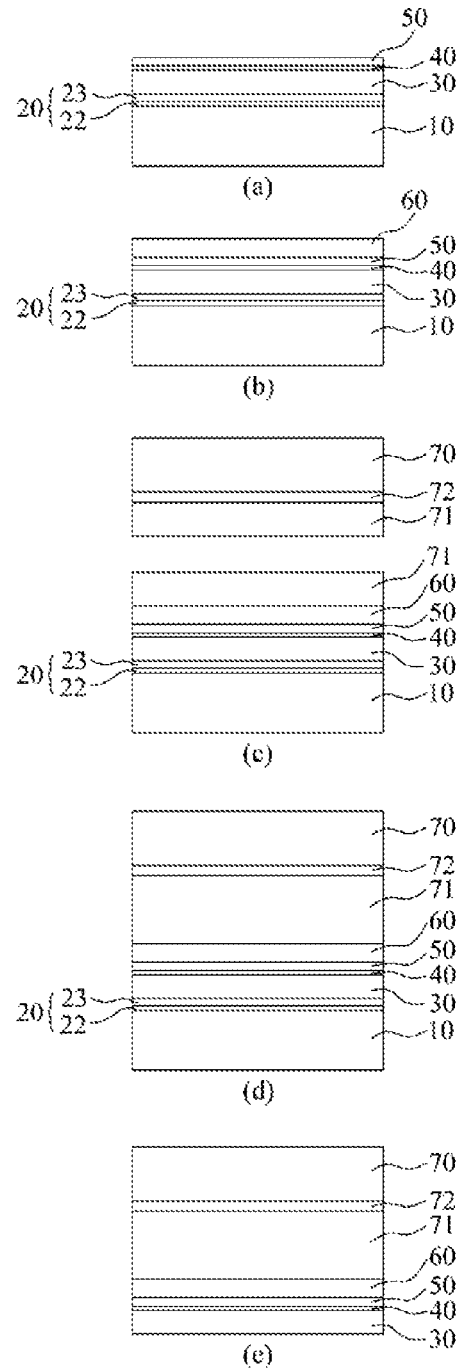
FIGS. 8, 9, 10 and 11 illustrate a method of manufacturing a semiconductor light emitting device according to the present disclosure.
Figure 9:
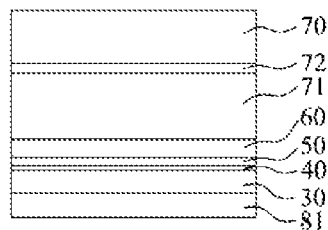
Figure 9:
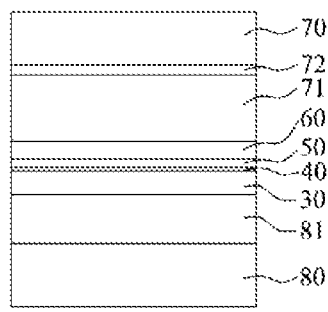
Figure 9:
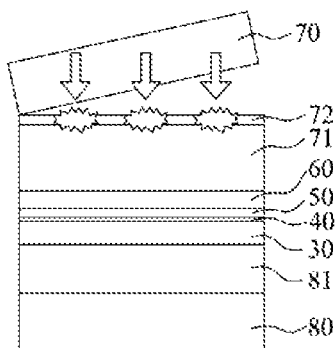
Figure 10:
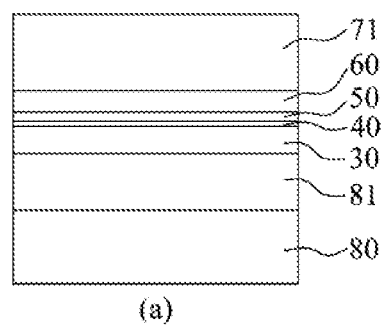
Figure 10:
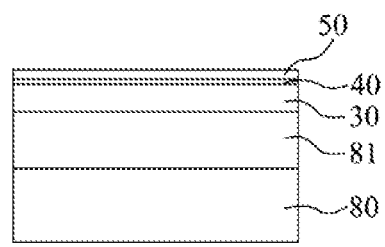
Figure 39:
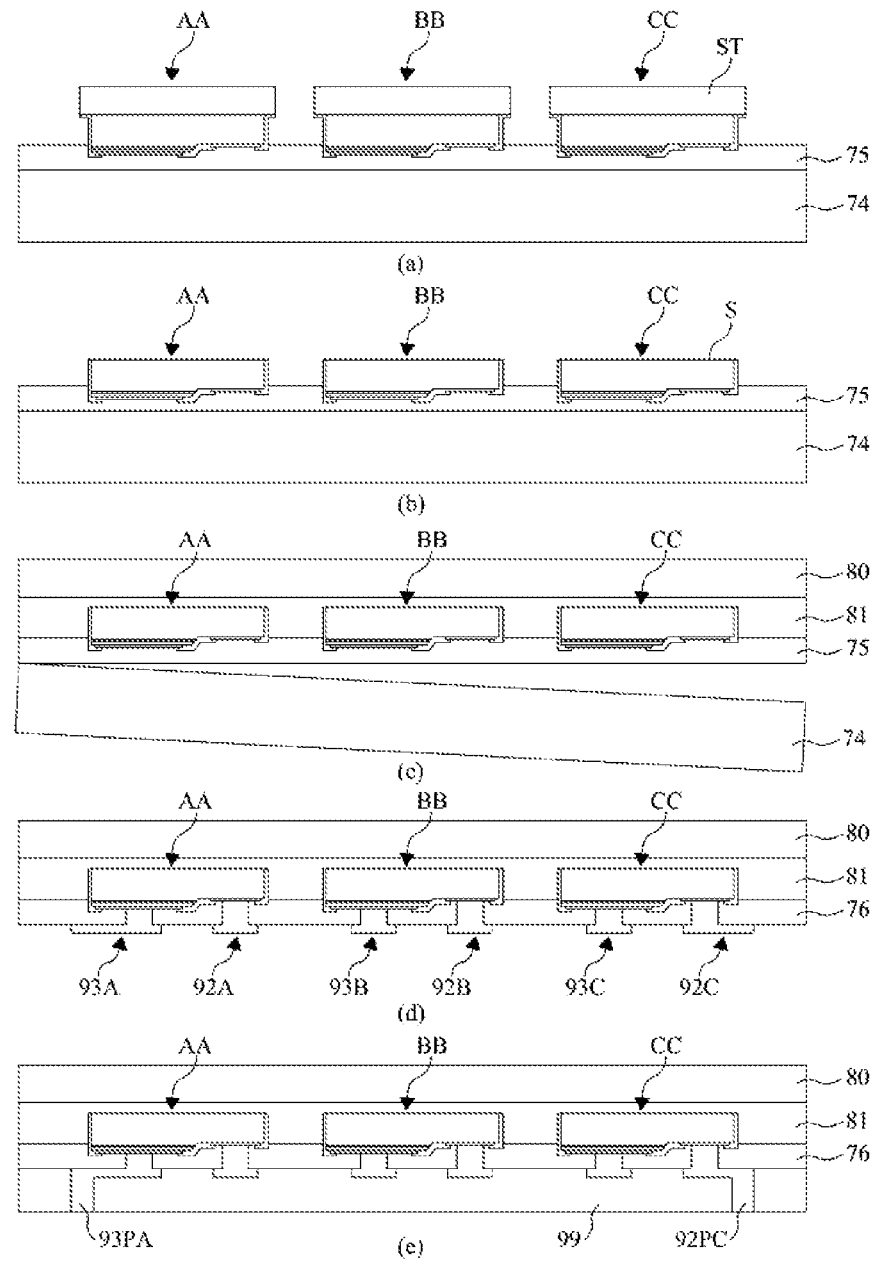
FIG. 39 illustrates another method of manufacturing a semiconductor light emitting device according to the present disclosure.

FIG. 39 illustrates another method of manufacturing a semiconductor light emitting device according to the present disclosure. First, three semiconductor light emitting device chips AA, BB and CC are prepared, as shown in FIG. 36. Each of the semiconductor light emitting device chips AA, BB and CC is prepared together with a substrate ST (e.g., the light transmitting substrate 80, the growth substrate 1 or 10, or the like), similar to the configuration shown in FIG. 11 or FIG. 22 (here, the insulation layer 5 can be omitted). Preferably, the respective substrates ST of the three semiconductor light emitting device chips AA, BB and CC are prepared in a form that they can be removed by laser ablation. For example, in the case of chips that emit UV, blue or green light, their growth substrates (e.g., sapphire substrates) may be used as the substrate ST as are, due to their light transmitting properties. Meanwhile, in the case of chips that emit red light, their growth substrates (e.g., GaAs substrates) are opaque and hence, laser ablation is not allowed. As such, the method illustrated in FIGS. 8 to 11 are used to prepare a light transmitting substrate 80 as the substrate ST. It should be noted, however, after the growth substrate 10 is removed, as shown in FIG. 8E, the light transmitting substrate 80 and the semiconductor regions 30, 40 and 50 are attached using the metal bonding layer 71 and the sacrificial layer 72, rather than the adhesive layer 81 shown in FIG. 9A. Again, chips that emit UV, blue or green light can be manufactured according to the method illustrated in FIGS. 8 to 11.

As can be seen in FIG. 39A, The three semiconductor light emitting device chips AA, BB and CC are attached to a temporary substrate 74 provided with an adhesive layer 75. The temporary substrate 74 is preferably made of a material having a lattice constant similar to or identical with that of the substrate ST of each of the three semiconductor light emitting device chips AA, BB, and CC, such as a sapphire substrate. The adhesive layer 75 may comprise an organic material, including BCB, polyimide, SU-8, parylene, epoxy, or silicone, for example. At the chip level where each chip has a substrate ST, the three semiconductor light emitting device chips AA, BB and CC can be transferred onto the light transmitting substrate 80 using their respective adhesive layer 81 as a medium. Examples of transfer techniques used here include pick & place (which mechanically transfers and arranges chips), stamp (which uses a stamp structure patterned with an adhesive material (e.g., silicone-based PDMS) to transfer and arrange chips), a method of employing a structure of electrostatic or electromagnetic force to transfer and arrange chips, self-assembly (which employs fluid having a predefined uniform viscosity combined with a structure of electromagnetic force to transfer and arrange chips), laser-induced forward transfer (which employs a laser light source together with an explosive adhesive material to transfer and arrange chips) and the like. Because the transfer process is performed after the electrodes 92 and 93 (see FIG. 11E) are formed, the quality (e.g., good or bad) of each chip can be inspected before the chips are transferred. Moreover, all high-temperature processes required for the chip process up to the formation of the electrodes 92 and 93 (see FIG. 11E) are performed prior to the transfer process, which allows more options for the material of the adhesive layer 75.

Next, referring to FIG. 39B, the substrate ST of each of the three semiconductor light emitting device chips AA, BB, and CC is removed by laser ablation. As discussed earlier in FIG. 9C, with laser ablation, the adhesive layer 75 is prevented from getting damaged during the separation of the substrate ST. Thereafter, the metal bonding layer 71 is removed, and as discussed in FIG. 8E, a portion or all of the undoped semiconductor region 23 is preferably removed (e.g., etched) and a surface texturing process can additionally be performed on the first semiconductor region 30 to increase the optical extraction efficiency.

Continuing to FIG. 39C, after the adhesive layer 81 (e.g., OCA, OCR, polyimide, SU-8, parylene, epoxy, silicone, SiO$_2$ or SOG) and the light transmitting substrate 80 (e.g., sapphire, quartz or glass) are attached to the three semiconductor light emitting device chips AA, BB and CC, the temporary substrate 74 and the adhesive layer 75 are removed. Alternatively, the adhesive layer 75 on the side of the temporary substrate 74 may be kept and used as a planarization layer. The adhesive layer 75 on the side of the light transmitting substrate 80 is an organic or inorganic transparent adhesive, including, for example, OCA (Optical Clear Adhesive), OCR (Optical Clear Resin), polyimide, SU-8, parylene, epoxy, silicone, SiO$_2$, and SOG. Additionally or alternatively, the adhesive layer 81 may include BCB or any light transmitting adhesive having high optical reliability. Considering the adhesive layer 81 is present in the interposer (PKG, Module) end product, OCA, OCR, M2, SiO$_2$ and SOG may be more preferred due to their resistance to high temperature and to environment, preventing any quality issue.

Referring next to FIG. 39D, the planarization layer 76 is formed, and the first electrode 92A, 92B and 92C and the second electrode 93A, 93B and 93C are formed on each of the three semiconductor light emitting device chips AA, BB and CC, respectively. Alternatively, the electrodes may be formed by exposing an electrode part without the planarization layer if the adhesive layer 75 on the side of the temporary substrate 74 is not going to be removed. The first electrodes 92A, 92B and 92C and the second electrodes 93A, 93B and 93C may be referred to as wiring electrodes in order to distinguish from the electrodes 92 and 93 (see FIG. 11E) that are already formed on each of the three semiconductor light emitting device chips AA, BB and CC of FIG. 39A. The electrodes 92 and 93 (see FIG. 11E) may have a reflective electrode structure including metals with excellent reflectivity (e.g., Ag, Al or Au), namely, Ti/Ag or Al/Au, may simply be made of ohmic/barrier/bonding metals (e.g., Cr/Ni/Au or Ti/Ni/Au), or may be a combination thereof. Hence, it should be understood that the electrodes 92 and 93 (see FIG. 11E) covers various types of electrode materials, structures and arrangements that are applied to the semiconductor light emitting device chips of FIGS. 1 to 38. The planarization layer (e.g., the step reducing layer) 76 may be similar to a liquid insulation layer 5 as shown in FIG. 21 (e.g., a thermosetting material such as OCA, OCR, polyimide, SU-8, arylene, epoxy, silicone, BCB, acrylate or SOG), may simply be made of the passivation layer (e.g., the non-conducting reflective film) 94A shown in FIG. 38, or may be a combination thereof. A portion of the adhesive layer 81 in the region where the three semiconductor light emitting device chips AA, BB and CC are not provided is removed to expose to the light transmitting substrate 80, as shown in FIG. 37B. As apparent from the drawings, wiring of micro-LEDs are carried out by deposition such as sputtering at the wafer level (that is, a plurality of semiconductor light emitting device chips AA, BB and CC are fixed or secured onto the light transmitting substrate 80), rather than by screen printing (that is, micro-LEDs are placed on pixels). In this manner, any error during the placement that may result in wrong postures and positions of the micro-LEDs can be avoided and hence, wiring can be done with a higher accuracy. These semiconductor light emitting device chips AA, BB and CC wired as described above can be transferred onto the external power supply 98 (see FIG. 25) as are. While only three semiconductor light emitting device chips AA, BB and CC are illustrated in FIG. 39, alternatively, there can be a different number of semiconductor light emitting device chips.

Lastly, as shown in FIG. 39E, the electrode posts 92PC and 93PA are arranged similar to the example in FIG. 28 and are supported with the encapsulant 99. The electrode posts 92PC and 93PA can be referred to as bonding pads in that they are bonded with the external power supply 98 (see FIG. 25).

Figure 40:
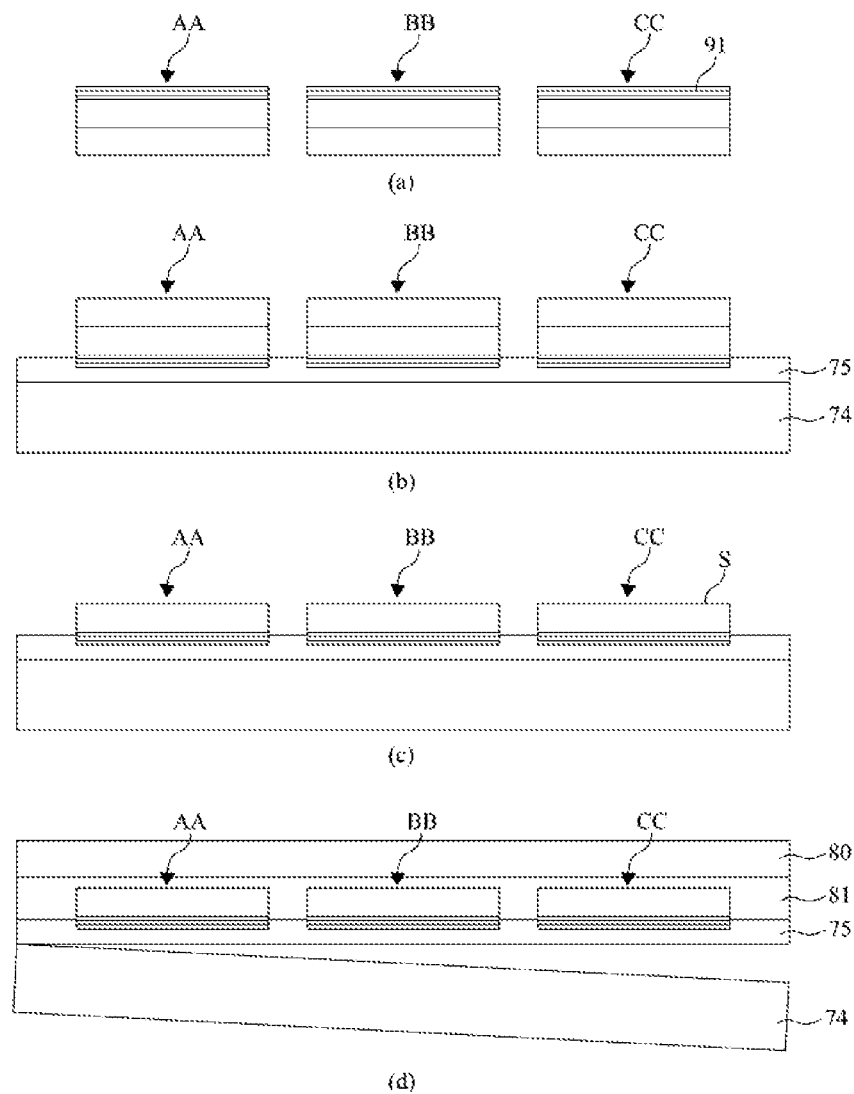
FIGS. 40 and 41 illustrate another method of manufacturing a semiconductor light emitting device according to the present disclosure.
Figure 41:
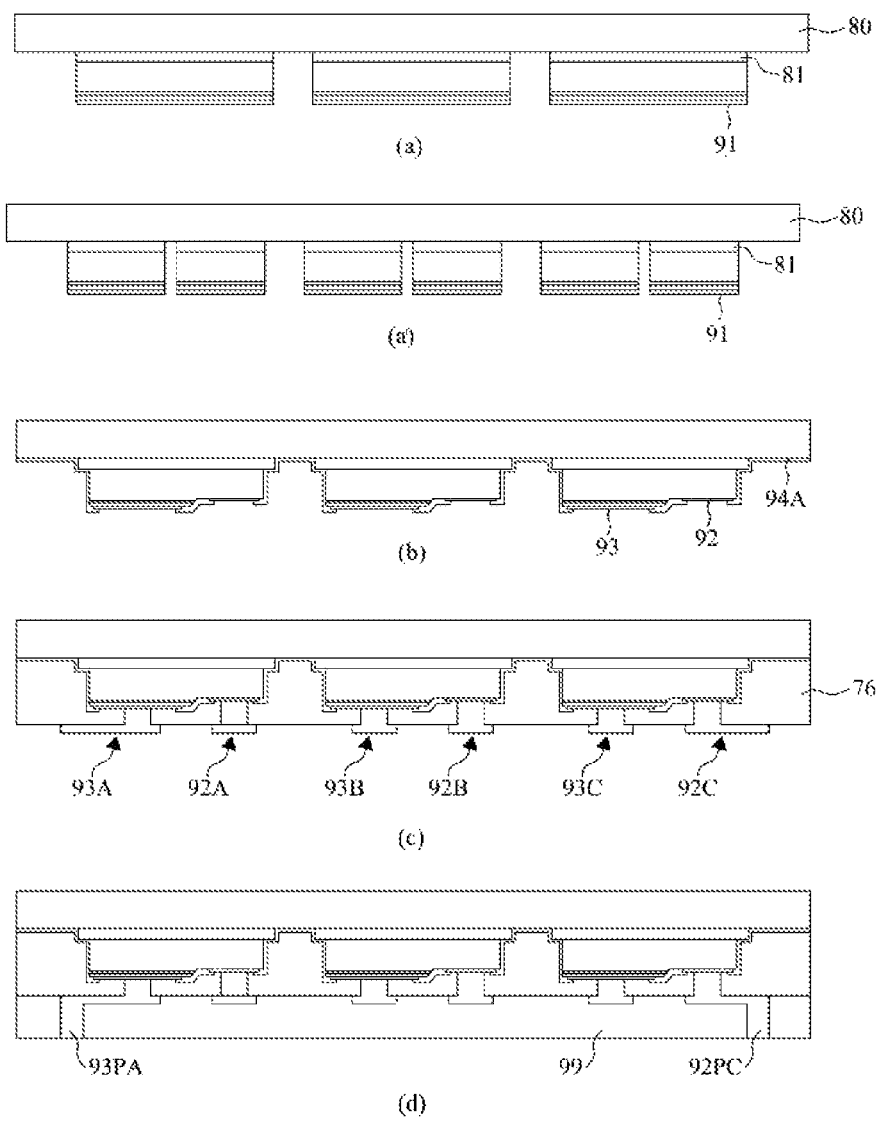

FIGS. 40 and 41 illustrate another method of manufacturing a semiconductor light emitting device according to the present disclosure. As shown in FIG. 40A, each of the three semiconductor light emitting device chips AA, BB and CC is provided with the light transmitting electrode 91 (e.g., ITO) only, and this is different from the one shown in FIG. 39.

The steps from FIGS. 40B to 41A are identical with the steps from FIGS. 39B to 39D. As shown in FIG. 41B, the mesa process (see FIG. 11B) for exposing the N-type semiconductor region is performed, followed by the formation of the electrodes 92 and 93 (see FIG. 11E) and the passivation layer 94A described in FIG. 39. The electrodes 92 and 93 (see FIG. 11E) and the passivation layer 94A may be formed in any order.

Next, in FIG. 41C, the first electrodes 92A, 92B and 92C and the second electrodes 93A, 93B and 93C are formed as wiring electrodes. If needed, the planarization layer (or the step reducing layer) 76 is formed prior to the first electrodes 92A, 92B and 92C and the second electrodes 93A, 93B and 93C.

Lastly, referring to FIG. 41D, the electrode posts 92PC and 93PA are formed as bonding pads and are supported with the encapsulant 99 as in FIG. 39E.

The method of FIGS. 40 and 41 has distinct features and advantages over the method illustrated in FIG. 39. For instance, only relatively large chips having high electrical and optical qualities are transferred at high speed and attached to the temporary substrate 74 provided with the adhesive layer 75. Then the respective substrates ST of the three semiconductor light emitting device chips AA, BB and CC are removed by laser ablation (see FIG. 41A). Photolithography is performed on the wafer level substrate (e.g., a circular or tetragonal sapphire interposer). This semiconductor chip fabrication process allows to have a degree of freedom in adjusting the dimensions of chips (e.g., three semiconductor light emitting device chips) and to locate and secure the chips in exact positions (identical with the positions of chips on a photolithography mask). Further, with redundancy, the yield can be improved as well. Rather than additionally transferring redundant chips of the semiconductor light emitting device that emit the same color light, the three semiconductor light emitting devices are etched and divided into at least two chips (e.g., in FIG. 41B), respectively, thereby facilitating the same color emissions and/or the connection of the three semiconductor light emitting chips in series, in parallel or in combination thereof.

Figure 42:
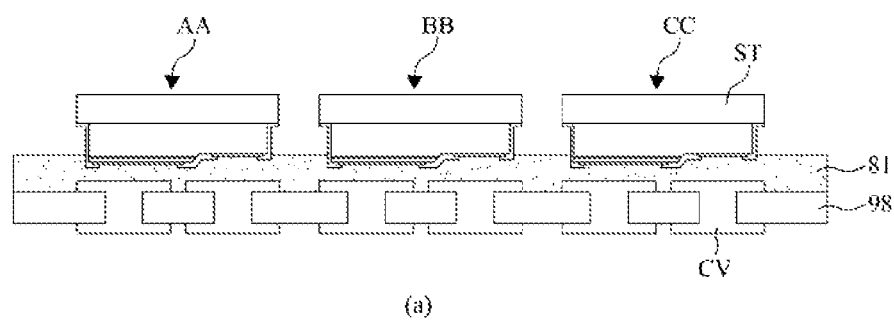
FIG. 42 illustrates another method of manufacturing a semiconductor light emitting device according to the present disclosure.
Figure 42:
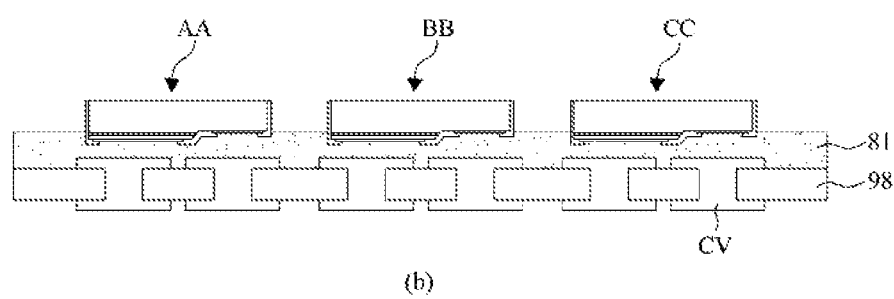

FIG. 42 illustrates another method of manufacturing a semiconductor light emitting device according to the present disclosure. In particular, this example shows a method of removing the respective substrates ST from those three semiconductor light emitting device chips AA, BB and CC being attached to the external power supply 98. The external power supply 98 is configured with a conductive part CV in a via hole and may comprise the same (or similar) material as the substrate ST (e.g., sapphire). This type of the external power supply 98 is disclosed in US Patent Application Publication No. US 2017-0317230. In an alternative, an ACF (Anisotropic Conductive Film) or a solder may be used as the adhesive layer. Further, the external power supply 98 in this example may be regarded a substrate ST.

Figure 43:
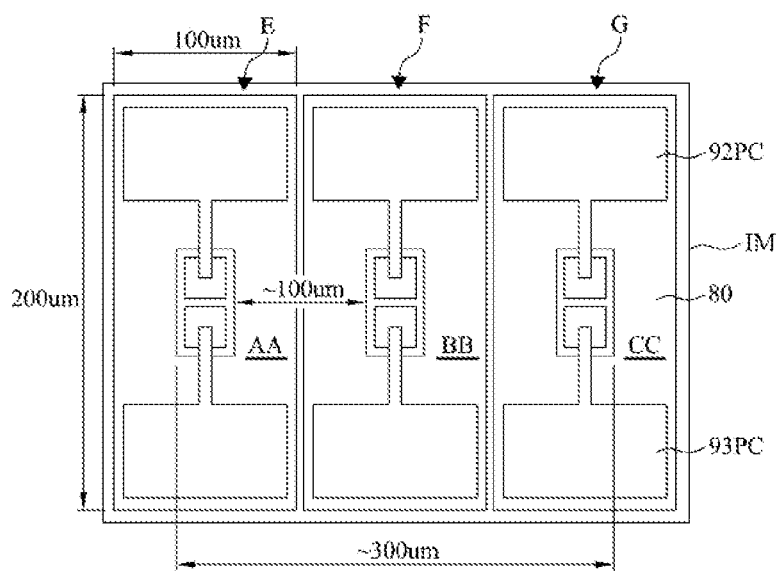
FIG. 43 illustrates an application of a semiconductor light emitting device according to the present disclosure.

FIG. 43 illustrates an application of a semiconductor light emitting device according to the present disclosure. Here, three semiconductor light emitting devices E, F and G received in one pixel (having dimensions of approximately 400 μm×400 μm). Moreover, each of the semiconductor light emitting device chips AA, BB and CC uses its own light transmitting substrate 80, as compared with the semiconductor light emitting device shown in FIG. 39 in which one light transmitting substrate is used for three semiconductor light emitting device chips AA, BB and CC. Moreover, each of the three semiconductor light emitting devices E, F and G may have the smallest allowable dimensions to be able to cut away their respective light transmitting substrates. Up to date, typical dimensions of a semiconductor light emitting device are 100 μm×200 μm with a thickness of 100 μm or less, but they are expected to become even smaller, e.g., 50 μm×100 μm in the future. If the three semiconductor light emitting device chips AA, BB and CC are smaller than the smallest allowable semiconductor light emitting device aforementioned to be able to cut away its light transmitting substrate (e.g., one side of a micro-LED is 50 μm or less), size restrictions imposed on the light transmitting substrate can be overcome. For example, while the actual light emitting device chip size is the same as a micro-LED, the light transmitting substrate and the bonding electrodes 92PC and 93PC can easily be sized and processed similar to a mini-LED, to implement a micro-LED product. At least this configuration is advantageous as it can reduce cross-talk effects between the three semiconductor light emitting devices E, F and G. Moreover, although not shown, these three semiconductor light emitting devices E, F and G can be combined into one pixel through the known light emitting device CSP process. Here, since the light transmitting substrate 80 is electrically insulating, it is also possible to form one pixel with chips being arranged in contact with each other or spaced from each other having white or black polymers (e.g., EMC, SMC or Black Matrix) filled in the space between chips. In the latter case, the height of the white or black polymers filled between chips should be at least equal to the thickness of the light transmitting substrate 80.

A p-side up flip chip may be used when at least one of the three semiconductor light emitting devices E, F and G has the configuration shown in FIGS. 24 and 35. Further, adhesion or bonding strength can be improved as well by using the first electrode post 92PC and the second electrode post 93PC, that is, by using bonding pads having a large area. When the growth substrate is used as the light transmitting substrate 80 as is, the adhesive layer 81 is omitted.

When at least one of the three semiconductor light emitting devices E, F and G has the configuration shown in FIG. 27 and the semiconductor light emitting device chips AA and BB are connected in series or in parallel (this can be obtained by connecting the first electrodes 92A and 93A and the second electrodes 92B and 93B in series or in parallel), one failure in one of the semiconductor light emitting device chips AA and BB is not going to stop the use of the display and no repair is necessary. Again, when the growth substrate is used as the light transmitting substrate 80 as is, the adhesive layer 81 is omitted When at least one of the three semiconductor light emitting devices E, F and G has the configuration shown in FIG. 31, electrical wiring under a pixel or electrical wiring of the entire display (e.g., the arrangement of source lines and data lines) can have more room or space in design. In addition to the thin film transistor 82, a non-emission device such as a Zener diode may be provided. Here again, when the growth substrate is used as the light transmitting substrate 80 as is, the adhesive layer 81 is omitted.

Further, with redundancy, the yield can be improved as well. Rather than additionally transferring redundant chips of the semiconductor light emitting device that emit the same color light, although not shown, the three semiconductor light emitting devices E, F and G are etched and divided into at least two chips, respectively, thereby facilitating the same color emissions and/or the connection of the three semiconductor light emitting chips in series, in parallel or in combination thereof.

Figure 44:
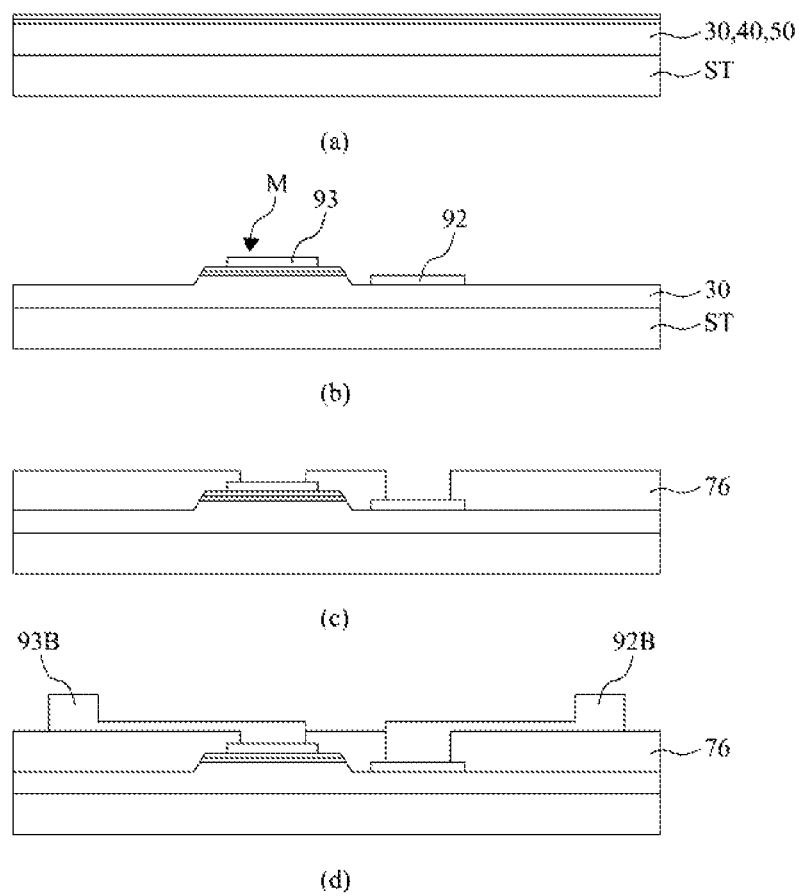
FIGS. 44 and 45 illustrate another application of a semiconductor light emitting device according to the present disclosure.
Figure 45:
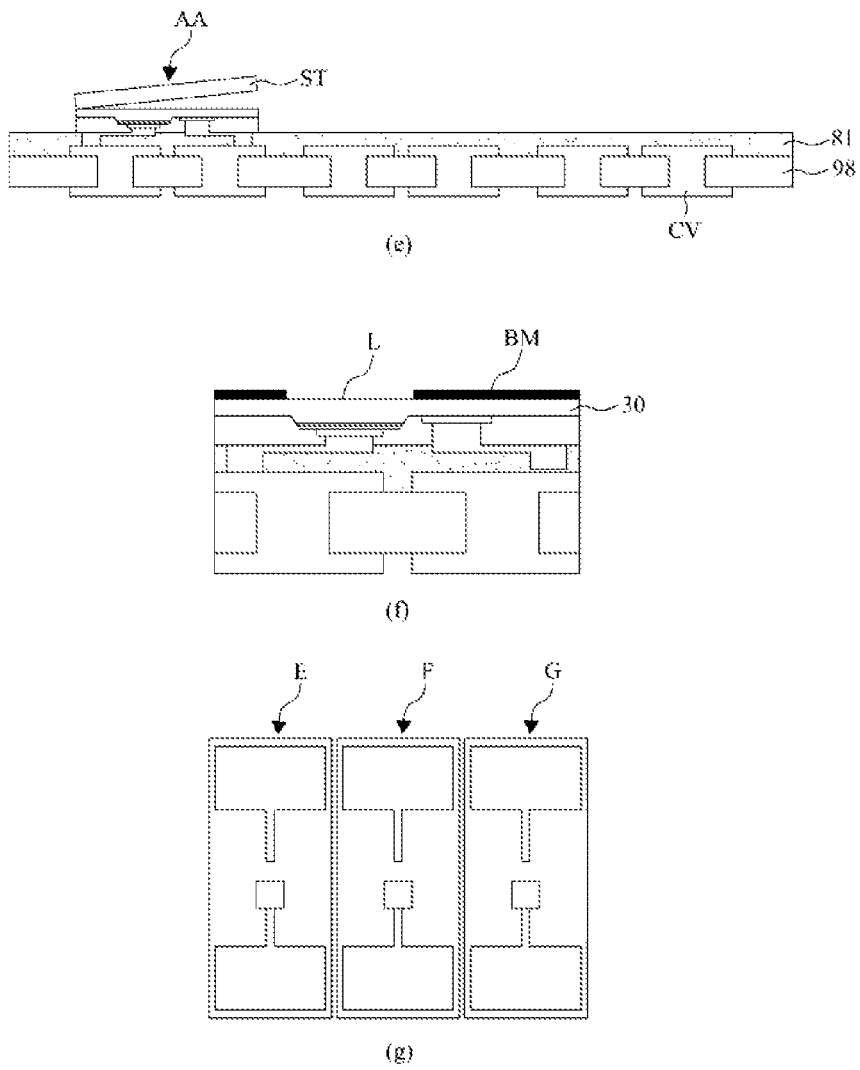

FIGS. 44 and 45 show another application of a semiconductor light emitting device according to the present disclosure. First, as shown in FIG. 44A, the semiconductor regions 30, 40 and 50 are provided on the substrate ST. Then the semiconductor regions 30, 40 and 50 are etched as shown in FIG. 44B, leaving a light emission part M of a mesa form having a suitable size for the application to a micro-LED. Here, the N-type semiconductor region 30 is also left. Subsequently, the first electrode 92 and the second electrode 93 are formed as ohmic electrodes. The planarization (or the step reducing layer) 76 is formed as shown in FIG. 44C, followed by a first electrode 92B and a second electrode 93B as shown in FIG. 44D as wiring electrodes and/or bonding pads, thereby obtaining a semiconductor light emitting device chip AA. Referring next to FIG. 45E, the semiconductor light emitting device chip AA is bonded to the external power supply 98 provided with the adhesive layer 81 (e.g., ACF) and the substrate ST is removed, similar to the method shown in FIG. 42. The external power supply 98 in this example may be regarded as a substrate ST. In FIG. 45F, the black matrix material BM is preferably provided to the N-type semiconductor region 30 except for an emission region L therein. Here, the black matrix material BM can function as a protective layer. Alternatively, a dielectric layer (SiO$_2$) or white silicone may also be used as a protective layer. As mentioned earlier in FIG. 35, after the substrate ST is removed, the N-type semiconductor region 30 may undergo surface texturing to have a rough surface S. Lastly, as shown in FIG. 45G, the semiconductor light emitting devices E, F and G are arranged in one pixel, similar to the method in FIG. 43. With this configuration, all the advantages of the structure shown in FIG. 43 are also available here. However, the cross-talk effects can be reduced through the structure of FIG. 45, rather than through the structure of FIG. 43 in which the cross-talk effects are induced because each of the semiconductor light emitting device chips AA, BB and CC uses its own light transmitting substrate 80.

Figure 46:
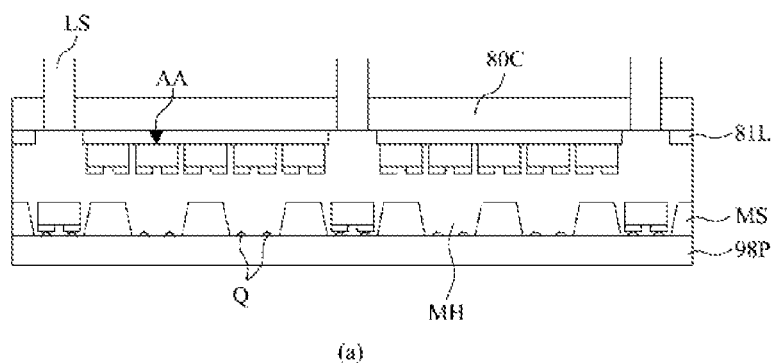
FIG. 46 illustrates a method for transferring semiconductor light emitting device chips and hence a semiconductor light emitting device according to the present disclosure.
Figure 46:
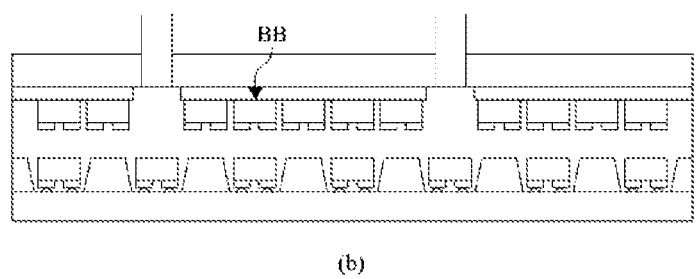
Figure 46:
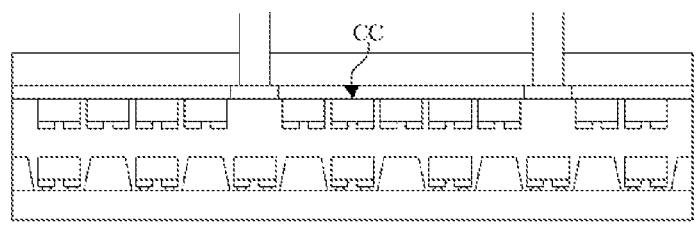

FIG. 46 illustrates a method for transferring semiconductor light emitting device chips and hence a semiconductor light emitting device according to the present disclosure. In particular, it illustrates how to transfer semiconductor light emitting device chips AA, BB and CC to a transfer receiving substrate 98P. While a wiring substrate is used here as the transfer receiving substrate 98P, the light transmitting substrate 80 shown in FIG. 28, the light transmitting substrate 80 shown in FIG. 31, or the light transmitting substrate 80 shown in FIG. 34 may also be used.

Referring to FIG. 46A, a sorted semiconductor light emitting device chip AA is attached to a carrier 80C having a laser reactive material 81L. The laser reactive material 81L serves to fix the semiconductor light emitting device chip AA to the carrier 80C and to detach the semiconductor light emitting device chip AA from the carrier 80C if the laser LS is irradiated. There are two processes that involve this laser reactive material 81L: the ablation process and the blistering process. In the ablation process, the laser reactive material 81L absorbs the laser having optical energy and is instantaneously converted into thermal energy such that it reaches a high temperature above the melting point of an absorbent material, causing the semiconductor light emitting device chip AA together with any remaining absorbent material to be detached. In the blistering process, when the laser is irradiated, the absorbent material has a thermochemical decomposition reaction with the laser and the resulting mechanical expansion through thermal expansion or gas explosion is exhorted, causing the semiconductor light emitting device chip AA to be detached from the absorbent material. The type of the laser reactive material 81L to be used is not particularly limited as long as a material can be subjected to the ablation process or the blistering process or a combination thereof. For the ablation process, the laser reactive material should be formed into a film directly on the carrier 80C, and such a material include, for example, monocrystalline Ground 3-5 nitride semiconductors including GaN, monocrystalline Group 2-6 oxide semiconductors including ZnO, transparent polycrystalline conducting oxides including ITO, polycrystalline conductive nitrides including TiN, amorphous dielectric including $SiO_2$, $SiN_x$, and so on, preferably in a multilayered structure. For the blistering process, the laser reactive material may be a PI-containing film, a triazene polymer layer as a photodecomposition polymer, or a particular metal thin film (e.g., Ti, Au, Pt, Cr, Al, Ag or Cu) that is applied to the carrier 80C. For the combination of the ablation and blistering processes, the laser reactive material may have various structures (e.g., an InGaN/PI film, an ITO/PI film, a ZnO/PI film, a triazene polymer layer/PI film or the like), but it is preferably selected in consideration of specific properties and yield of the semiconductor light emitting device chip AA and/or structure that is beneficial for simplifying the tasks, especially when the sorted semiconductor light emitting device chip AA needs to be transferred onto the transfer receiving substrate 98P or onto a transfer receiving substrate 98IP provided with an adhesive layer 81IP (which will be described later in FIG. 47). In the case of the carrier 80C, any light transmitting organic or inorganic material may be used without limitations. Examples of such an inorganic material include glass, sapphire, quartz and so on. Examples of such an organic material include silicon-based material, including PDMS.

Next, the carrier 80C is moved to the transfer receiving substrate 98P provided with a mask MS. The mask MS has an open form in which the pads Q (e.g., SACT6 or ESP) of the transfer receiving substrate 98P that is bonded to the semiconductor light emitting device chip AA are open. The mask MS includes a hole MH that is sized to match with the semiconductor light emitting device chip AA, having a tolerance set to reduce an error occurring in posture and position of the semiconductor light emitting device chip AA as it is detached under laser LS irradiation and transferred to the transfer receiving substrate 98P. Moreover, the mask MS can be manufactured in the same manner as a generally known stencil shadow mask, preferably using Invar metals suitable for ultraprecision machining. Alternatively, other types of materials and/or manufacturing processes can be used for the mask MS as well. For example, sapphire, glass or ceramic, which is suitable for making a via-hole similar in size to a mini- or micro-LED may be used.

With the semiconductor light emitting device chip AA to be detached being aligned with a hole MH, the laser LS is then irradiated and the semiconductor light emitting device chip AA is transferred from the carrier 80C to the transfer receiving substrate 98P. When the semiconductor light emitting device chip AA shown in FIG. 24 is used, the chip can be prevented from being damaged under laser irradiation because the light transmitting substrate 80 is located on the side where the laser is irradiated (see FIG. 24).

The transfer process is repeated on the semiconductor light emitting device chip BB, as shown in FIG. 46B.

Likewise, the transfer process is again repeated on the semiconductor light emitting device chip CC, as shown in FIG. 46C.

As such, it may take quite a lot of time to repeatedly transfer a plurality of semiconductor light emitting device chips (e.g., AA, BB and CC) that emit different lights, to different positions on the transfer receiving substrate 98P. For example, when the conventional pick & place process is employed for direct transfer of chips, it means that 3× (tens of thousands to hundreds of thousands) transfers must be done as the transfer receiving substrate 98P generally has tens of thousands to hundreds of thousands of pixels. Hence, it will require so many pick & place process tools, in addition to an extended period of time. In the present disclosure, however, although the conventional sorter is still used for sorting, high-speed laser beams are used for the transfer process. In other words, once the semiconductor light emitting device chips AA, BB and CC are sorted to the carrier 98C through a sorter or die bonder based on the conventional pick & place technique, they are transferred at high speed to the transfer receiving substate 98P by the laser LS. Moreover, the present disclosure utilizes a mask MS in order to prevent any error in the postures and positions of the semiconductor light emitting device chips AA, BB and CC caused by laser LS irradiation. Typically, with the conventional pick & place equipment, an average of 25 to 200K UPH (Unit Per Hour) is possible. However, with the laser irradiation, 100M UPH or more is possible, even after allowing for some differences.

The transfer process described above may be equally applicable to any semiconductor light emitting device (which comprises semiconductor light emitting device chips) according to the present disclosure.

Figure 47:
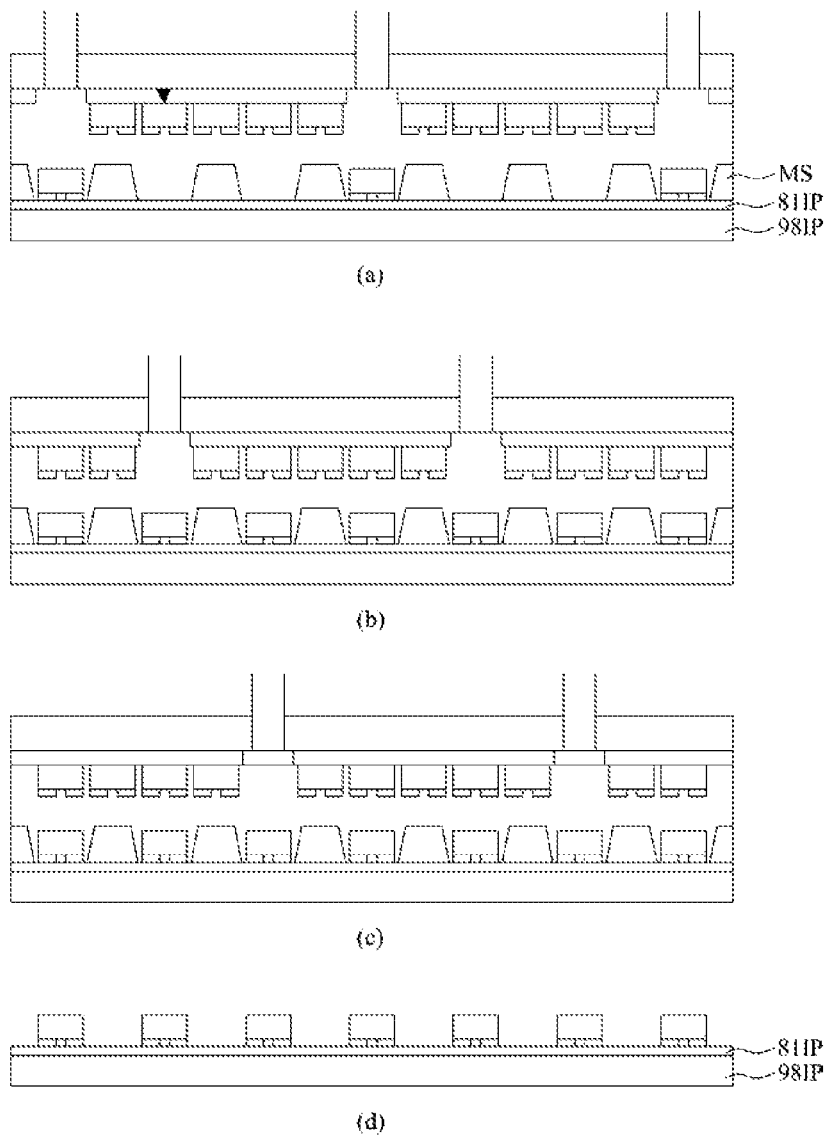
FIG. 47 illustrates another method for transferring semiconductor light emitting device chips and hence a semiconductor light emitting device according to the present disclosure.

FIG. 47 illustrates another method for transferring semiconductor light emitting device chips and hence a semiconductor light emitting device according to the present disclosure. The steps from FIGS. 47A to 47C are similar to the steps from FIGS. 46A to 46C, except that a transfer receiving substrate 98IP used in this example is provided with an adhesive layer 81IP, different from the transfer receiving substrate 98P. The transfer receiving substrate 98IP may have the same configuration as the light transmitting substrate 80 shown in FIG. 37 or may have the same configuration as the external power supply 98 shown in FIG. 42. If needed, a step for removing the mask MS can be added, as shown in FIG. 47C. The adhesive layer 81IP is basically sticky in nature. Examples of the adhesive layer may typically include silicone-based materials including PDMS, and depending on the usage or application, it can comprise a laser reactive material (e.g., the laser reactive material 81L mentioned in FIG. 46) or a foaming material that loses stickiness and rapidly expands at the same time by externally applied heat. For the external power supply 98, an ACF (Anisotropic Conductive Film) may be used. A stencil shadow mask discussed in FIG. 46 may also be applied, or a combination of the conventional photolithography process and the PR material may be used for patterning. The semiconductor light emitting device chips AA, BB and CC transferred to the transfer receiving substrate 98IP may be used as are (e.g., in the case of the external power supply 98), or may be directly transferred pixels, or may be transferred to another carrier or an interposer. Depending on the usage or application, electrodes of the semiconductor light emitting device chips AA, BB and CC may face different directions. Therefore, when the semiconductor light emitting device chips AA, BB and CC are transferred to different locations, the step shown in FIG. 47D is omitted such that displacement of the semiconductor light emitting device chips can be prevented, maintaining them in places during the re-transfer.

Referring back to FIGS. 39 and 41, when the adhesive layer 81 is made of an organic adhesive such as BCB, it might be optimal for chips that emit red light. However, the adhesive layer 81 made of BCB may be susceptible to deterioration or discoloration when used for chips that emit UV, blue or green light. For this reason, it is desirable that the adhesive layer 81 should include an inorganic adhesive as well. Among wafer bonding processes, 'adhesive bonding' refers to wafer bonding that uses an organic adhesive such as BCB, and 'DWB' (Direct Wafer Bonding) refers to wafer bonding that is performed directly using a material such as Si or $SiO_2$, without any intermediate materials. To make the DWB applicable, the surfaces involved in bonding should be clean, flat and smooth (see https://en.wikipedia.org/wiki/Direct_bonding). Further, $SiO_2$—$SiO_2$ DWB is described in detail in the paper "Oxide-Oxide Thermocompression Direct Bonding Technologies with Capillary Self-Assembly for Multichip-to-Wafer Heterogeneous 3D System Integration"; Micromachines. Oct. 10, 2016; 7(10).

Figure 48:
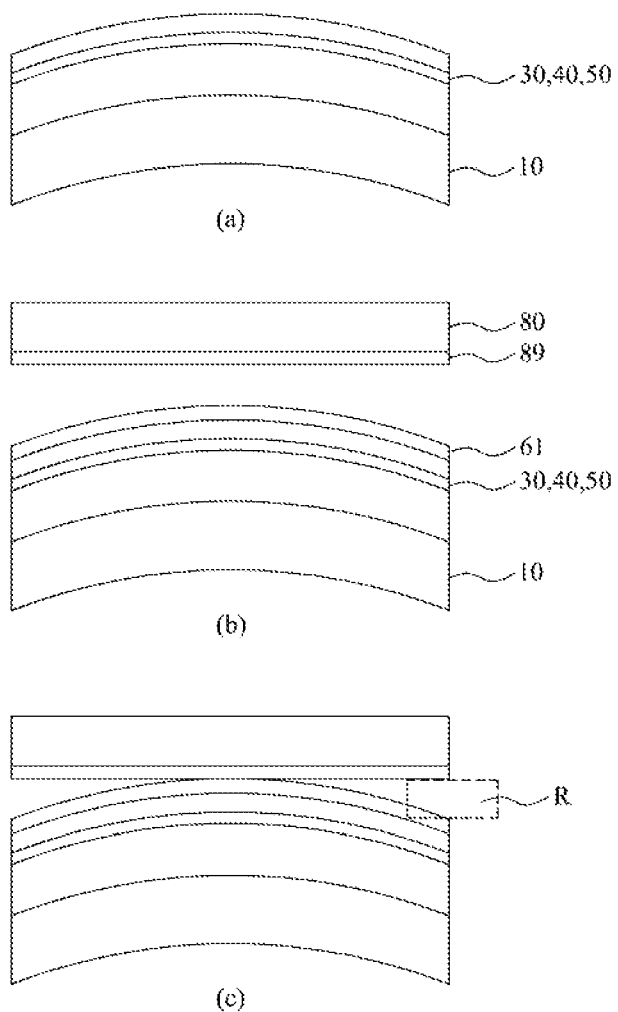
FIG. 48 illustrates a problem that might occur when the DWB is applied to a semiconductor light emitting device at the wafer level.

FIG. 48 illustrates a problem that might occur when the DWB is performed at the wafer level in a semiconductor light emitting device. As shown in FIG. 48A, a wafer that comprises a growth substrate of heterogeneous materials and semiconductor regions 30, 40 and 50 grown on the substrate is generally subject to warpage due to a difference in lattice constants and in coefficients of thermal expansion between them. For example, red emission wafers using the GaAs substrate have Center Bow of 150 to 250 μm, and blue emission wafers using the sapphire substrate have Center Bow of 30 to 100 μm. As shown in FIG. 48C, when $SiO_2$ 61 formed on the semiconductor regions 30, 40 and 50 and $SiO_2$ 89 formed on the light transmitting substrate 80 are bonded together by the DWB, edge areas R along the warped wafer are not properly bonded as shown in FIG. 48C.

Figure 49:
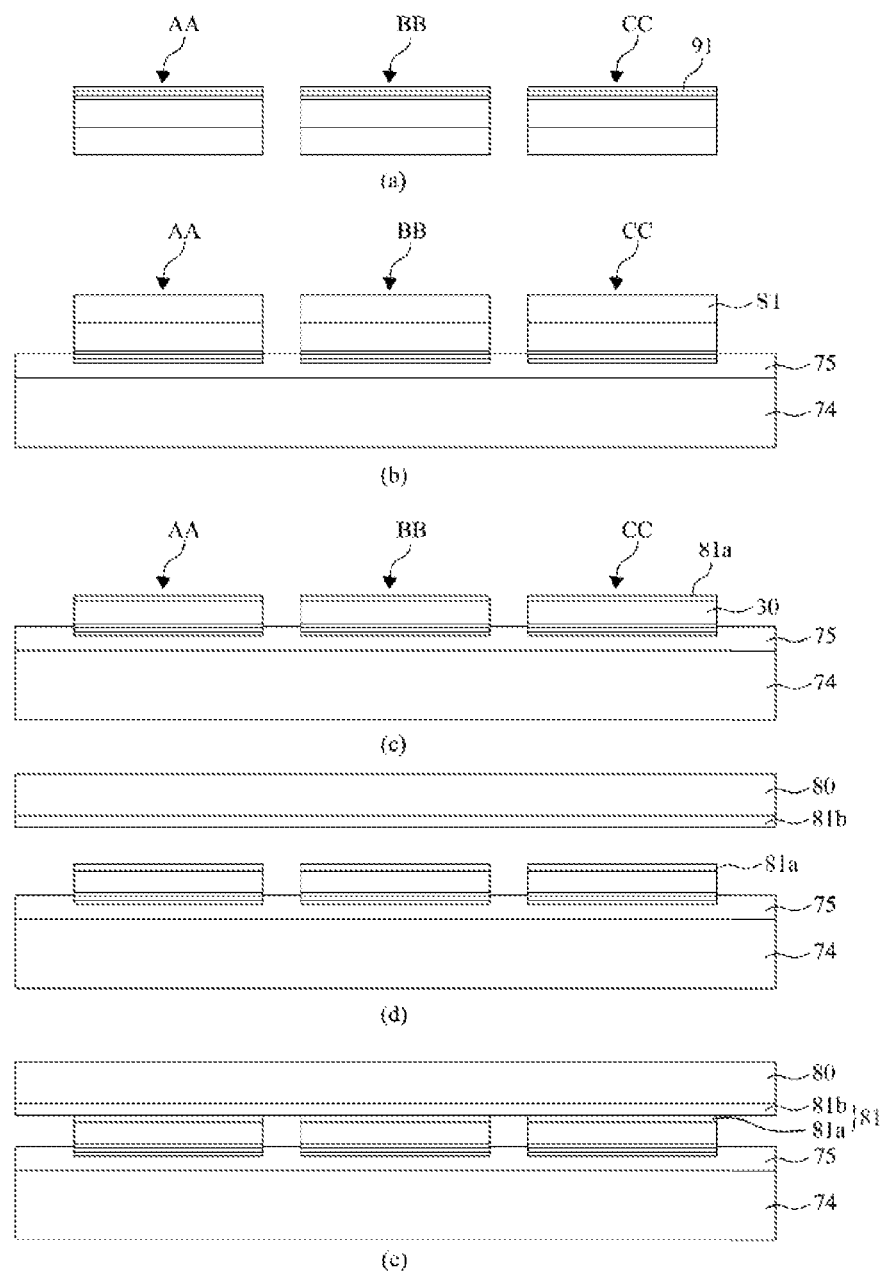
FIG. 49 illustrates another method of manufacturing a semiconductor light emitting device according to the present disclosure.

FIG. 49 illustrates another method of manufacturing a semiconductor light emitting device according to the present disclosure. The steps in FIGS. 49A and 49B are performed in the same manner as in FIGS. 40A and 40B. Then, as shown in FIG. 49C, the substrate ST is removed (preferably, the N-type semiconductor region 30 is made thinner), and the adhesive layer 81a made of $SiO_2$ is formed on the N-type semiconductor region 30 by PECVD for example. Other materials such as SOG may be used for the adhesive layer 81a. Additionally or alternatively, SOG can be applied on top of the $SiO_2$ that was already provided by PECVD. With its stickiness, SOG can be useful for initial bonding. The adhesive layer 81a can be formed not only on the semiconductor region as in FIG. 49C, but it can also be formed on another adhesive layer 75. The adhesive layer 81b made of $SiO_2$ is then formed on the light transmitting substrate 80 as shown in FIG. 49D. After that, preferably, plasma surface treatment, followed by the DWB using $H_2O$ can be performed (see FIG. 49E). The adhesive layer 81a together with the adhesive layer 81b constitute the adhesive layer 81. The subsequence steps are the same as those shown in FIGS. 40D and 41. For a clearer description, the semiconductor light emitting device chips AA, BB and CC shown in FIGS. 40A and 49A will now be referred to as semiconductor light emitting device dies, to distinguish them from the semiconductor light emitting device chips AA, BB and CC having electrodes as shown in FIG. 36A. For the semiconductor light emitting device dies, the growth substrate 10 or the light transmitting substrate 80 provided with the semiconductor regions 30, 40 and 50 may be sufficient for their performance, and thus, the light transmitting electrode 91 and/or the adhesive layer 81a are not necessarily required. With this configuration, the semiconductor light emitting device chip or the semiconductor light emitting device may have the adhesive layer 80 made of an inorganic adhesive. Additionally, the adhesive layer 81a may further include a ferromagnetic metal layer (not shown) made of, for example, a highly-magnetic metal such as Ni, Co, Fe or the like, which is particularly required when the transfer process is performed using magnetic and/or electromagnetic force. With this configuration, i.e. semiconductor light emitting device chips are transferred to the light transmitting substrate 80 at the semiconductor light emitting device die level, rather than at the wafer level, it is possible to prevent warpage of the substrate that usually occurs during the manufacture of semiconductor light emitting device chips or semiconductor light emitting devices provided with an inorganic adhesive at the wafer level as discussed previously in FIG. 48. Moreover, since each of the semiconductor light emitting device chips AA, BB and CC can be etched and divided into a plurality of chips as shown in FIG. 41A', a total number of the transfer processes to be done for the semiconductor light emitting device chips can be reduced and for the applications where very small chips are required, these chips can be transferred without any restrictions.

Figure 50:
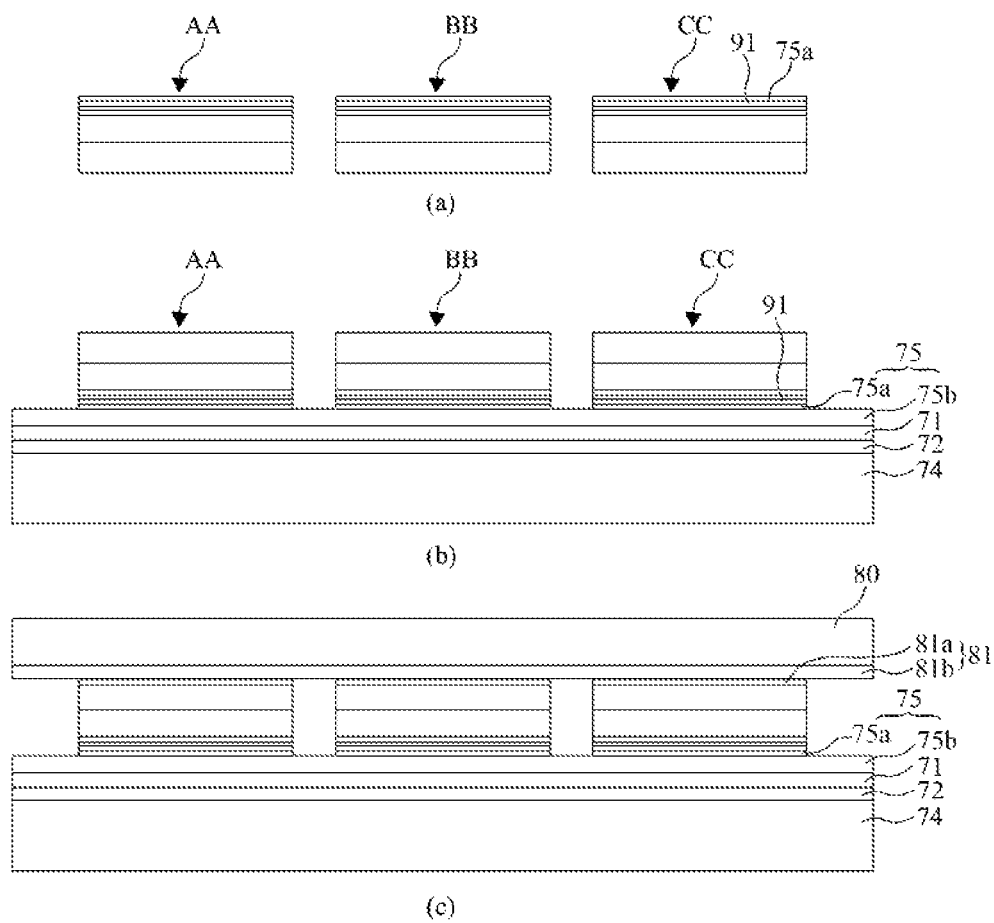
FIG. 50 illustrates another method of manufacturing a semiconductor light emitting device according to the present disclosure.

FIG. 50 illustrates another method of manufacturing a semiconductor light emitting device according to the present disclosure. Here, an adhesive layer 75a made of $SiO_2$ is formed on the light transmitting electrode 91 as shown in FIG. 50A and another adhesive layer 75b made of $SiO_2$ is also formed on the temporary substrate 74 as shown in FIG. 50B, so that they are combined together by the DWB to form the adhesive layer 75. For the removal of the temporary substrate 74 through laser ablation, the sacrificial layer 72 and the protective layer 71 as shown in FIG. 8 can be further provided between the adhesive layer 75b and the temporary substrate 74. Alternatively, the protective layer 71 can be optional. If present, the protective layer 71 may be made of the same material as the metal bonding layer 71 (see FIG. 8) but it still serves as a protective layer during the laser ablation process, rather than as an adhesive. Referring next to FIG. 50C, the steps illustrated in FIGS. 49D and 49E are also performed here and the temporary substrate 74 is removed by laser ablation. The subsequent steps after FIG. 49E are the same as those in other examples described above. With this configuration, mini- or micro-LEDs can be manufactured without using an organic adhesive.

Figure 51:
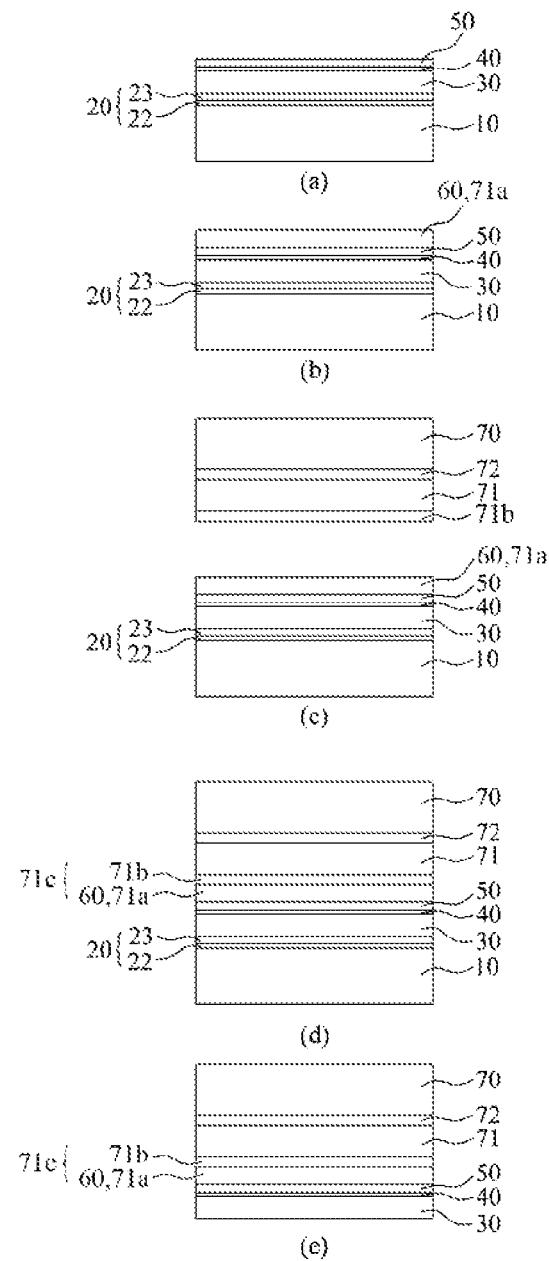
FIGS. 51 and 52 illustrate other methods of manufacturing a semiconductor light emitting device according to the present disclosure.
Figure 52:
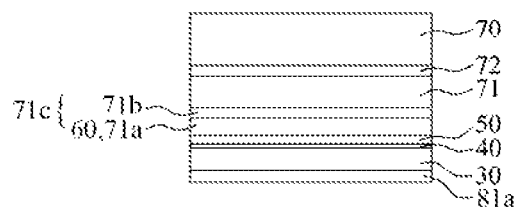
Figure 52:
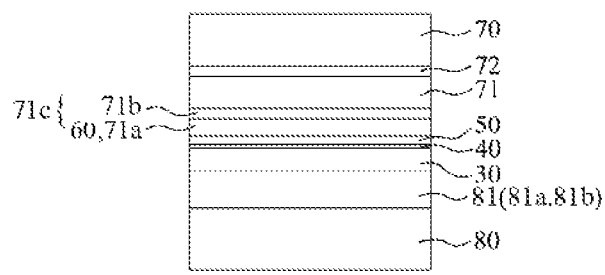
Figure 52:
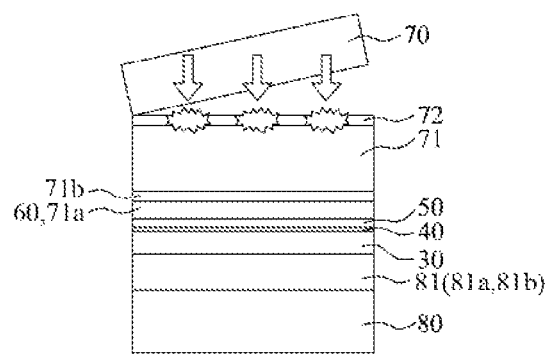

FIGS. 51 and 52 illustrate another method of manufacturing a semiconductor light emitting device according to the present disclosure. Referring first to FIG. 51A, the semiconductor regions 20, 30, 40 and 50 are formed on the growth substrate, similar to those shown in FIG. 8A. Next, an adhesive layer 71a is formed on the second semiconductor region 50 (P-type semiconductor region) as shown in FIG. 51B. Continuing to FIG. 51C, a sacrificial layer 72, a metal bonding layer (or a protective layer) 71, and an adhesive layer 71b are formed on the first light transmitting layer 70. While the method here is very similar to the one illustrated in FIG. 8, it uses adhesive bonding with an adhesive, in addition to the metal bonding layer 71 (see FIG. 8). The sacrificial layer 72 and the protective layer 71 can be omitted if the subsequent step for removing the first light transmitting substrate 70 does not involve the laser ablation process. To ensure process stability, a protective layer 60 may be provided to the second semiconductor region 50 (the P-type semiconductor region), similar to the step shown in FIG. 8B. On the contrary, the sacrificial layer 72 and the protective layer 71b are required if the first light transmitting substrate 70 is to be removed using LLO (Laser Lift Off). In this case, the adhesive layer 71b may only be made of the metal bonding layer 71 (see FIG. 8) or may be made of the protective layer 71 and an organic adhesive. If the removal of the first light transmitting substrate 70 involves CLO (Chemical Lift Off), the sacrificial layer 72 for LLO described above is not needed.

Referring next to FIG. 51D, the adhesive layer 71a and the adhesive layer 71b are subject to adhesive bonding to form an adhesive layer 71c. That is, rather than the DWB process discussed in FIG. 48, a viscous adhesive, a liquid adhesive (e.g., BCB) or metal bonding is used here such that the first light transmitting substrate 70 and the second semiconductor region 50 (the P-type semiconductor region) may be bonded together, without experiencing the issues indicated in the step of FIG. 48C. The growth substrate 10 is then removed as shown in FIG. 51E. In the case of a GaAs substrate, CLO with a chemical etching solution may be used. In the case of a sapphire substrate, LLO with laser beam energy may be used. Further, as discussed previously, warpage occurred when the growth substrate 10 and the semiconductor regions 30, 40 and 50 having different lattice constants and different coefficients of thermal expansion were bonded together. However, with the growth substrate 10 being removed, the warpage can be reduced, which is partly contributed by the adhesive layer 71c. Here, an adhesive layer 81a made of $SiO_2$ is formed on the first semiconductor region 30 (the N-type semiconductor region) and another adhesive layer 81b made of $SiO_2$ is formed on the second semiconductor region 80, as shown in FIG. 52A. These adhesive layers 81a and 81b are then bonded together by the DWB to form the adhesive layer 81, as shown in FIG. 52B. Lastly, referring to FIG. 52C, the first light transmitting substrate 70 is removed by laser ablation. As mentioned above, if the removal of the first light transmitting substrate 70 involves CLO, the sacrificial layer 72 and the metal bonding layer 71 may be omitted. Later, a wafer of the present disclosure may be prepared through the steps shown in FIG. 10 and hence, semiconductor light emitting device dies as shown in FIG. 40 may be manufactured from the wafer. Alternatively, semiconductor light emitting device chips may be manufactured through the steps shown in FIG. 11. Moreover, the light transmitting electrode 91 (see FIG. 40) may be formed in the second semiconductor region 50 (the P-type semiconductor region) prior to the steps shown in FIG. 11, or the light transmitting electrode 91 may be formed, e.g., in the step shown in FIG. 8A.

Figure 53:
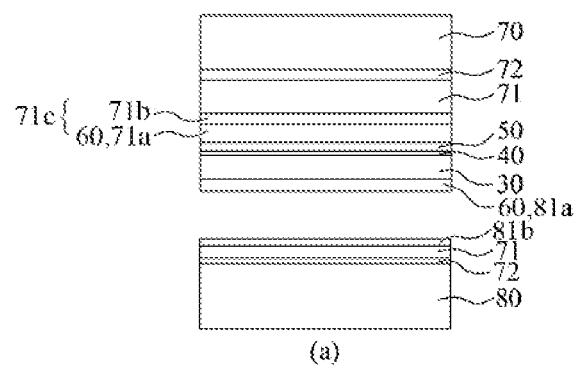
FIG. 53 illustrates another method of manufacturing a semiconductor light emitting device according to the present disclosure.
Figure 53:
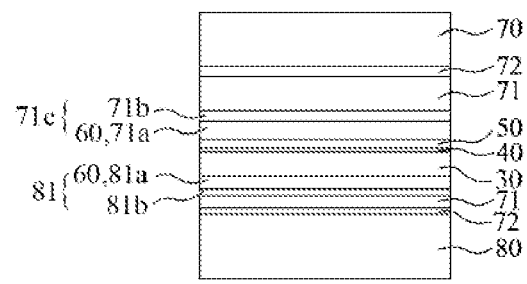
Figure 53:
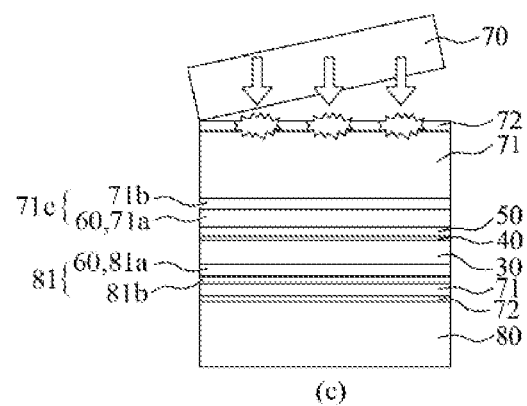

FIG. 53 illustrates another method of manufacturing a semiconductor light emitting device according to the present disclosure. Referring first to FIG. 53A, the structure applied in FIG. 51C is equally used for bonding the first semiconductor region 30 (the N-type semiconductor region) and the light transmitting substrate 80. The protective layer 60 or the adhesive layer 81a made of $SiO_2$ are provided on the first semiconductor region 30 (the N-type semiconductor region). The sacrificial layer 72, the protective layer 71 and the adhesive layer 81b made of $SiO_2$ are provided on the second light transmitting substrate 80. The steps shown in FIGS. 53B and 53C are the same as the steps shown in FIGS. 52B and 52C. This configuration allows to manufacture semiconductor light emitting dies, semiconductor light emitting device chips and hence a semiconductor light emitting device package, in which the second light transmitting substrate 80 can be removed by laser ablation.

Figure 54:
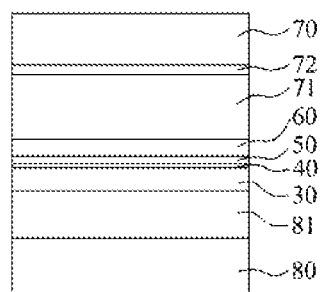
FIG. 54 illustrates another method of manufacturing a semiconductor light emitting device according to the present disclosure.
Figure 54:
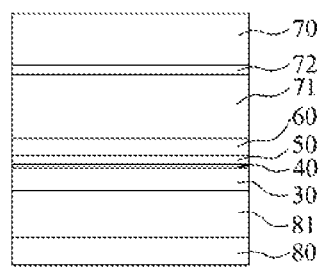
Figure 54:
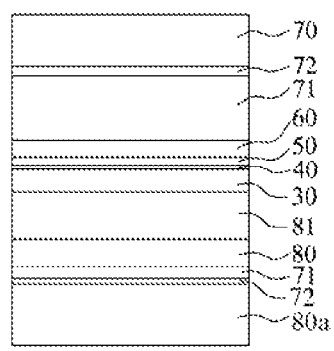

FIG. 54 illustrates another method of manufacturing a semiconductor light emitting device according to the present disclosure. FIG. 54A shows the configuration discussed above in FIG. 9B. The second light transmitting substrate 80 is polished to a lesser thickness of 30 μm to 100 μm as shown in FIG. 54B. Referring next to FIG. 54C, a third light transmitting substrate 80a (e.g., a sapphire substrate) is bonded to the second light transmitting substrate 80, through the metal bonding layer 71 with the sacrificial layer 72 being interposed therebetween. Alternatively, the metal bonding layer 71 may be formed on the second light transmitting substrate 80. The third light transmitting substrate 80a may be made of the same material as the second light transmitting substrate 80. The steps from FIGS. 9C to 10B are performed while the second light transmitting substrate 80 is being supported by the third light transmitting substrate 80a, and then the third light transmitting substrate 80a is separated from the second light transmitting substrate 80. With this process, the second light transmitting substrate 80 can have a less thickness, and thus the size of a semiconductor light emitting device die or chip can be minimized in the singulation process from the wafer. In general, when the light transmitting substrate 80 is thick, it is not easy to obtain individual dies or chips and particularly micro-LEDs out of the wafer. According to the present disclosure, however, the steps up to FIG. 10B can be performed in a stable manner as the second light transmitting substrate 80 is made thinner while the first light transmitting substrate 70 is still being available, and the first light transmitting substrate 70 is removed while the third light transmitting substrate 80a is provided. This is equally applicable to the configurations shown in FIGS. 52B and 53B. That is, a metal bonding material or an organic adhesive (adhesive bonding) may be employed for bonding to the first light transmitting substrate 70; an organic adhesive (adhesive bonding) or DWB may be employed for bonding to the second light transmitting substrate 80; and adhesive bonding, a metal bonding material or DWB may be employed for bonding to the third light transmitting substrate 80a. It should be noted that if DWB has been employed for bonding to the second light transmitting substrate 80, adhesive bonding is preferably employed for bonding to the first light transmitting substrate 70.

The following summarizes the examples described above, in connection with the growth substrate (the sapphire substrate or the GaAs substrate) as well as other heterogeneous growth substrates (e.g., the Si substrate).

Table 1 outlines the examples of FIGS. 8, 9, 11 and 23, where the Si substrate is applied.

TABLE 1

| Growth substrate 10 | Sapphire substrate | GaAs substrate | Si substrate |
|---|---|---|---|
| Semiconductor regions 30, 40 and 50 | AlGaInN-based semiconductor | AlGaInP(As)-based semiconductor | AlGaInN-based semiconductor |
| Protective layer 60 | SiO$_2$, etc. | SiO$_2$, etc. | SiO$_2$, etc. |
| First light transmitting substrate 70 | Sapphire substrate, etc. | Sapphire substrate, etc. | Sapphire substrate, etc. |
| Metal bonding layer 71 | AuSn, etc. | AuSn, etc. | AuSn, etc. |
| Sacrificial layer 72 | Oxides, Nitrides, etc. | Oxides, Nitrides, etc. | Oxides, Nitrides, etc. |
| Removal of growth substrate 10 | LLO (laser ablation) | LLO (laser ablation) | LLO (laser ablation) |
| Second light transmitting substrate 80 | Sapphire substrate, etc. | Sapphire substrate, etc. | Sapphire substrate, etc. |
| Adhesive layer 81 | Light transmitting organic, inorganic adhesive | Light transmitting organic, inorganic adhesive | Light transmitting organic, inorganic adhesive |
| Removal of first light transmitting substrate 70 | LLO | LLO | LLO |

Just like a sapphire substrate, a Si substrate may also be used as the growth substrate 10 of a semiconductor light emitting device that emits UV, blue or green light. Likewise, the processes used for the sapphire substrate can be equally applied to the Si substate, except that the Si substrate used as the growth substrate 10 is removed by a sequence of mechanical polishing and wet etching, or simultaneous mechanical polishing and wet etching, followed by the CMP (Chemical Mechanical Polishing) process to finish. As the growth substrate 10 is removed by the CMP process, a sacrificial layer required for the LLO process or a sacrificial layer required for the CLO may be omitted for the growth of the semiconductor regions 20, 30, 40 and 50. This is because, in the LLO and CLO processes, a sacrificial layer is typically needed for separation of the growth substrate 10 and the first light transmitting substrate 70 during the growth of the semiconductor regions 20, 30, 40 and 50 or during the attachment of the first light transmitting substrate 70. However, the CMP process does not require a separate sacrificial layer. In particular, if a GaAs growth substrate for a semiconductor light emitting device that emits red light is to be removed and separated by the CLO process, it is preferable to use an AlAs material layer as the sacrificial layer. In contrast, if the GaAs growth substrate is to be removed by the CMP process, it is preferable to insert a GaInP material layer as an ESL (Etching Stop Layer) in order to protect the semiconductor regions 20, 30, 40 and 50 during the CMP process. In general, the CMP process can be regarded as a type of the CLO process. Hence, in the following description, it should be understood that the CLO process comprises the CMP process. Table 2 outlines the examples of FIGS. 36 to 38, where the Si substrate is applied.

TABLE 2

| Growth substrate 10 | Sapphire substrate | GaAs substrate | Si substrate |
|---|---|---|---|
| Semiconductor light emitting device chips AA, BB and CC | UV, Blue, Green | Red | UV, Blue, Green |
| Substrate ST | Growth substrate, Light transmitting substrate | Growth substrate | Growth substrate |
| Temporary substrate 73 | PDMS stamp, etc. | PDMS stamp, etc. | PDMS stamp, etc. |
| Removal of substrate ST | LLO | CLO | CLO |
| Light transmitting substrate 80 | Sapphire substrate, etc. | Sapphire substrate, etc. | Sapphire substrate, etc. |
| Adhesive layer 81 | Light transmitting organic, inorganic adhesive | Light transmitting organic, inorganic adhesive | Light transmitting organic, inorganic adhesive |
| Removal of temporary substrate 73 | PDMS stamp separation | PDMS stamp separation | PDMS stamp separation |

As discussed in Table 1, the processes for the sapphire substrate can be equally applied here, except for the removal of the substrate ST (e.g., the light transmitting substrate 80, the growth substrate 1 and 10). Table 3 below outlines the examples of FIGS. 3 and 39, where the Si substrate is applied.

TABLE 3

| Growth substrate 10 | Sapphire substrate | GaAs substrate | Si substrate |
|---|---|---|---|
| Semiconductor light emitting device chips AA, BB and CC | UV, Blue, Green | Red | UV, Blue, Green |
| Substrate ST | Growth substrate, Light transmitting substrate | Light transmitting substrate | Light transmitting substrate |

TABLE 3-continued

| Growth substrate 10 | Sapphire substrate | GaAs substrate | Si substrate |
| --- | --- | --- | --- |
| Temporary substrate 74 | Sapphire substrate, etc. | Sapphire substrate, etc. | Sapphire substrate, etc. |
| Removal of substrate ST | LLO | LLO | LLO |
| Light transmitting substrate 80 | Sapphire substrate, etc. | Sapphire substrate, etc. | Sapphire substrate, etc. |
| Adhesive layer 81 | Light transmitting organic, inorganic adhesive | Light transmitting organic, inorganic adhesive | Light transmitting organic, inorganic adhesive |
| Removal of temporary substrate 74 | Appropriate technique | Appropriate technique | Appropriate technique |

Here, unlike the examples in Table 2, the LLO process is employed to remove the substrate ST from each of the semiconductor light emitting device chips AA, BB and CC which are grown on a sapphire, GaAs or Si substrate as the growth substrate. When a light transmitting substrate such as a sapphire substrate is used as the growth substrate 10 and then as the substrate ST as is, a sacrificial layer may be introduced during the growth of the semiconductor regions 20, 30, 40 and 50. However, when the growth substrate 10 is not a light transmitting substrate or when the (second) light transmitting substrate 80 is used as the substrate ST after the growth substrate is removed, the metal bonding layer 71 and the sacrificial layer 72 may be provided between the light transmitting substrate 80 and the semiconductor regions 30, 40 and 50 as shown in FIGS. 53 and 54, which allows to employ the LLO process for the removal of the substrate ST. Further, when the substrate ST is a non-light transmitting substrate (e.g., a GaAs substrate or a Si substrate), the substrate ST can be removed by the CLO process. To be brief, if the semiconductor light emitting device chips AA, BB and CC emit lights of blue, green and red in order, their substrates ST may be removed by various techniques, for example, LLO-LLO-LLO, LLO-LLO-CLO, CLO-CLO-CLO, CLO-CLO-LLO, etc. Table 4 below outlines the examples of FIGS. 40 and 41, where the Si substrate is applied.

dies that emit UV, blue or green light are grown on a sapphire growth substrate 10 this substrate is then used as the substrate ST as is, or a sapphire light transmitting substrate 80 may undergo the bonding process twice to be used as the substrate ST which is later removed by the LLO process. In an alternative, after semiconductor light emitting device chips or dies that emit UV, blue or green light are grown on a Si growth substrate 10 this substrate is then used as the substrate ST as is, or a sapphire light transmitting substrate 80 may undergo the bonding process twice to be used as the substrate ST. Here, the Si substrate ST may be removed by the CLO process, while the sapphire substrate ST may be removed by the LLO process. In another alternative, after semiconductor light emitting device chips or dies that emit red light are grown on a GaAs growth substrate 10 this substrate is then sued as the substrate ST as is, or a sapphire light transmitting substrate 80 may undergo the bonding process twice to be used as the substrate ST. Here, the GaAs substrate ST may be removed by the CLO process, while sapphire substrate ST may be removed by the LLO process. The substrate ST may be a growth substrate, or a support substrate obtained by bonding. While, in the above description, the sapphire or Si substrate has been illustrated for the growth of semiconductor light emitting device chips or dies that emit UV, blue or green light, and the GaAs substrate has been illustrated for the growth of semi-

TABLE 4

| Growth substrate 10 | Sapphire substrate | GaAs substrate | Si substrate |
| --- | --- | --- | --- |
| Semiconductor light emitting device dies AA, BB and CC | UV, Blue, Green | Red | UV, Blue, Green |
| Light transmitting electrode 91 | ITO, etc. | ITO, etc. | ITO, etc. |
| Substrate ST | Growth substrate, Light transmitting substrate | Light transmitting substrate | Light transmitting substrate |
| Temporary substrate 74 | Sapphire substrate, etc. | Sapphire substrate, etc. | Sapphire substrate, etc. |
| Adhesive layer 75 | Light transmitting organic, inorganic adhesive | Light transmitting organic, inorganic adhesive | Light transmitting organic, inorganic adhesive |
| Removal of substrate ST | LLO | LLO | LLO |
| Light transmitting substrate 80 | Sapphire substrate, etc. | Sapphire substrate, etc. | Sapphire substrate, etc. |
| Adhesive layer 81 | Light transmitting organic, inorganic adhesive | Light transmitting organic, inorganic adhesive | Light transmitting organic, inorganic adhesive |
| Removal of temporary substrate 74 | Appropriate technique | Appropriate technique | Appropriate technique |

The processes of the examples in Table 3 can be equally applied here. It is also possible to remove a sapphire substrate ST by the LLO process, and to remove a GaAs substrate ST and a Si substrate ST by the CLO process. In particular, after semiconductor light emitting device chips or conductor light emitting device chips or dies that emit red light, it would be apparent to those skilled in the art that the present disclosure can be applicable to any growth substrate and any support substrate that are currently available and that may be developed in the future. In addition, while it has been mentioned that the bonding process of the support substrate is performed twice preferably with respect to p-side up chips or dies, it would be apparatus to those skilled in the art that the bonding process can be performed, for example, at the frequency of even numbers (e.g., 4 times, 6 times, etc.) as well as at the frequency of odd numbers (e.g., 1 time, 3 times, 5 times, etc.). Moreover, even when the substrate ST is made of a light transmitting material, a sacrificial layer suitable for the CLO process may be introduced into the epitaxial growth process or the chip process (the wafer bonding process) such that the CLO process can sill be carried out. Table 5 below outlines the example of FIG. 49, where the Si substrate is applied.

TABLE 5

| Growth substrate 10 | Sapphire substrate | GaAs substrate | Si substrate |
|---|---|---|---|
| Semiconductor light emitting device dies AA, BB and CC | UV, Blue, Green | Red | UV, Blue, Green |
| Light transmitting electrode 91 | ITO, etc. | ITO, etc. | ITO, etc. |
| Substrate ST | Growth substrate, Light transmitting substrate | Light transmitting substrate | Light transmitting substrate |
| Temporary substrate 74 | Sapphire substrate, etc. | Sapphire substrate, etc. | Sapphire substrate, etc. |
| Adhesive layer 75 | Light transmitting organic, inorganic adhesive | Light transmitting organic, inorganic adhesive | Light transmitting organic, inorganic adhesive |
| Removal of substrate ST | LLO | LLO | LLO |
| Light transmitting substrate 80 | Sapphire substrate, etc. | Sapphire substrate, etc. | Sapphire substrate, etc. |
| Adhesive layer 81 | DWB | DWB | DWB |
| Removal of temporary substrate 74 | Appropriate technique | Appropriate technique | Appropriate technique |

The processes of the examples in Table 4 can be equally applied here, except that the adhesive layer 81 is made of a light transmitting inorganic adhesive such as $SiO_2$ or SOG through DWB. Table 6 below outlines the example of FIG. 50, where the Si substrate is applied.

TABLE 6

| Growth substrate 10 | Sapphire substrate | GaAs substrate | Si substrate |
|---|---|---|---|
| Semiconductor light emitting device dies AA, BB and CC | UV, Blue, Green | Red | UV, Blue, Green |
| Light transmitting electrode 91 | ITO, etc. | ITO, etc. | ITO, etc. |
| Substrate ST | Growth substrate, Light transmitting substrate | Light transmitting substrate | Light transmitting substrate |
| Temporary substrate 74 | Sapphire substrate, etc. | Sapphire substrate, etc. | Sapphire substrate, etc. |
| Adhesive layer 75 | DWB | DWB | DWB |
| Protective or Metal bonding layer 71 | AuSn, etc. | AuSn, etc. | AuSn, etc. |
| Sacrificial layer 72 | Oxides, Nitrides, etc. | Oxides, Nitrides, etc. | Oxides, Nitrides, etc. |
| Removal of substrate ST | LLO | LLO | LLO |
| Light transmitting substrate 80 | Sapphire substrate, etc. | Sapphire substrate, etc. | Sapphire substrate, etc. |
| Adhesive layer 81 | DWB | DWB | DWB |
| Removal of temporary substrate 74 | LLO | LLO | LLO |

The processes of the example in Table 5 can be equally applied here, except that the temporary substrate 74 and the semiconductor light emitting device dies AA, BB and CC are bonded together by DWB, and the protective or metal bonding layer 71 are introduced for the removal of the temporary substrate 74 by the LLO process. Table 7 below outlines the examples of FIGS. 51 to 52 where the Si substrate is applied.

TABLE 7

| Growth substrate 10 | Sapphire substrate | GaAs substrate | Si substrate |
|---|---|---|---|
| Semiconductor regions 30, 40 and 50 | AlGaInN-based semiconductor | AlGaInP(As)-based semiconductor | AlGaInN-based semiconductor |
| Protective layer 60 | $SiO_2$, etc. | $SiO_2$, etc. | $SiO_2$, etc. |
| First light transmitting substrate 70 | Sapphire substrate, etc. | Sapphire substrate, etc. | Sapphire substrate, etc. |
| Adhesive layer 71c | Adhesive bonding | Adhesive bonding | Adhesive bonding |
| Removal of growth substrate 10 | LLO | CLO | CLO (CMP) |
| Second light transmitting substrate 80 | Sapphire substrate, etc. | Sapphire substrate, etc. | Sapphire substrate, etc. |
| Adhesive layer 81 | DWB | DWB | DWB |
| Removal of first light transmitting substrate 70 | LLO, CLO | LLO, CLO | LLO, CLO |

These examples are similar to those in Table 1, except that DWB is employed to the adhesive layer 81 and to this end, adhesive bonding is employed to the adhesive layer 71c. The CLO process can be employed for the removal of the sapphire growth substrate 10. When the adhesive layer 81 that has been adhesively bonded is to be removed by the CLO process, a non-light transmitting substrate may be used, rather than the first light transmitting substrate 70. Table 8 below outlines the example of FIG. 53 where the Si substrate is applied.

TABLE 8

| Growth substrate 10 | Sapphire substrate | GaAs substrate | Si substrate |
|---|---|---|---|
| Semiconductor regions 30, 40 and 50 | AlGaInN-based semiconductor | AlGaInP(As)-based semiconductor | AlGaInN-based semiconductor |
| Protective layer 60 | $SiO_2$, etc. | $SiO_2$, etc. | $SiO_2$, etc. |
| First light transmitting substrate 70 | Sapphire substrate, etc. | Sapphire substrate, etc. | Sapphire substrate, etc. |
| Adhesive layer 71c | Adhesive bonding | Adhesive bonding | Adhesive bonding |
| Removal of growth substrate 10 | LLO | CLO | CLO (CMP) |
| Second light transmitting substrate 80 | Sapphire substrate, etc. | Sapphire substrate, etc. | Sapphire substrate, etc. |
| Adhesive layer 81 | DWB | DWB | DWB |
| Protective or metal bonding layer 71 | AuSn etc. | AuSn etc. | AuSn etc. |
| Sacrificial layer 72 | Oxides, Nitrides, etc. | Oxides, Nitrides, etc. | Oxides, Nitrides, etc. |
| Removal of first light transmitting substrate 70 | LLO, CLO | LLO, CLO | LLO, CLO |

The processes of the examples in Table 7 can be equally applied here, except that the metal bonding layer 71 and the sacrificial layer 72 are introduced between the second light transmitting substrate 80a and the adhesive layer 81. Referring to the example in FIGS. 40 and 41, for the removal of the respective substrates ST for the semiconductor light emitting device dies AA, BB, and CC, a light transmitting substrate ST and a sacrificial layer 72 are required if the LLO process is to be employed, while a sacrificial layer for CLO is required if the CLO process is to be employed.

For the steps from FIGS. 40C to 41C, the following should be taken into account, based on the combination of the respective substrates ST of the semiconductor light emitting device dies AA, BB and CC. It is assumed that the semiconductor light emitting device die CC emits red light.

(1) Sapphire Growth Substrate (Blue)/Sapphire Growth Substrate (Green)/GaAs Growth Substate (Red); LLO-LLO-CLO Although either the LLO process or the CLO process can be performed first, since material stability should be considered for a solution that is used to remove the GaAs growth substrate, it is desired that the CLO process precedes the LLO process.

A die that involves none of the LLO and CLO processes is coated with a protective process mask layer (e.g., a photoresistor, an oxide, a metal layer, etc.) and hence may be protected from damages caused by a corresponding process. Moreover, this protective process mask layer (e.g., a photoresistor, an oxide, a metal layer, etc.) can also serve to protect the dies AA, BB and CC during the removal of the temporary substrate 74 and the adhesive layer 75.

(2) Sapphire Growth Substrate (Blue)/Sapphire Growth Substrate (Green)/Sapphire Light Transmitting Substrate (Red) or Sapphire Light Transmitting Substrate (Blue)/Sapphire Light Transmitting Substrate (Green)/Sapphire Light Transmitting Substrate (Red); LLO-LLO-LLO Since each of the semiconductor light emitting device dies AA, BB and CC has a light transmitting substrate, a sacrificial layer for LLO may comprise a variety of materials (e.g., a Group 3 nitride, a Group 2 oxide, ITO, $SiO_2$, etc.) so that, as compared with (1) described above, the processes can be performed while reducing damage on the light emitting device dies AA, BB and CC.

(3) Si Growth Substrate (Blue)/Si Growth Substrate (Green)/GaAs Growth Substrate (Red); CLO-CLO-CLO A HF-containing solution is used for removing the oxides ($SiO_2$, $Ga_2O_3$) formed on the surface of the Si growth substrate (blue and green) and on the surface of the GaAs growth substrate (red). Once the oxides are removed from the surfaces, the Si growth substrate and the GaAs growth substrate can be equally or selectively etched/removed (the CLO process), using a solution for wet etching and sulfuric acid peroxide ($H_2SO_4+H_2O_2$) or ammonia peroxide ($NH_4OH+H_2SO_2$). Alternatively, a mechanical polishing process (the CMP process) can be performed prior to the removal of the oxides ($SiO_2$, $Ga_2O_3$) from the surfaces.

(4) Si Growth Substrate (Blue)/Si Growth Substrate (Green)/Sapphire Light Transmitting Substrate (Red); CLO-CLO-LLO First, a semiconductor light emitting device dies that emits blue or green light is attached to the temporary substrate, and the Si growth substrate is removed by the CLO process (the CMP process). A semiconductor light emitting device die that emits red light is then attached and the sapphire light transmitting substrate is removed by the LLO process.

Figure 55:
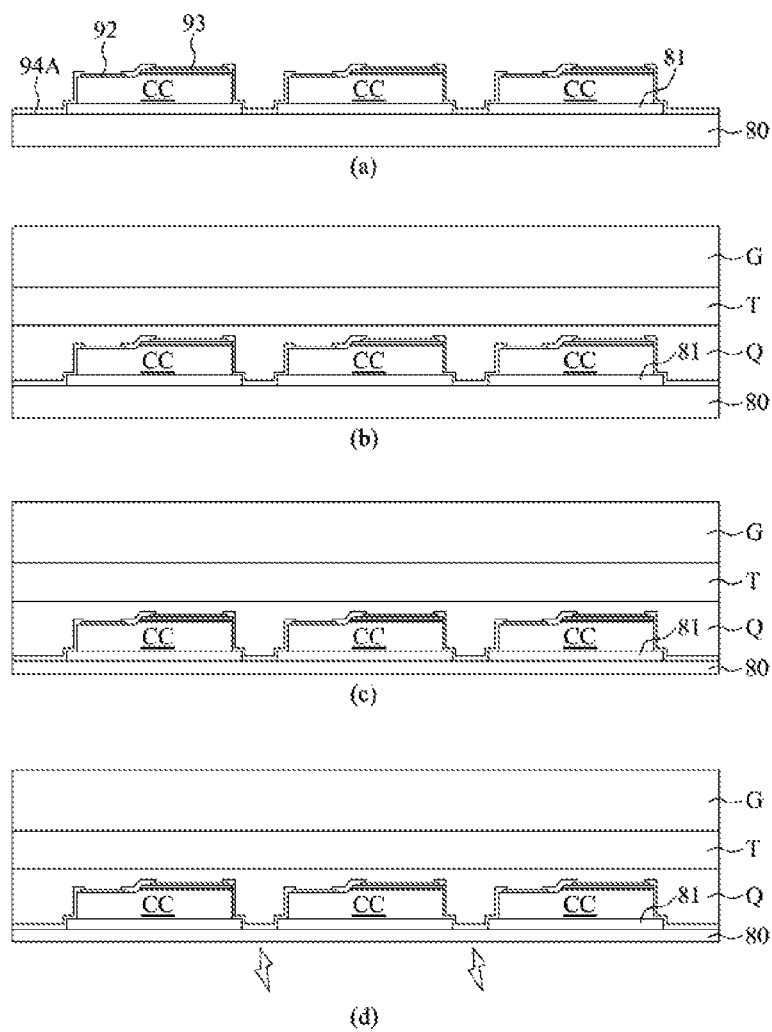
FIG. 55 and FIG. 56 illustrate another method of manufacturing a semiconductor light emitting device according to the present disclosure.
Figure 56:
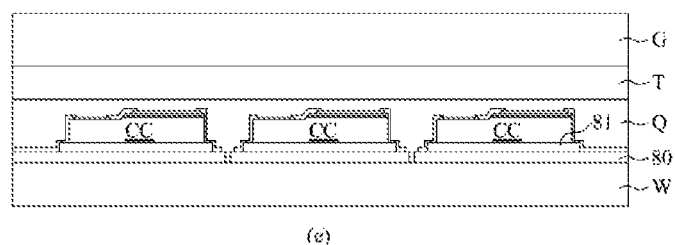
Figure 56:
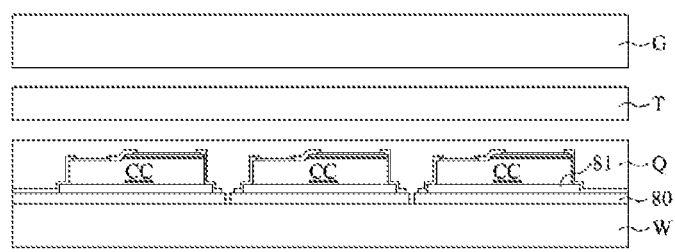
Figure 56:
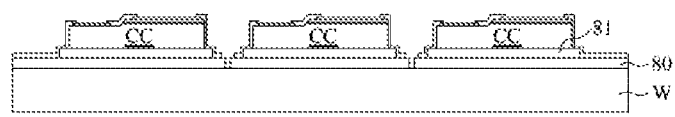
Figure 56:
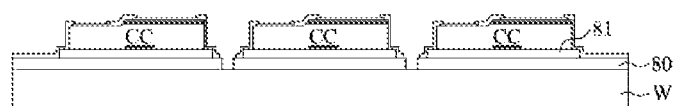

FIGS. 55 and 56 illustrate another method of manufacturing a semiconductor light emitting device according to the present disclosure. This method is different from the one illustrated in FIG. In particular, it provides a method for reducing the thickness of the growth substate 10, the light transmitting substrate 80 or the substrate ST.

FIG. 55A shows a configuration similar to the one in FIG. 41C, except that all of the semiconductor light emitting device chips CC are red light emitting chips. Each semiconductor light emitting device chip may emit lights of different wavelengths. and is grown on the Si growth substrate 10. After the Si growth substrate 10 is removed, the light transmitting substrate 80 is then provided.

Next, as shown in FIG. 55B, a support substrate G (e.g. a sapphire substrate) is attached to the semiconductor light emitting chips CC through an adhesive layer T (e.g., a double-sided UV tape). Preferably, a protective layer Q (e.g., a PR coating layer) for covering the semiconductor light emitting device chips CC is provided. The protective layer Q may comprise at least one of photoresistor PR, epoxy, glue, SU-B, silicone, an organic material, SOG (Spin On Glass), BCB, polyimide, or parylene. The adhesive layer T may comprise a double-sided UV tape or a double-sided foam tape (e.g., two substrates are attached to both sides of the tape at room temperature, undergo finishing processes including mechanical polishing, and are separated from each other by expanding at a certain temperature or higher). Alternatively, an LLO sacrificial layer (not shown) may be introduced to the adhesive layer T, such that the support substrate G having the LLO sacrificial layer and the predetermined adhesive layer T may be attached, by thermocompression wafer bonding, to the light transmitting substrate 80 having the protective layer Q. Here, the protective layer Q and the adhesive layer T may be made of the same material. The LLO sacrificial layer may comprise, for example, monocrystalline Group 3-5 nitride semiconductors including GaN, monocrystalline Group 2-6 oxide semiconductors including ZnO, transparent polycrystalline conducting oxides including ITO, polycrystalline conductive nitrides including TiN, amorphous dielectric including $SiO_2$, $SiN_x$, and so on, preferably in a multilayered structure. Other examples such as a PI-containing film, a triazene polymer layer as a photo-decomposition polymer, or a particular metal thin film (e.g., Ti, Au, Pt, Cr, Al, Ag or Cu) are also applicable. The adhesive layer T may be made of an organic material such as BCB, silicone, SU-8, $SiO_2$, SOG, acrylate, urethane, OCA or OCR. Moreover, the adhesive layer T may be made of a eutectic material that forms metal bonding, such as, AuSn (300° C.), AuIn (275° C.), NiSn (300° C.), CuSn (270° C.), etc. The support substrate G is preferably optically transparent material such as sapphire, quartzs or glass, taking a coefficient of thermal expansion into account.

Continuing to FIG. 55C, the light transmitting substrate 80 is made thinner through polishing and lapping. Preferably, its thickness is reduced to 100 μm or less.

Referring next to FIG. 55D, the semiconductor light emitting device chips CC on the light transmitting substrate 80 having a reduced thickness are now individualized. This individualization can be achieved by laser scribing, mechanical sawing or the like. If the passivation layer 94A is present, individualization of this passivation layer 94A can be a problem. But this can be resolved by removing the passivation layer 94A in advance along a line (not shown) where laser scribing is to be done.

A support W (e.g., a blue tape) is attached to the side of the light transmitting substrate 80 having a reduced thickness, as shown in FIG. 56E.

Subsequently, as shown in FIG. 56F, the support substrate G is removed. When a double-sided UV tape is used as the adhesive layer T, the protective layer Q can be removed from the support substrate G by UV irradiation. With the adhesive layer T being removed from the support substrate G, the support substrate G can be reused. In case of using UV light, a light transmitting substrate such as a sapphire substrate is generally used as the support substrate G.

Referring now to FIG. 56G, the protective layer Q is removed.

Lastly, as shown in FIG. 56H, the support W can be expanded to ensure that the semiconductor light emitting device chips CC are individually separated. Alternatively, the semiconductor light emitting device chips CC can be arranged in predetermined spacing required.

Figure 57:
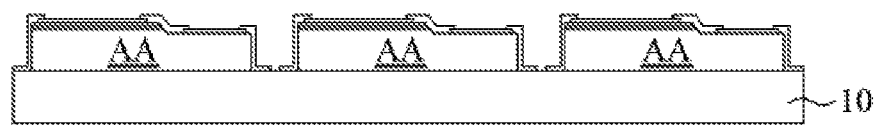
FIGS. 57 and 58 illustrate other methods of manufacturing a semiconductor light emitting device according to the present disclosure.
Figure 58:
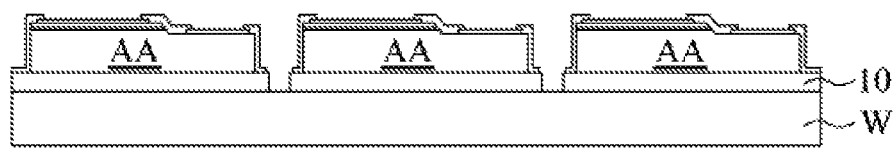

FIGS. 57 and 58 illustrate another method of manufacturing a semiconductor light emitting device according to the present disclosure. FIG. 57 shows that the semiconductor light emitting device chips AA, rather than the semiconductor light emitting device chips CC as in FIG. 55A, are provided on the growth substrate 10. The method illustrated in FIGS. 55 and 56 is performed here, and lastly, as shown in FIG. 58, the semiconductor light emitting device chips AA are arranged, on the support W, in predetermined spacing required. The light transmitting substrate 80 in FIG. 56D and the growth substrate 10 in FIG. 58 serve as windows, through which light from the semiconductor light emitting device chips AA and CC is transmitted and emitted.

The following will now present specific examples of the application of the methods according to the present disclosure to a vertical-type chip.

Figure 59:
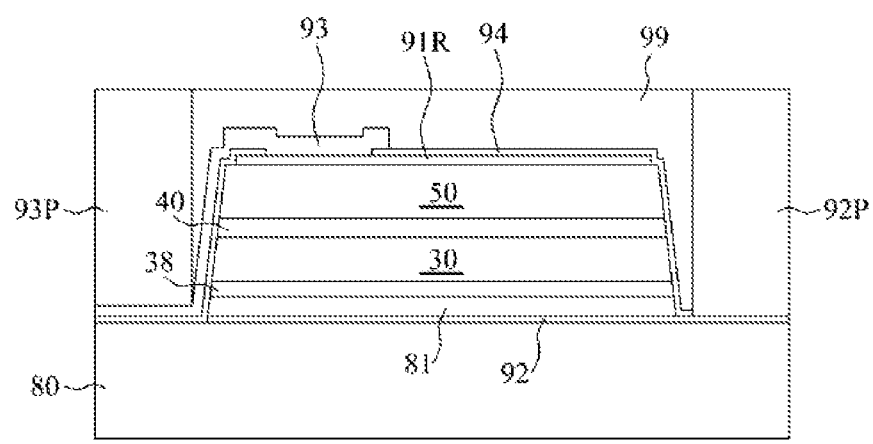
FIG. 59 shows another example of a semiconductor light emitting device according to the present disclosure.

FIG. 59 shows another example of a semiconductor light emitting device according to the present disclosure. This semiconductor light emitting device differs from the one shown in FIG. 24 in that the first electrode 92 located under the N-type semiconductor region 30 is electrically connected to the N-type semiconductor region 30. Also, the light generated by the active region 40 is emitted towards the light transmitting substrate 80. To this end, the first electrode 92 as well as the adhesive layer 81 should be made of a light transmitting material. If needed, the N-type semiconductor region 30 may be provided with a transparent conductive material 38 (e.g., an oxide (ITO), a nitride or an oxynitride) having ohmic contact properties. The position of the N-type semiconductor region 30 and the position of the P-type semiconductor region 50 can be swapped. Examples of a material for the first electrode 92 include: a transparent conducting oxide (TCO) such as ITO or ZnO; a transparent conducting nitride (TCN) such as any compound or mixture comprised of TiN, ITN or InN—TiN; a transparent conducting oxynitride (TCON) such as ITON; a silver nanowire; a carbon nanotube (CNT); graphene; a conducting polymer; and any metals or their alloys having a predetermined thickness or less and having at least 50% of light transmittance, such as tungsten. Preferably, the adhesive layer 81 may be a material that is electrically conducting, optically transmitting, and exhorting bonding strength between materials, and examples of the material include metals having a predetermined thickness of less, such as Ag, Au, Pt, Pd, In, Sn or Zn, or their alloys; compounds or mixtures having a predtermiend thickness of less, such as NiO—Au, NiO—Ag, ITO-Au, ITO-Ag, ZnO—Au, ZnO—Ag, TiN—Au, TiN—Ag, CNT-Au, or CNT-Ag; and a transparent conducting polymer, such as PEDOT:PSS (a polymer thin film in the form of a bundle of yarn, with the conductive PEDOT being surrounded by PSS (Polystyrene Sulfonate) like a wire sheath, and PSS is melted as much as possible to increase conductivity and interconnect PEDOTs). Here, the term "a predetermined thickness" refers to a thickness at or less than which a material of interest becomes light transmitting. In addition, the adhesive layer 81 and the first electrode 92 may be integrated into one structure. Such a structure may be in the form of a 1st TCO/metal or alloy/2nd TCO. In particular, the metal or alloy between two TCOs has a predetermined thickness or less to have at least 50% of light transmittance, and it also provides bonding. The current spreading electrode 91R may be formed of a light transmitting electrode (e.g., ITO) and the passivation layer 94 as mentioned in FIG. 24 may serve as a non-conducting reflective film 94, so that the light generated by the active region 40 can be reflected from the opposing side of the first electrode 92 towards the light transmitting substrate 80. The non-conducting reflective film 94 may be a single-layered dielectric film (e.g., $SiO_x$, $TiO_x$, $Ta_2O_5$, $MgF_2$) a multilayered dielectric film, a DBR reflective film (e.g., $SiO_2/TiO_2$), or a combination thereof. Further, the current spreading electrode 91R may have a metal reflective film structure (e.g., Ag/Ni/Au or Al/Ni/Au) as described above to be able to serve as a reflector. Here, the current spreading electrode such as ITO can be omitted as the metal reflective film structure itself can perform the function. The position of the P-type semiconductor region 50 and the position of the N-type semiconductor region 30 can be swapped. In this case, the first light transmitting substrate 70 shown in FIG. 8 and the temporary substrate 74 shown in FIG. 40 may not be used. Similar to the one shown in FIG. 25, in the semiconductor light emitting device thus manufactured, the first electrode post 92P and the second electrode post 93P may be electrically and mechanically connected to the external power supply 98 (e.g., the submount, the interposer, the wiring board, the display pixel or the like). In order to avoid redundancy, other components indicated by the identical reference numerals and functions with those in other examples will not be described here.

Figure 60:
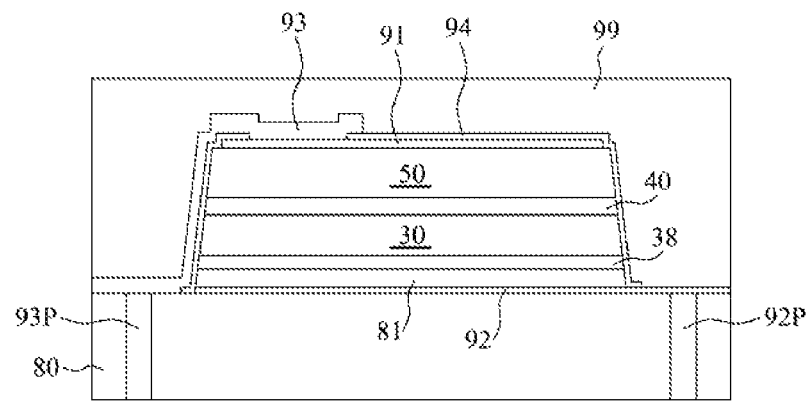
FIG. 60 shows another example of a semiconductor light emitting device according to the present disclosure.

FIG. 60 shows another example of a semiconductor light emitting device according to the present disclosure. This semiconductor light emitting device differs from the one shown in FIG. 59 in that the light generated by the active region 40 is emitted through the opposing side of the light transmitting substrate 80. To this end, the current spreading electrode 91 is made of a light transmitting material such as ITO. The passivation layer 94 is also made of a light transmitting material such as $SiO_2$. To allow sufficient light emission, the second electrode 93 is configured so that it only covers part of the P-type semiconductor region 50. The first electrode in this case serves as a reflector. Moreover, to supply external power to the first and second electrodes 92 and 93, the first and second electrode posts 92P and 93P are formed by plating (e.g., taking the shape of a column or post) within the light transmitting substrate 80, rather than extending upwards from the light transmitting substrate 80 as shown in FIG. 59. This type of the light transmitting substrate 80 is described in US Patent Application Publication No. US 2017/0317230. Alternatively, the first and second electrode posts 92P and 93P may be omitted and direct wire forming can be performed on the first and second electrodes 92 and 93 disposed on the light transmitting substrate 80. Similar to the one shown in FIG. 25, in the semiconductor light emitting device thus manufactured, the light transmitting substrate 80 may be electrically and mechanically connected to the external power supply 98 (e.g., the submount, the interposer, the wiring board, the display pixel or the like). Again, in order to avoid redundancy, other components indicated by the identical reference numerals and functions with those in other examples will not be described here. In general, the first electrode 92 may be made of a reflective metallic material (e.g., Al, Ag, Rh, Cr, Ni, Au, Pt, Pd, Ti, Cu or alloys thereof), or may have a stacked structure of the metallic material and a transparent conducting material (e.g., an oxide, a nitride and an oxynitride). Likewise, the second electrode 93 may be made of a reflective metallic material (e.g., Al, Ag, Rh, Cr, Ni, Au, Pt, Pd, Ti, Cu or alloys thereof).

Figure 61:
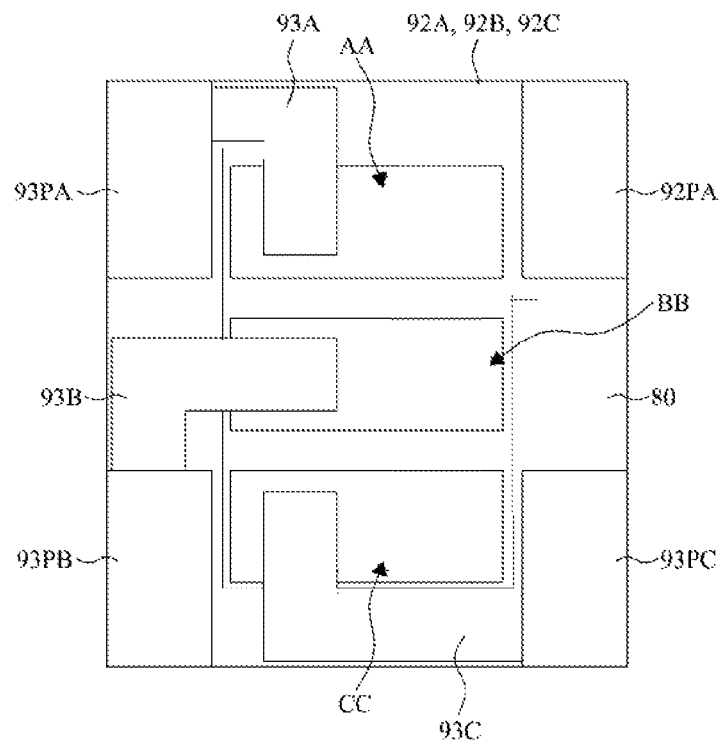
FIG. 61 shows another example of a semiconductor light emitting device according to the present disclosure.

FIG. 61 shows another example of a semiconductor light emitting device according to the present disclosure. The semiconductor light emitting device of this example is a combination of the semiconductor light emitting device in FIG. 59 and the semiconductor light emitting device in FIG. 28. As mentioned previously in connection with FIG. 59, the first electrodes 92A, 92B and 92C serve as a common electrode. Here, the first electrodes are formed on the bottom of the three semiconductor light emitting device chips AA, BB and CC. Similar to the semiconductor light emitting device shown in FIG. 43, each of the three semiconductor light emitting device chips AA, BB and CC (e.g., RGB LEDs) may have its own light transmitting substrate 80.

Figure 62:
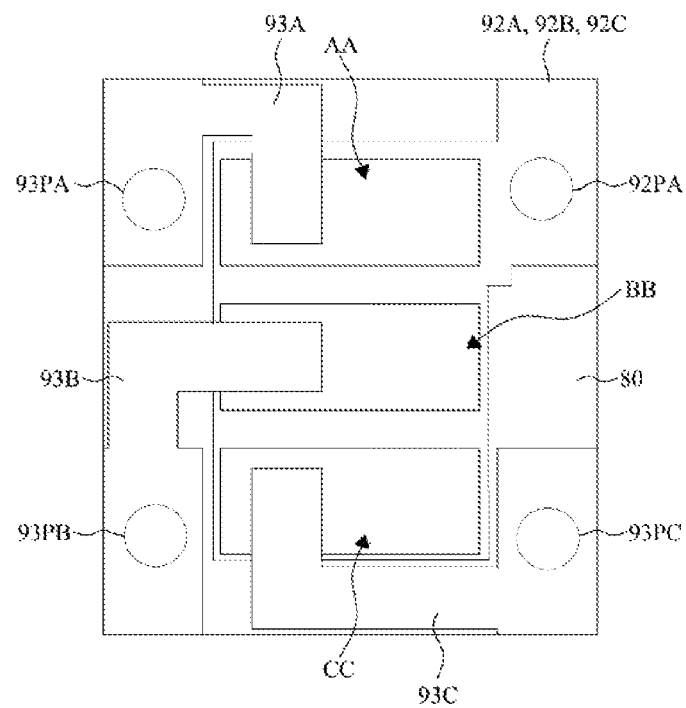
FIG. 62 shows another example of a semiconductor light emitting device according to the present disclosure.

FIG. 62 shows another example of a semiconductor light emitting device according to the present disclosure. The semiconductor light emitting device of this example is a combination of the semiconductor light emitting device in FIG. 60 and the semiconductor light emitting device in FIG. 28. A first electrode post 92PA and second electrode posts 93PA, 93PB and 93PC are formed inside the light transmitting substrate 80 as mentioned in connection with FIG. 60, that is, they are formed by plating (e.g., taking the shape of a column or post) into holes that are present in the light transmitting substrate 80, rather than extending upwards from the light transmitting substrate 80. Similar to the semiconductor light emitting device shown in FIG. 43, each of the three semiconductor light emitting device chips AA, BB and CC (e.g., RGB LEDs) may have its own light transmitting substrate 80.

Figure 63:
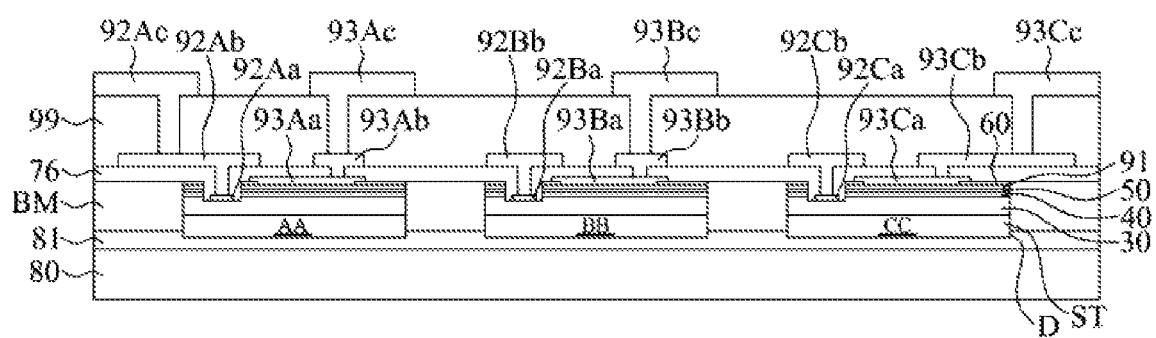
FIG. 63 shows another example of a semiconductor light emitting device according to the present disclosure.

FIG. 63 shows another example of a semiconductor light emitting device according to the present disclosure. This semiconductor light emitting device differs from the one shown in FIG. 41D in that the substrate ST between the semiconductor regions 30, 40 and 50 and the light transmitting substrate 80 is not removed. In addition, it includes the light transmitting substrate 80, three semiconductor light emitting device chips AA, BB and CC, an adhesive layer 81, a black matrix material BM, a planarization layer 76, and an encapsulant 99. Each of the three semiconductor light emitting device chips AA, BB and CC includes a first semiconductor region 30, an active region 40, a second semiconductor region 50, a light transmitting electrode 91, a protective layer 60 (this can be omitted), a first ohmic electrode 92Aa, 92Ba, 92Ca, a first wiring electrode 92Ab, 92Bb, 92Cb, a first bonding electrode 92Ac, a second ohmic electrodes 93Aa, 93Ba, 93Ca, a second wiring electrode 93Ab, 93Ba, 93Cb, and a second bonding electrodes 93Ac, 93Bc, 93Cc. The first ohmic electrodes 92Aa, 92Ba and 92Ca and the second ohmic electrodes 93Aa, 93Ba and 93Ca correspond to the first electrode 92 and the second electrode 93 shown in FIG. 23, respectively. The first wiring electrodes 92Ab, 92Bb and 92Cb and the second wiring electrodes 93Ab, 93Bb and 93Cb correspond to the first wiring electrodes 91A, 92B and 92C and the second wiring electrodes 93A, 93B and 93C shown in FIGS. 27 and 28, respectively. The first bonding electrode 92Ac and the second bonding electrodes 93Ac, 93Bc and 93Cc correspond to the first electrode post 92PA and the second electrode posts 93PA, 93PB and 93PC shown in FIGS. 27 and 28, respectively. The first wiring electrodes 92Ab, 92Bb, 92Cb are connected to each other on the planarization layer 76, and the first bonding electrode 92Ac can serve as a common electrode. Moreover, the semiconductor light emitting device can be configured with only one type of the three semiconductor light emitting device chips AA, BB and CC. Although it is not preferred, the light transmitting electrode 91, the encapsulant 99, the first bonding electrode 92Ac and the second bonding electrodes 93Ac, 93Bc and 93Cc can be omitted. With this configuration, the removal of the substrate ST can be less troublesome, and an additional light scattering surface may be provided (e.g., the rough surfaces S on the light transmitting substrate 80 shown in FIG. 35). The front and/or rear sides of the light transmitting substrate 80 may have rough surfaces S, which contributes an increased contact area for improving the adhesive strength of the adhesive layer 81. Further, only optically and/or electrically high-quality semiconductor light emitting device chips AA, BB and CC are sorted out before they are bonded to the light transmitting substrate 80, so that the quality of the final pixel light source can be improved. Also, the semiconductor light emitting device chips AA, BB and CC are structurally stably fixed in the vertical direction as they are bonded to the light transmitting substrate 80 through the optically transparent adhesive layer 81, i.e., the chips are much less likely to break or to get peeled off during the massive transfer process during the manufacture of a pixel light source. Moreover, the semiconductor light emitting device chips AA, BB and CC can be more securely fixed in the horizontal direction through the black matrix material BM.

If three semiconductor light emitting device chips AA, BB and CC are formed on the light transmitting substrate 80 and are to be used to configure one pixel light source, more particularly, a pixel light source having dimensions of 300 μm×300 μm or less, the width of each chip should not exceed approximately 80 μm, allowing for the spacing between the chips. If the dimensions of the pixel light source gets smaller than 300 μm×300 μm, the width of each chip will have to be 50 μm or less. If the substrate ST (in general, the substrate ST is at least 80 μm thick) is provided to a chip having a width of 80 μm or less, the chip may fall over as its height will be substantially greater than its decreasing width, making it difficult to handle the chip. When it comes to the thickness of the light transmitting substrate 80, this would also cause a problem to the semiconductor light emitting device as a whole because one pixel light source might end up having an extremely great thickness or height. As compared with the case where each of the three semiconductor light emitting device chips AA, BB and CC (which are later fixed as one pixel light source) is only provided with a respective semiconductor region 30, 40 or 50, the presence of the substrate ST in each of the chips makes it harder to fix the chips to each other. In other examples described below, however, the substrate ST has a thickness of 50 μm or less, or the lateral surfaces D of these three semiconductor light emitting device chips AA, BB and CC are bonded by a material having high bonding strength. In the example shown in FIG. 63, for instance, the substrate ST has a thickness of 50 μm or less, and portions of its bottom surface (which corresponds to an adhesive side on contact with the light transmitting substrate 80) and lateral surfaces D are secured by the adhesive layer 81 made of an optically transparent and strong bonding material (e.g., SOG, FOx or silicone). Hence, although the width of the chips may become 80 μm or less as the substrate ST is 50 μm or less in thickness, the difficulty in handling a chip with the height of the chip being greater than the width of the chip can be overcome. In addition, the lateral surfaces D of the substrate ST may be employed for fixing the three semiconductor light emitting device chips AA, BB and CC, particularly to support the fixation of the semiconductor light emitting device chips AA, BB and CC when each chip is provided with its own substrate ST. This is advantageous because even when the substrate ST is made of a non-conducting material (e.g., sapphire), non-conducting materials as well as metals can be used for the adhesive layer 81. Further, with the light transmitting substrate 80 being thicker than the substrate ST, the reliability of a semiconductor light emitting device as a whole can be improved. Another advantage is that as the thickness of the substrate ST is limited to 50 μm or less, it is possible to design the light transmitting substrate 80 of a desired height, being free from the height restrictions imposed on the pixel light source (e.g., the height should not exceed 300 μm). The thickness of the optically transparent adhesive layer 81 is not particularly limited, but an increase in the overall thickness as the semiconductor light emitting device chips AA, BB and CC are bonded to the light transmitting substrate 80 is expected to affect the mechanical stress, thermal stability and optical quality (color mixing or chromatic aberration; Mura phenomenon) of the chips.

Figure 64:
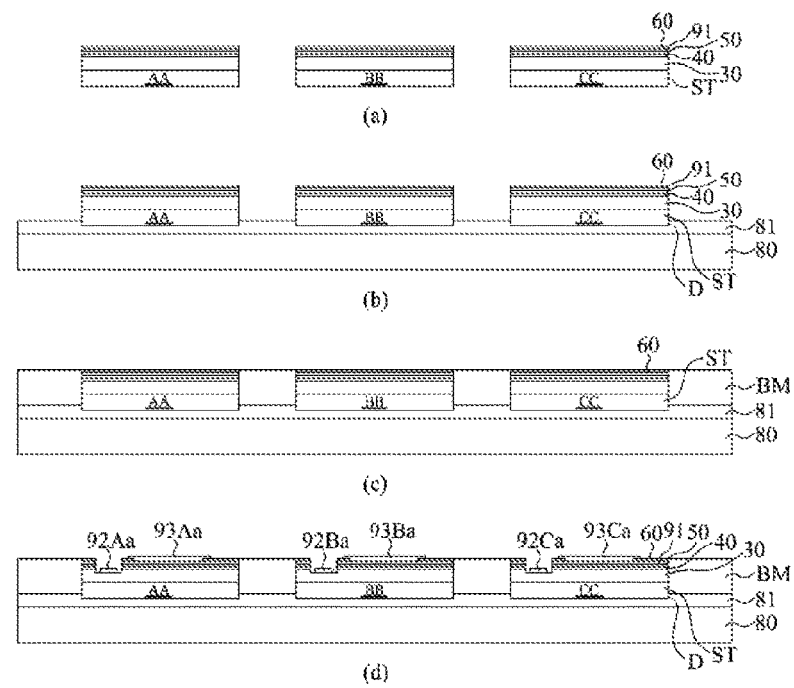
FIG. 64 illustrates a method of manufacturing the semiconductor light emitting device of FIG. 63.

FIG. 64 illustrates another method of manufacturing the semiconductor light emitting device shown in FIG. 63. First, as shown in FIG. 64A, three semiconductor light emitting device dies AA, BB and CC are prepared. Each of the three semiconductor light emitting device dies AA, BB and CC has semiconductor regions 30, 40 and 50 and a substrate ST, with the substrate ST prepared having a thickness of 50 μm or less. Here, the substrate ST can be either the growth substrate 10 (see FIG. 8) or the light transmitting substrate 80 (see FIG. 10). This 50 μm or less—thick substrate ST can be obtained by one of the following: as disclosed in U.S. Pat. No. 9,711,405, a laser beam is irradiated into the substrate ST to draw a dividing line and the substrate ST is grinded on the side facing the semiconductor regions 30, 40 and 50; or as disclosed in JP Patent Laid-Open No. S64-038209, a dividing line is drawn through blading from the semiconductor regions 30, 40 and 50 up to the substrate ST and the substrate ST is grinded on the side facing the semiconductor regions 30, 40 and 50. Preferably, the light transmitting electrode 91 and the protective layer 60 (e.g., SiO₂) are prepared in advance, in order to protect the three semiconductor light emitting device dies AA, BB and CC during the subsequent steps. Next, as shown in FIG. 64B, the substrate ST and the light transmitting substrate 80 are bonded together through the strong bonding and optically transparent adhesive layer 81. A preferable way to achieve stronger adhesion between them involves spin-coating and curing of a liquid phase SOG (Spin On Glass) containing $SiO_2$, FOx (Flowable Oxide), or silicone. With this liquid-phase spin coating process, portions of the lateral surfaces D of the substrate ST can have the adhesive layer 80. Continuing to FIG. 64C, the black matrix material BM (e.g., epoxy mold composite (EMC)) is filled, by spin-coating and capillary action, up to the protective layer 60. The black matrix material BM serves to suppress light interference between the semiconductor light emitting device dies AA, BB and CC and to reinforce the bonding between the semiconductor light emitting device dies AA, BB and CC. The protective layer 60 serves to protect the semiconductor light emitting device dies AA, BB and CC during the subsequent step for removing the black matrix material BM on top of the semiconductor light emitting device dies AA, BB and CC. After the semiconductor regions 30, 40 and 50, the light transmitting electrode 91 and the protective layer 60 are etched, the first ohmic electrode 92Aa, 92Ba and 92Ca and the second ohmic electrode 93Aa, 93Ba and 93Ca are formed on each of the semiconductor light emitting device dies AA, BB and CC, respectively, as shown in FIG. 64D. If semiconductor light emitting device chips (rather than dies) as shown in FIG. 37 are prepared in the step of FIG. 64A, the step of FIG. 64D can be omitted. Lastly, as shown in FIG. 63, the planarization layer 76 is formed, the first wiring electrodes 92Ab, 92Bb, and 92Cb and the second wiring electrodes 93Ab, 93Bb, and 93Cb are formed through an etching process, the encapsulant 99 is formed, and the first bonding electrode 92Ac and the second bonding electrodes 93Ac, 93Bc and 93Cc are formed through an etching process, thereby completing the manufacture of a semiconductor light emitting device.

Figure 65:
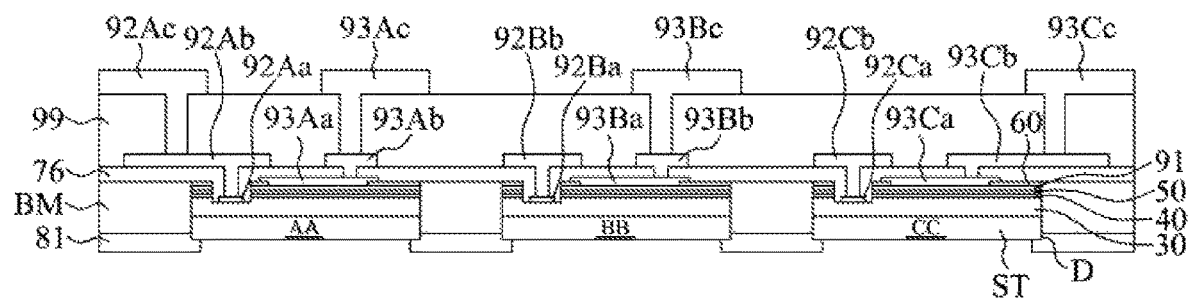
FIG. 65 shows another example of a semiconductor light emitting device according to the present disclosure.

FIG. 65 shows another example of a semiconductor light emitting device according to the present disclosure. This semiconductor light emitting device differs from the one shown in FIG. 63 in that the light transmitting substrate 80 is removed, and hence the overall height of the semiconductor light emitting device is reduced, such that the thickness of the substrate ST is no longer limited to 50 µm or less. When a pixel light source has a height of 300 µm or less, the substrate ST may have a thickness of 150 µm or less and a separate process for reducing the thickness of the substrate ST to 50 µm or less is not necessarily required. In addition, with part of the adhesive layer 71 being removed, a structure using a metallic adhesive layer 81 can be provided. Further, only optically and/or electrically high-quality semiconductor light emitting device chips AA, BB and CC are sorted out before they are bonded to the temporary substrate 74, so that the quality of the final pixel light source can be improved. Also, the thickness of the semiconductor light emitting device chips AA, BB and CC can be freely chosen as they are fixed in the vertical direction only through the strong bonding adhesive layer 81, without the light transmitting substrate 90. In particular, when it comes to the structural stability, it is advantageous to use the adhesive layer 81 made of a metal having high bonding strength.

Figure 66:
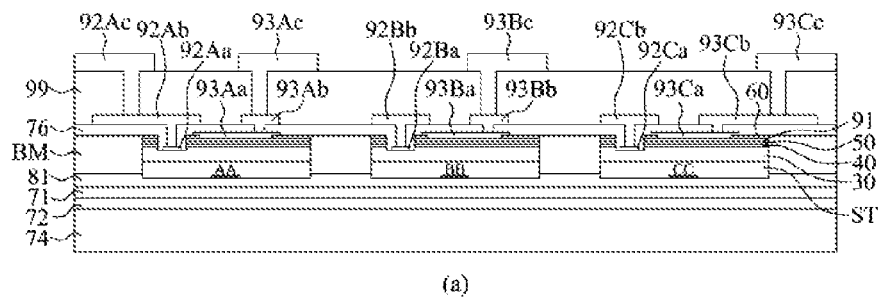
FIG. 66 illustrates a method of manufacturing the semiconductor light emitting device of FIG. 65.
Figure 66:
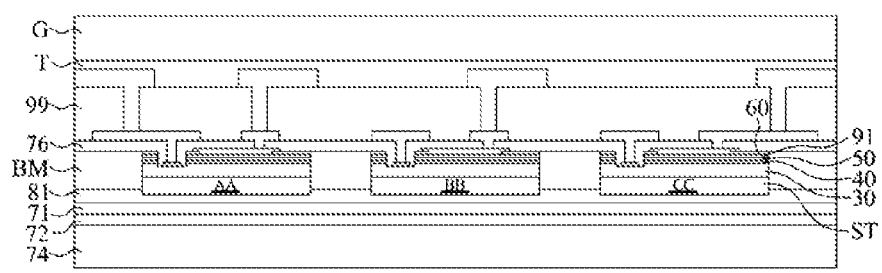
Figure 66:
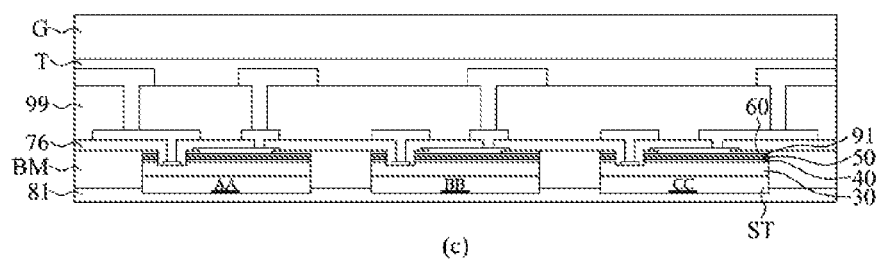

FIG. 66 illustrates another method of manufacturing the semiconductor light emitting device shown in FIG. 65. First, referring to FIG. 66A, the semiconductor light emitting device chips AA, BB and CC are prepared. Here, unlike the step shown in FIG. 64A, the temporary substrate 74 (see FIG. 49B) is used, rather than the light transmitting substrate 80. In addition, for the removal of the temporary substrate 74 later, the sacrificial layer 72 and the protective layer 71 are formed. The protective layer 71 may be omitted. Although the thickness of the substrate ST is not necessarily limited to 50 µm or less, it is preferably made as thin as possible, allowing for the quality of the final pixel light source. Continuing to FIG. 66B, the support substrate G (e.g. the sapphire substrate, see FIG. 55B) is attached opposite to the temporary substrate 74 through the adhesive layer T (e.g., the double-sided UV tape or the heat-resistant (or high-temp) foam tape, see FIG. 55B). Referring next to FIG. 66C, with the sacrificial layer 72 and the protective layer 71 being removed, the temporary substrate 74 is then removed to expose the adhesive layer 81. Lastly, as shown in FIG. 65, the substrate ST of each of the three semiconductor light emitting device chips AA, BB and CC is exposed and the support substrate G is removed, thereby completing the manufacture of a semiconductor light emitting device.

Figure 67:
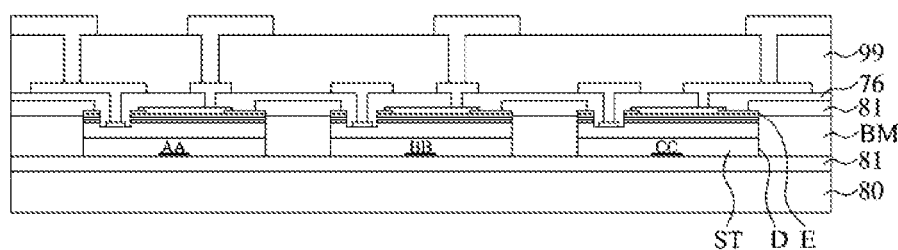
FIG. 67 shows another example of a semiconductor light emitting device according to the present disclosure.

FIG. 67 shows another example of a semiconductor light emitting device according to the present disclosure. This semiconductor light emitting device differs from the one shown in FIG. 63 in that the adhesive layer 81 (the upper adhesive layer) is provided between the planarization layer 76 and the black matrix material BM, and through this adhesive layer 81 (the upper adhesive layer), the upper sides E of the semiconductor light emitting device chips AA, BB and CC, rather than the lateral surfaces D of the substrate ST, are securely fixed. Further, only optically and/or electrically high-quality semiconductor light emitting device chips AA, BB and CC are sorted out before they are bonded to the light transmitting substrate 80, so that the quality of the final pixel light source can be improved. Also, the semiconductor light emitting device chips AA, BB and CC are structurally stably fixed in the vertical direction as they are bonded to the light transmitting substrate 80 through the optically transparent adhesive layer 81, i.e., the chips are much less likely to break or to get peeled off during the massive transfer process during the manufacture of a pixel light source. Moreover, the semiconductor light emitting device chips AA, BB and CC can be more securely fixed in the horizontal direction through the black matrix material BM and any suitable adhesive 81 having high bonding strength.

Figure 68:
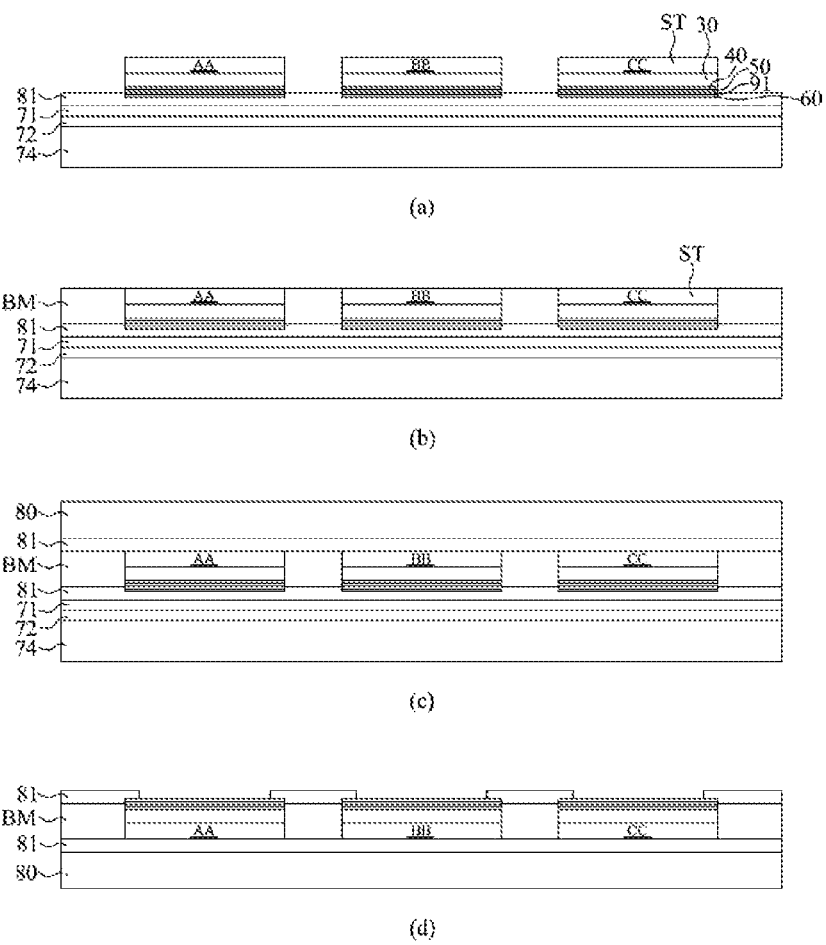
FIG. 68 illustrates a method of manufacturing the semiconductor light emitting device of FIG. 67.

FIG. 68 illustrates another method of manufacturing the semiconductor light emitting device shown in FIG. 67. First, as shown in FIG. 68A, with the semiconductor regions 30, 40 and 50 facing down, the semiconductor light emitting device chips AA, BB and CC are attached, through the adhesive layer 81 (the upper adhesive layer), to the temporary substrate provided with the protective layer 71 and the sacrificial layer 72. Referring next to FIG. 68B, the black matrix material BM is applied, and the polishing process is performed so that the thickness or height of the substrate ST falls to 50 µm or less. Continuing to FIG. 68C, the light transmitting substrate 80 is attached to the opposing side of the temporary substrate 74 through the adhesive layer 81 (the lower adhesive layer). Subsequently, the sacrificial layer 72 and hence the temporary substrate 74 are removed, and the protective layer 71 is also removed to expose the adhesive layer 81 (the upper adhesive layer), part of which is then removed by etching. With the step shown in FIG. 64D, the semiconductor light regions 30, 40 and 50, the light transmitting electrode 91 and the protective layer 60 are etched, which follows by the formation of the first ohmic electrodes 92Aa, 92Ba and 92Ca and the second ohmic electrodes 93Aa, 93Ba, and 93Ca. This step can be omitted if the semiconductor light emitting device chips (rather than dies) AA, BB and CC are prepared. Lastly, as shown in FIG. 67, the planarization layer 76 is formed, the first wiring electrodes 92Ab, 92Bb, and 92Cb and the second wiring electrodes 93Ab, 93Bb, and 93Cb are formed through an etching process, the encapsulant 99 is formed, and the first bonding electrode 92Ac and the second bonding electrodes 93Ac, 93Bc and 93Cc are formed through an etching process, thereby completing the manufacture of a semiconductor light emitting device.

Figure 69:
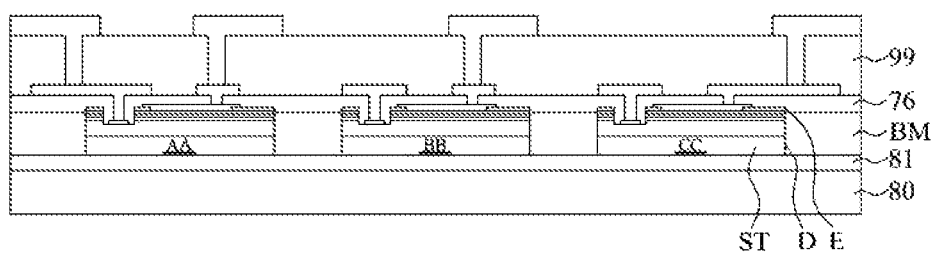
FIG. 69 shows another example of a semiconductor light emitting device according to the present disclosure.

FIG. 69 shows another example of a semiconductor light emitting device according to the present disclosure. This semiconductor light emitting device is similar to the one shown in FIG. 68, except that the adhesive layer 81 (the upper adhesive layer) is absent because it is completely removed through the step illustrated in FIG. 68D. Further, only optically and/or electrically high-quality semiconductor light emitting device chips AA, BB and CC are sorted out before they are bonded to the temporary substrate 74, so that the quality of the final pixel light source can be improved. Also, the semiconductor light emitting device chips AA, BB and CC are structurally stably fixed in the vertical direction as they are bonded to the light transmitting substrate 80 through the optically transparent adhesive layer 81, i.e., the chips are much less likely to break or to get peeled off during the massive transfer process during the manufacture of a pixel light source. Moreover, the semiconductor light emitting device chips AA, BB and CC can be more securely fixed in the horizontal direction through the planarization layer 76 and the black matrix material BM.

Figure 70:
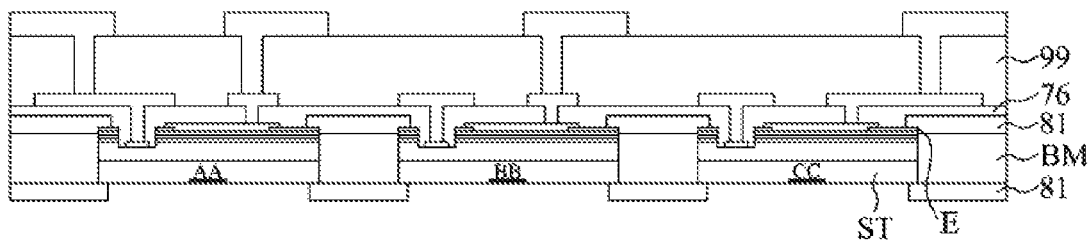
FIG. 70 shows another example of a semiconductor light emitting device according to the present disclosure.

FIG. 70 shows another example of a semiconductor light emitting device according to the present disclosure. This semiconductor light emitting device differs from the one shown in FIG. 67 in that the light transmitting substrate 80 is removed. With the same advantages as the semiconductor light emitting device shown in FIG. 65, the semiconductor light emitting device of this example has an additional advantage that the substrate ST can be made thinner during the process, e.g., to a thickness of 50 µm or less. In particular, the semiconductor light emitting device of this example is obtained by applying the method illustrated in FIG. 66 to the semiconductor light emitting device of FIG. 67. Further, only optically and/or electrically high-quality semiconductor light emitting device chips AA, BB and CC are sorted out before they are bonded to the temporary substrate 74, so that the quality of the final pixel light source can be improved. Also, the thickness of the semiconductor light emitting device chips AA, BB and CC can be freely chosen as they are fixed in the vertical direction through parts of the upper and lower adhesive layers 81 having high bonding strength, without the light transmitting substrate 80. In particular, when it comes to the structural stability, it is advantageous to use the adhesive layer 81 made of a metal having high bonding strength. Moreover, the semiconductor light emitting device chips AA, BB and CC can be more securely fixed in the horizontal direction through the black matrix material BM and parts of the upper and lower adhesive layers 81 having high bonding strength. Thus, a relatively thin pixel light source can be manufactured, which is favored in terms of the quality.

Figure 71:
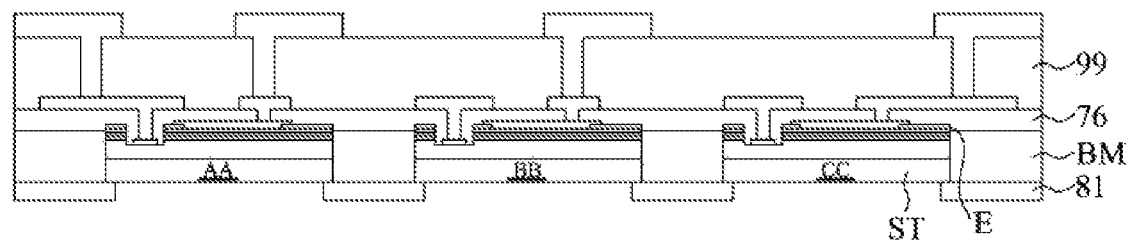
FIG. 71 shows another example of a semiconductor light emitting device according to the present disclosure.

FIG. 71 shows another example of a semiconductor light emitting device according to the present disclosure. This semiconductor light emitting device differs from the one shown in FIG. 69 in that the light transmitting substrate 80 is removed. With the same advantages as the semiconductor light emitting device shown in FIG. 65, the semiconductor light emitting device of this example has an additional advantage that the substrate ST can be made thinner during the process, e.g., to a thickness of 50 µm or less. In particular, the semiconductor light emitting device of this example is obtained by applying the method illustrated in FIG. 66 to the semiconductor light emitting device of FIG. 69. Further, only optically and/or electrically high-quality semiconductor light emitting device chips AA, BB and CC are sorted out before they are bonded to the temporary substrate 74, so that the quality of the final pixel light source can be improved. Also, the thickness of the semiconductor light emitting device chips AA, BB and CC can be freely chosen as they are fixed in the vertical direction through part of the lower adhesive layers 81 having high bonding strength, without the light transmitting substrate 80. In particular, when it comes to the structural stability, it is advantageous to use the adhesive layer 81 made of a metal having high bonding strength. Moreover, the semiconductor light emitting device chips AA, BB and CC can be more securely fixed in the horizontal direction through the part of the lower adhesive layer 81 having high bonding strength, the planarization layer 76 and the black matrix material BM, Thus, a relatively thin pixel light source can be manufactured, which is favored in terms of the quality.

Various embodiments of the present disclosure are described below.

(1) A method of manufacturing a flip chip semiconductor light emitting device, the method comprising: providing a growth substrate on which a first N-type semiconductor region, an active region for generating light by electron-hole recombination, and a second P-type semiconductor region are sequentially grown; bonding a first light transmitting substrate to the second semiconductor region; removing the growth substrate from the first semiconductor region; attaching a second light transmitting substrate through an adhesive layer to the first semiconductor region from which the growth substrate is removed; laser ablating the first light transmitting substrate from the second semiconductor region; partially removing the second semiconductor region and the active region to expose part of the first semiconductor region; and forming a first flip chip electrode and a second flip chip electrode on the exposed first semiconductor region and the exposed second semiconductor region, respectively.

(2) There is also provided the method of manufacturing a semiconductor light emitting device of (1), further comprising: before bonding the first light transmitting substrate, forming a protective layer on the second semiconductor region.

(3) There is also provided the method of manufacturing a semiconductor light emitting device of (2), wherein the first light transmitting substrate is provided with a sacrificial layer, and the sacrificial layer and the protective layer are bonded by a metal bonding layer.

(4) There is also provided the method of manufacturing a semiconductor light emitting device of (1), further comprising: after removing the first light transmitting substrate and before exposing part of the first semiconductor region, removing the metal bonding layer and the protective layer in sequence.

(5) There is also provided the method of manufacturing a semiconductor light emitting device of (1), further comprising: after removing the metal bonding layer and the protective layer in order, removing part of the adhesive layer to remove the second light transmitting substrate.

(6) There is also provided the method of manufacturing a semiconductor light emitting device of (1), further comprising: after removing the metal bonding layer and the protective layer in order, forming a light transmitting electrode on the second semiconductor region.

(7) There is also provided the method of manufacturing a semiconductor light emitting device of (1), wherein providing a growth substrate involves forming an undoped semiconductor region under the first semiconductor region, and before attaching the second light transmitting substrate, at least part of the undoped semiconductor region is removed.

(8) A semiconductor light emitting device comprising: a first semiconductor region having a first conductivity; a second semiconductor region having a second conductivity different from the first conductivity; an active region being interposed between the first semiconductor region and generating light by electron-hole recombination; a first electrode being positioned in an exposed portion of the first semiconductor region, being in electrical communication with the first semiconductor region and serving as a flip chip bonding pad, with the exposed portion being obtained by removing part of the first semiconductor region, the active region and the second semiconductor region; and a second electrode being positioned in another exposed portion of the first semiconductor region, being insulated from the first semiconductor region through an insulation layer interposed therein, being in electrical communication with the second semiconductor region and serving as a flip chip bonding pad, with the another exposed portion being obtained by removing part of the first semiconductor region, the active region and the second semiconductor region.

(9) A semiconductor light emitting device comprising: a first semiconductor region having a first conductivity; a second semiconductor region having a second conductivity different from the first conductivity; an active region being interposed between the first semiconductor region and generating light by electron-hole recombination; a first electrode being positioned in an exposed portion of the first semiconductor region, being in electrical communication with the first semiconductor region and serving as a flip chip bonding pad, with the exposed portion being obtained by removing part of the first semiconductor region, the active region and the second semiconductor region; and a second electrode being in electrical communication with the second semiconductor region and serving as a flip chip bonding pad, wherein the first electrode is extended over the second semiconductor region which is a non-emission region.

(10) A semiconductor light emitting device comprising: a first semiconductor region having a first conductivity; a second semiconductor region having a second conductivity different from the first conductivity; an active region being interposed between the first semiconductor region and generating light by electron-hole recombination; a first electrode being in electrical communication with an exposed portion of the first semiconductor region and serving as a flip chip bonding pad, with the exposed portion being obtained by removing part of the first semiconductor region, the active region and the second semiconductor region; a second electrode being in electrical communication with the second semiconductor region and serving as a flip chip bonding pad; and an insulation layer being positioned under the first and second electrodes and filling in the exposed portion of the first semiconductor region obtained by removing part of the first semiconductor region, the active region and the second semiconductor region.

(11) There is also provided the semiconductor light emitting device of (10), comprising: an additional insulation layer, wherein the additional insulation layer is exposed by the removal of the insulation layer in all regions except the region under the first and second electrodes.

(12) A semiconductor light emitting device comprising: a light transmitting substrate; a first semiconductor light emitting device chip provided with a first semiconductor region having a first conductivity, an active region for generating light by electron-hole recombination and a second semiconductor region having a second conductivity different from the first conductivity, which are sequentially grown, the first semiconductor light emitting device chip including a first electrode electrically connected to the first semiconductor region and a second electrode electrically connected to the second semiconductor region; an adhesive layer for bonding the light transmitting substrate with the first semiconductor region of the first semiconductor light emitting device chip; and a passivation layer for covering at least the first semiconductor light emitting device chip and the adhesive layer.

(13) There is also provided the semiconductor light emitting device of (12), wherein the passivation layer is extended over an exposed portion of the light transmitting substrate without the adhesive layer.

(14) There is also provided the semiconductor light emitting device of (13), wherein the first electrode and the second electrode are formed on the passivation layer and are extended over the exposed portion of the light transmitting substrate without the adhesive layer.

(15) There is also provided the semiconductor light emitting device of (12), comprising: a first electrode post formed on the first electrode, extending upwards beyond the height of the first semiconductor light emitting device chip; and a second electrode post formed on the second electrode, extending upwards beyond the height of the first semiconductor light emitting device chip, with the first electrode and the second electrode being extended over the light transmitting substrate.

(16) There is also provided the semiconductor light emitting device of (12), comprising: an encapsulant for covering the first semiconductor light substrate and supporting the first electrode post and the second electrode post.

(17) There is also provided the semiconductor light emitting device of (12), comprising: a second semiconductor light emitting device chip provided on the light transmitting substrate, wherein the second semiconductor light emitting device chip includes a first semiconductor region having a first conductivity, an active region for generating light by electron-hole recombination, a second semiconductor region having a second conductivity different from the first conductivity, a first electrode electrically connected to the first semiconductor region and extended over the light transmitting substrate, a second electrode electrically connected to the second semiconductor region and extended over the light transmitting substrate, a first electrode post formed on the first electrode, extending upwards beyond the height of the second semiconductor light emitting device chip and a second electrode post formed on the second electrode, extending upwards beyond the height of the second semiconductor light emitting device chip, which are sequentially grown, with the first electrode and the second electrode being extended over the light transmitting substrate, with one of the first electrode post of the first semiconductor light emitting device chip, the first electrode post of the second semiconductor light emitting device chip, the second electrode post of the first semiconductor light emitting device chip or the second electrode post of the second light emitting device chip being integrally formed as a common electrode.

(18) There is also provided the semiconductor light emitting device of (12), comprising: an encapsulant for covering the first semiconductor light emitting device chip and the second semiconductor light emitting device chip, and for supporting the first electrode post of the first semiconductor light emitting device chip, the second electrode post of the first semiconductor light emitting device chip, the first electrode post of the second semiconductor light emitting device chip and the second electrode post of the second semiconductor light emitting device chip.

(19) There is also provided the semiconductor light emitting device of (12), wherein the passivation layer covers the first semiconductor light emitting device chip and the second semiconductor light emitting device chip.

(20) There is also provided the semiconductor light emitting device of (12), comprising: a third semiconductor light emitting device chip provided on the light transmitting substrate, wherein the third semiconductor light emitting device chip includes a first semiconductor region having a first conductivity, an active region for generating light by electron-hole recombination, a second semiconductor region having a second conductivity different from the first conductivity, a first electrode electrically connected to the first semiconductor region and extended over the light transmitting substrate, a second electrode electrically connected to the second semiconductor region and extended over the light transmitting substrate, a first electrode post formed on the first electrode, extending upwards beyond the height of the third semiconductor light emitting device chip and a second electrode post formed on the second electrode, extending upwards beyond the height of the third semiconductor light emitting device chip, which are sequentially grown, with the first electrode and the second electrode being extended over the light transmitting substrate, with one of the first electrode post of the first semiconductor light emitting device chip, the first electrode post of the second semiconductor light emitting device chip, the first electrode post of the third semiconductor light emitting device chip, the second electrode post of the first semiconductor light emitting device chip, the second electrode post of the second light emitting device chip or the second electrode post of the third light emitting device chip being integrally formed as a common electrode.

(21) There is also provided the semiconductor light emitting device of (12), comprising: an encapsulant for covering the first semiconductor light emitting device chip, the second semiconductor light emitting device chip and the third semiconductor light emitting device chip, and for supporting the first electrode post of the first semiconductor light emitting device chip, the second electrode post of the first semiconductor light emitting device chip, the first electrode post of the second semiconductor light emitting device chip, the second electrode post of the second semiconductor light emitting device chip, the first electrode post of the third semiconductor light emitting device chip and the second electrode post of the third semiconductor light emitting device chip.

(22) There is also provided the semiconductor light emitting device of (12), wherein the second semiconductor region of the first semiconductor light emitting device chip, the second semiconductor region of the second semiconductor light emitting device chip and the second semiconductor region of the third semiconductor light emitting device chip are provided on the opposite side of the light transmitting substrate with respect to the active region A of each of the first, second and third semiconductor light emitting device chips.

(23) There is also provided the semiconductor light emitting device of (12), wherein the passivation layer covers the first semiconductor light emitting device chip, the second semiconductor light emitting device chip and third semiconductor light emitting device chip.

(24) A semiconductor light emitting device chip comprising: a light transmitting substrate; a first semiconductor light emitting device chip provided with a first semiconductor region having a first conductivity, an active region for generating light by electron-hole recombination and a second semiconductor region having a second conductivity different from the first conductivity, which are sequentially grown, the first semiconductor light emitting device chip including a first electrode electrically connected to the first semiconductor region and a second electrode electrically connected to the second semiconductor region, wherein the light transmitting substrate serves as a window through which the light is emitted; and a first thin film transistor for controlling light emission of the first semiconductor light emitting device chip, the first thin film transistor being deposited on the light transmitting substrate.

(25) There is also provided the semiconductor light emitting device of (24), comprising: a first electrode post formed on the first electrode, extending upwards beyond the height of the first semiconductor light emitting device chip; and a second electrode post formed on the second electrode, extending upwards beyond the height of the first semiconductor light emitting device chip, with the first electrode and the second electrode being extended over the light transmitting substrate.

(26) There is also provided the semiconductor light emitting device of (24), wherein the first thin film transistor includes a first gate electrode for controlling light emission of the first semiconductor light emitting device chip and a first gate electrode post electrically connected to the first gate electrode over the light transmitting substrate and formed at a greater height than the first semiconductor light emitting device chip.

(27) There is also provided the semiconductor light emitting device of (24), comprising: an encapsulant for covering the first semiconductor light emitting device chip and for supporting the first electrode post, the second electrode post and the first gate electrode post.

(28) There is also provided the semiconductor light emitting device of (24), comprising: a second semiconductor light emitting device chip provided on the light transmitting substrate; and a second thin film transistor for controlling light emission of the second semiconductor light emitting device chip, the second thin film transistor being deposited on the light transmitting substrate, wherein the second light transmitting device chip includes a first semiconductor region having a first conductivity, an active region for generating light by electron-hole recombination, a second semiconductor region having a second conductivity different from the first conductivity, a first electrode electrically connected to the first semiconductor region and extended over the light transmitting substrate, a second electrode electrically connected to the second semiconductor region and extended over the light transmitting substrate, a first electrode post formed on the first electrode, extending upwards beyond the height of the second semiconductor light emitting device chip and a second electrode post formed on the second electrode, extending upwards beyond the height of the second semiconductor light emitting device chip, which are sequentially grown, with the first electrode and the second electrode being extended over the light transmitting substrate, and wherein the second thin film transistor includes a second gate electrode for controlling light emission of the second semiconductor light emitting device chip and a second gate electrode post electrically connected to the second gate electrode over the light transmitting substrate and formed at a greater height than the second semiconductor light emitting device chip.

(29) There is also provided the semiconductor light emitting device of (24), comprising: a third semiconductor light emitting device chip provided on the light transmitting substrate; and a third thin film transistor for controlling light emission of the third semiconductor light emitting device chip, the third thin film transistor being deposited on the light transmitting substrate, wherein the third light transmitting device chip includes a first semiconductor region having a first conductivity, an active region for generating light by electron-hole recombination, a second semiconductor region having a second conductivity different from the first conductivity, a first electrode electrically connected to the first semiconductor region and extended over the light transmitting substrate, a second electrode electrically connected to the second semiconductor region and extended over the light transmitting substrate, a first electrode post formed on the first electrode, extending upwards beyond the height of the third semiconductor light emitting device chip and a second electrode post formed on the second electrode, extending upwards beyond the height of the third semiconductor light emitting device chip, which are sequentially grown, with the first electrode and the second electrode being extended over the light transmitting substrate, and wherein the third thin film transistor includes a third gate electrode for controlling light emission of the third semiconductor light emitting device chip and a third gate electrode post electrically connected to the third gate electrode over the light transmitting substrate and formed at a greater height than the third semiconductor light emitting device chip.

(30) There is also provided the semiconductor light emitting device of (24), wherein one of the first electrode post of the first semiconductor light emitting device chip, the first electrode post of the second semiconductor light emitting device chip, the first electrode post of the third semiconductor light emitting device chip, the second electrode post of the first semiconductor light emitting device chip, the second electrode post of the second semiconductor light emitting device chip or the second electrode post of the third semiconductor light emitting device chip is integrally formed as a common electrode.

(31) There is also provided the semiconductor light emitting device of (24), comprising: an encapsulant for covering the first semiconductor light emitting device chip, the second semiconductor light emitting device chip and the third semiconductor light emitting device chip, and for supporting the first electrode post of the first semiconductor light emitting device chip, the second electrode post of the first semiconductor light emitting device chip, the first electrode post of the second semiconductor light emitting device chip, the second electrode post of the second semiconductor light emitting device chip, the first electrode post of the third semiconductor light emitting device chip, the second electrode post of the third semiconductor light emitting device chip, the first gate electrode post, the second gate electrode post and the third gate electrode post.

(32) There is also provided the semiconductor light emitting device of (24), comprising: a transparent adhesive layer for bonding each of the first semiconductor light emitting device chip, the second semiconductor light emitting device chip and the third semiconductor light emitting device to the light transmitting substrate.

(33) A semiconductor light emitting device comprising: a light transmitting substrate having a first surface and a second surface opposite to the first surface; a semiconductor light emitting device chip provided with a first semiconductor region having a first conductivity, an active region for generating light by electron-hole recombination and a second semiconductor region having a second conductivity different from the first conductivity, which are sequentially grown, the semiconductor light emitting device chip including a first electrode electrically connected to the first semiconductor region and a second electrode electrically connected to the second semiconductor region, wherein a first surface of the light transmitting substrate is where the semiconductor light emitting device chip is formed and a second surface of the light transmitting substrate serves as a window through which the light is emitted; and a black matrix material provided at least the first or the second surface of the light transmitting substrate.

(34) There is also provided the semiconductor light emitting device of (33), comprising: a first electrode post formed on the first electrode, extending upwards beyond the height of the first semiconductor light emitting device chip; and a second electrode post formed on the second electrode, extending upwards beyond the height of the first semiconductor light emitting device chip, with the first electrode and the second electrode being extended over the light transmitting substrate.

(34) There is also provided the semiconductor light emitting device of (33), comprising: a non-conducting reflective film having the black matrix material on a first surface thereof, the non-conducting reflective film being provided between the black matrix material and the first and second electrodes.

(35) A method of manufacturing a semiconductor light emitting device, the method comprising: preparing three semiconductor light emitting device chips, each chip being provided with an N-type semiconductor region, a P-type semiconductor region and an active region being interposed between the N-type semiconductor region and the P-type semiconductor region and generating light by electron-hole recombination; and bonding the three semiconductor light emitting device chips to a light transmitting substrate provided with an adhesive layer, with the N-type semiconductor region of each of the three semiconductor light emitting device chips being positioned on the adhesive layer side.

(36) There is also provided the method of manufacturing a semiconductor light emitting device of (35), wherein each of the three semiconductor light emitting device chips has a first electrode in electrical communication with the N-type semiconductor region and a second electrode in electrical communication with the P-type semiconductor region, and the bonding is performed such that the first electrode and the second electrode of each of the three semiconductor light emitting device chips are positioned on the opposite side of the N-type semiconductor region with respect to the active region.

(37) There is also provided the method of manufacturing a semiconductor light emitting device of (35), wherein the N-type semiconductor region, the active region and the P-type semiconductor region of each of the three semiconductor light emitting device chips are sequentially grown on a growth substrate, and in the bonding the N-type semiconductor region of each of the three semiconductor light emitting device chips is bonded to the adhesive layer after the growth substrate is removed.

(38) There is also provided the method of manufacturing a semiconductor light emitting device of (35), wherein the first electrode and the second electrode of each of the three semiconductor light emitting device chips are extended over the light transmitting substrate, and the method further comprises: forming a plurality of electrode posts on the first electrode and the second electrode of each of the three semiconductor light emitting device chips for supplying power to the three semiconductor light emitting device chips.

(39) There is also provided the method of manufacturing a semiconductor light emitting device of (35), wherein one of the plurality of electrode posts is a common electrode.

(40) There is also provided the method of manufacturing a semiconductor light emitting device of (35), wherein the light transmitting substrate has a first surface and a second surface opposite to the first surface, and the method further comprises: forming a black matrix material on at least one of the first surface or the second surface.

(41) A method of manufacturing a semiconductor light emitting device, the method comprising: preparing a plurality of semiconductor light emitting device chips, each of the chips being provided with an N-type semiconductor region, a P-type semiconductor region, an active region being interposed between the N-type semiconductor region and the P-type semiconductor region and generating light by electron-hole recombination and a light transmitting substrate on which the N-type semiconductor region, the active region and the P-type semiconductor region are disposed, wherein in a semiconductor light emitting device of at least one of the plurality of semiconductor light emitting device chips, the corresponding light transmitting substrate is bonded after the corresponding N-type semiconductor region, active region and P-type semiconductor region are grown; bonding the plurality of semiconductor light emitting device chips to a first substrate; and removing the light transmitting substrate from a corresponding side of each of the plurality of semiconductor light emitting device chips by laser ablation. While FIGS. 39 to 42 illustrated three semiconductor light emitting device chips, it should be understood that the manufacturing methods of the present disclosure can be applied to a case where two or more semiconductor light emitting device chips are available. Moreover, although chips per se can emit UV, blue, green or red light, phosphors or quantum dots (QD) may be applied or coated onto the chips that emit lights of the same wavelength.

(42) There is also provided the method of manufacturing a semiconductor light emitting device of (41), further comprising: after removing the light transmitting substrate from the corresponding side of each of the plurality of semiconductor light emitting device chips, bonding a second substrate to the side of each of the plurality of semiconductor light emitting device chips; and removing the first substrate.

(43) There is also provided the method of manufacturing a semiconductor light emitting device of (41), wherein bonding the plurality of semiconductor light emitting device chips to a first substrate involves bonding the plurality of semiconductor light emitting device chips in a manner that the N-type semiconductor region of each of the plurality of semiconductor light emitting device chip is positioned on the first substrate.

(44) A method of manufacturing a micro-LED display having a plurality of pixels, the method comprising: preparing a plurality of semiconductor light emitting devices, each device including an N-type semiconductor region, a P-type semiconductor region, an active region being interposed between the N-type semiconductor region and the P-type semiconductor region and generating light by electron-hole recombination, a first and a second electrode serving as bonding electrodes and being electrically connected to the N-type semiconductor region and the P-type semiconductor region, respectively, and a substrate on which the N-type semiconductor region, the active region and the P-type semiconductor region are disposed; and placing the plurality of semiconductor light emitting device chips on one of the plurality of pixels.

(45) There is also provided the method of manufacturing a micro-LED of (44), wherein the substrate is a light transmitting substrate, and placing the plurality of semiconductor light emitting device chips on one of the plurality of pixels involves positioning the first electrode and the second electrode on the pixel side and positioning the substrate on the opposite side of the first electrode and the second electrode with respect to the N-type semiconductor region, the active region and the P-type semiconductor region.

(46) There is also provided the method of manufacturing a micro-LED of (44), wherein the first electrode and the second electrode are provided on a part of the substrate, on which the N-type semiconductor region, the active region and the P-type semiconductor region are not formed.

(47) There is also provided the method of manufacturing a micro-LED of (44), wherein at least one of the plurality of semiconductor light emitting devices has two emission on the corresponding substrate.

(48) There is also provided the method of manufacturing a micro-LED of (44), wherein at least one of the plurality of semiconductor light emitting devices has a non-emission device on the corresponding substrate.

(49) There is also provided the method of manufacturing a micro-LED of (44), wherein the substrate has a conductive portion coupled to each of the first electrode and the second electrode, and placing the plurality of semiconductor light emitting device chips on one of the plurality of pixels involves positioning substrate on the pixel side and positioning the first electrode and the second electrode on the substrate side with respect to the N-type semiconductor region, the active region and the P-type semiconductor region.

(50) There is also provided the method of manufacturing a micro-LED of (44), wherein the N-type semiconductor region of each of the plurality of semiconductor light emitting devices is positioned on the opposite side of the first electrode and the second electrode with respect to the active region.

(51) There is also provided the method of manufacturing a micro-LED of (44), comprising: a black matrix material in the N-type semiconductor region.

(52) A method for transferring a plurality of semiconductor light emitting device chips, in which a plurality of first semiconductor light emitting device chips that emits a first color and a plurality of second semiconductor light emitting device chips that emits a second color different from the first color are transferred and arranged on a transfer receiving substrate in an alternate manner, the method comprising: preparing a first carrier to which the plurality of first semiconductor light emitting device chips that emits the first color is attached using a laser reactive material as a medium; transferring, by laser irradiation, the plurality of first semiconductor light emitting chips from the first carrier to the transfer receiving substrate provided with a mask for securing the postures and positions of the plurality of first semiconductor light emitting device chips; preparing a second carrier to which the plurality of second semiconductor light emitting device chips that emits the second color different from the first color is attached using a laser reactive material as a medium; and transferring, by laser irradiation, the plurality of second semiconductor light emitting chips from the second carrier to the transfer receiving substrate provided with a mask for securing the postures and positions of the plurality of second semiconductor light emitting device chips.

(53) There is also provided the method for transferring a plurality of semiconductor light emitting device chips of (52), wherein each of the plurality of first and second semiconductor light emitting device chips includes a light transmitting substrate that is prepared with the first carrier and the second carrier being attached thereto.

(54) There is also provided the method for transferring a plurality of semiconductor light emitting device chips of (52), wherein the transfer receiving substrate is a light transmitting substrate, and the method comprises re-transferring, in the presence of the mask, the plurality of first semiconductor light emitting device chips and the plurality of second semiconductor light emitting device chips, which had been transferred to the transfer receiving substrate.

(55) A semiconductor light emitting device structure comprising: a transfer receiving substrate provided with an adhesive layer and a mask for securing the posture of a semiconductor light emitting device; and the semiconductor light emitting device attached to the adhesive layer, with the posture of the device being secured by the mask, wherein the transfer receiving substrate is a light transmitting substrate and the adhesive layer is made of a detachable material to enable the re-transfer of the semiconductor light emitting device.

(56) A method of manufacturing a semiconductor light emitting device, the method comprising: sequentially growing an N-type semiconductor region, an active region and a P-type semiconductor region on a growth substrate, wherein the growth substrate has a convex up shape after the growing is over; bonding a first support substrate to the P-type semiconductor region using one of a metal bonding material or an organic adhesive; removing the growth substrate; performing direct wafer bonding of a second support substrate to the N-type semiconductor region where the growth substrate has been removed; and removing the first support substrate. Here, in general, the semiconductor light emitting device has a semiconductor wafer state and may be formed into a semiconductor light emitting device die, a semiconductor light emitting device chip or a semiconductor light emitting package.

(57) There is also provided the method of manufacturing a semiconductor light emitting device of (56), wherein $SiO_2$ is used for the direct wafer bonding.

(58) There is also provided the method of manufacturing a semiconductor light emitting device of (56), wherein removing the first support substrate is performed, with the thickness of the second support substrate being reduced and a third support substrate being attached to the second support substrate having the reduced thickness.

(59) A semiconductor light emitting device comprising: a light transmitting substrate; an inorganic light transmitting adhesive layer provided on the light transmitting substrate; an N-type semiconductor region provided on the light transmitting adhesive layer; an active region provided on the N-type semiconductor region; and a P-type semiconductor region provided on the active region.

(60) There is also provided the semiconductor light emitting device of (59), wherein the light transmitting adhesive layer comprises $SiO_2$.

(61) There is also provided the semiconductor light emitting device of (59), comprising: a light transmitting electrode formed on the P-type semiconductor region.

(62) There is also provided the semiconductor light emitting device of (59), comprising: a sacrificial layer provided between the light transmitting adhesive layer and the light transmitting substrate.

(63) A method of manufacturing a semiconductor light emitting device, the method comprising: preparing a plurality of semiconductor light emitting device dies, each die including a sequence of a substrate, a N-type semiconductor region, an active region and a P-type semiconductor region; bonding the plurality of semiconductor light emitting device dies to a temporary substrate provided with an adhesive layer, with the substrate of each of the plurality of semiconductor light emitting device dies facing up to be bonded; removing the substrate of each of the plurality of semiconductor light emitting device dies; performing direct wafer bonding of a light transmitting substrate to the N-type semiconductor region of each of the dies where the substrate has been removed; and removing the temporary substrate.

(64) There is also provided the method of manufacturing a semiconductor light emitting device of (63), wherein each of the plurality of semiconductor light emitting device dies has a first electrode electrically connected to the N-type semiconductor region and a second electrode electrically connected to the P-type semiconductor region, forming a semiconductor light emitting device chip.

(65) A semiconductor light emitting device comprising: a light transmitting substrate; an inorganic light transmitting adhesive layer provided on the light transmitting substrate; and a plurality of semiconductor light emitting device chips bonded onto the light transmitting adhesive layer, each chip including an N-type semiconductor region, an active region provided on the N-type semiconductor region and a P-type semiconductor region provided on the active region, wherein the N-type semiconductor region is positioned on the light transmitting adhesive layer side.

(66) There is also provided the semiconductor light emitting device of (65), wherein the light transmitting adhesive layer comprises $SiO_2$.

(67) There is also provided the semiconductor light emitting device of (65), comprising: a light transmitting electrode formed on the P-type semiconductor region.

(68) A method of manufacturing a semiconductor light emitting device, the method comprising: preparing a light emitting unit including a sequence of a substrate, an N-type semiconductor region, an active region and a P-type semiconductor region, the light emitting unit having a first area; bonding the light emitting unit to a temporary substrate provided with an adhesive layer, with the substrate of the light emitting unit facing up to be bonded; removing the substrate of the light emitting unit; bonding a light transmitting substrate to the N-type semiconductor region side where the substrate of the light emitting unit has been removed; removing the temporary substrate; and reducing the light emitting unit to a second area smaller than the first area through etching which is performed while the light emitting unit is being bonded to the light transmitting substrate.

(69) There is also provided the method of manufacturing a semiconductor light emitting device of (68), wherein the light transmitting substate is bonded by direct wafer bonding.

(70) There is also provided the method of manufacturing a semiconductor light emitting device of (68), wherein reducing the light emitting unit involves dividing the light emitting unit into multiple parts.

(71) There is also provided the method of manufacturing a semiconductor light emitting device of (68), comprising: after reducing the light emitting unit, forming a first electrode electrically connected to the N-type semiconductor region and a second electrode electrically connected to the P-type semiconductor region.

(72) A method of manufacturing a semiconductor light emitting device, the method comprising: preparing three semiconductor light emitting device dies emitting blue, green and red, respectively, each die including a substrate, an N-type semiconductor region, an active region, and a P-type semiconductor region; attaching the three semiconductor light emitting dies to a temporary substrate, with the substrate of each of the three semiconductor light emitting device dies facing up to be attached; removing the substrate of each of the three semiconductor light emitting device dies; attaching a light transmitting substrate to the side where the substrate of each of the three semiconductor light emitting device dies has been removed; and removing the temporary substrate, wherein each of at least two out of the three semiconductor light emitting device dies has a growth substrate on which the N-type semiconductor region, the active region and the P-type semiconductor region are grown, preparing three semiconductor light emitting device dies involves removing the growth substrate of each of the at least two out of the three semiconductor light emitting device dies by CLO (Chemical Lift Off), and removing the substrate involves removing the substrate of each of the three semiconductor light emitting device dies by LLO (Laser Lift Off).

(73) There is also provided the method of manufacturing a semiconductor light emitting device of (72), wherein the growth substrate of each of the at least two out of the three semiconductor light emitting device dies is a Si substrate and a GaAs substrate.

(74) There is also provided the method of manufacturing a semiconductor light emitting device of (72), wherein removing the substrate involves removing the substrate to expose the N-type semiconductor region of each of the three semiconductor light emitting device dies.

(75) A method of manufacturing a semiconductor light emitting device, the method comprising: preparing three semiconductor light emitting device dies emitting blue, green and red, respectively, each die including a substrate, an N-type semiconductor region, an active region, and a P-type semiconductor region; attaching the three semiconductor light emitting dies to a temporary substrate, with the substrate of each of the three semiconductor light emitting device dies facing up to be attached; removing the substrate of each of the three semiconductor light emitting device dies; attaching a light transmitting substrate to the side where the substrate of each of the three semiconductor light emitting device dies has been removed; and removing the temporary substrate, wherein the substrate is a growth substrate on which the N-type semiconductor region, the active region and the P-type semiconductor region are grown, removing the substrate of each die involves removing, in one process, surface oxides on the growth substrate of each of the three semiconductor light emitting device dies.

(76) A method of manufacturing a semiconductor light emitting device, the method comprising: preparing on a single light transmitting substrate a plurality of semiconductor light emitting chips, each chip including a first electrode and a second electrode provided on one side of the chip that faces the light transmitting substrate; attaching a support substrate from the side of the first electrode and the second electrode; reducing the thickness of the light transmitting substrate; dividing the light transmitting substrate to obtain individualized semiconductor light emitting device chips; attaching a support to a separate light transmitting substrate having the reduced thickness; and removing the support substrate.

(77) There is also provided the method of manufacturing a semiconductor light emitting device of (76), further comprising: expanding the support to increase spacing between the plurality of semiconductor light emitting device chips.

(78) There is also provided the method of manufacturing a semiconductor light emitting device of (76), further comprising: prior to attaching the support substrate, forming a protective layer for covering the plurality of semiconductor light emitting device chips.

(79) There is also provided the method of manufacturing a semiconductor light emitting device of (76), wherein attaching the support substrate involves attaching the support substrate and the protective layer through an adhesive layer.

(80) There is also provided the method of manufacturing a semiconductor light emitting device of (76), wherein the light transmitting substrate is a growth substrate.

(81) There is also provided the method of manufacturing a semiconductor light emitting device of (76), wherein an adhesive layer is provided between the light transmitting substrate and the plurality of semiconductor light emitting device chips.

(82) There is also provided the method of manufacturing a semiconductor light emitting device of (76), wherein preparing a plurality of semiconductor light emitting device chips includes removing a growth substrate of the plurality of semiconductor light emitting device chips.

(83) There is also provided the method of manufacturing a semiconductor light emitting device of (82), wherein the growth substrate is a Si substrate.

(84) A semiconductor light emitting device comprising: at least one light emitting unit, each unit including a first semiconductor region having a first conductivity, a second semiconductor region having a second conductivity different from the first conductivity and an active region being interposed between the first semiconductor region and the second semiconductor region and generating light by electron-hole recombination; a light transmitting substrate for supporting the at least one light emitting unit; a first electrode formed on the light transmitting substrate and electrically connected to the first semiconductor region; an adhesive layer being formed on the first electrode and bonding the at least one light emitting unit and the light transmitting substrate; and a second electrode electrically connected to the second semiconductor region.

(85) There is also provided the semiconductor light emitting device of (84), wherein the first electrode and the adhesive layer are made of a light transmitting material so that light generated by the active region is emitted towards the light transmitting substrate.

(86) There is also provided the semiconductor light emitting device of (84), further comprising: a first electrode post and a second electrode post formed on the light transmitting substrate, the first electrode post and the second electrode post being electrically connected to the first electrode and the second electrode, respectively, for supplying power from an external power supply.

(87) There is also provided the semiconductor light emitting device of (84), wherein the first electrode and the adhesive layer between the first semiconductor region and the light transmitting substrate exhibit light transmitting properties and are formed into a light transmitting conducting oxide-bonding metals or alloy thereof-light transmitting conducting oxide film such that conducting and bonding effects are provided between the first semiconductor region and the light transmitting substrate.

(88) There is also provided the semiconductor light emitting device of (84), wherein the first electrode has a metal reflector such that light generated by the active region is emitted towards the opposite side of the light transmitting substrate.

(89) There is also provided the semiconductor light emitting device of (84), further comprising: a first electrode post and a second electrode post formed on the light transmitting substrate, the first electrode post and the second electrode post being electrically connected to the first electrode and the second electrode, respectively, for supplying power from an external power supply.

(90) A semiconductor light emitting device constituting a pixel light source, the device comprising: at least one semiconductor light emitting unit, each unit including a first light transmitting substrate having a first thickness, a first semiconductor region being formed on the first light transmitting substrate and having a first conductivity, a second semiconductor region having a second conductivity different from the first conductivity, an active region being interposed between the first semiconductor region and the second semiconductor region and generating light, a first electrode part electrically connected to the first semiconductor region and a second electrode part electrically connected to the second semiconductor region; a second light transmitting substrate having a second thickness greater than the first thickness; and a lower adhesive layer for bonding the first light transmitting substrate of the at least one semiconductor light emitting unit and the second light transmitting substrate.

(91) There is also provided the semiconductor light emitting device of (90), wherein the lower adhesive layer secures lateral surfaces of the first light transmitting substrate.

(92) There is also provided the semiconductor light emitting device of (90), further comprising: an upper adhesive layer for securing lateral surfaces of the at least one semiconductor light emitting unit, from the opposite side of the first light transmitting substrate.

(93) There is also provided the semiconductor light emitting device of (90), further comprising: a black matrix material formed on the lower adhesive layer to a height lower than the at least one semiconductor light emitting unit, thereby securing the lateral surfaces of the at least one semiconductor light emitting unit.

(94) There is also provided the semiconductor light emitting device of (90), wherein the first thickness is 50 μm or less.

(95) A semiconductor light emitting device constituting a pixel light source, the device comprising: at least two semiconductor light emitting units, each unit including a first light transmitting substrate, a first semiconductor region being formed on the first light transmitting substrate and having a first conductivity, a second semiconductor region having a second conductivity different from the first conductivity, an active region being interposed between the first semiconductor region and the second semiconductor region and generating light, a first electrode part electrically connected to the first semiconductor region and a second electrode part electrically connected to the second semiconductor region; and a lower adhesive layer on the opposite side of the first semiconductor region with respect to the first light transmitting substrate, the lower adhesive layer bonded to the first light transmitting substrate of each unit to secure the at least two semiconductor light emitting units and adapted to open a portion of the first light transmitting substrate of each unit to allow light generated by the active region of each unit to be emitted outside.

(96) There is also provided the semiconductor light emitting device of (95), wherein the lower adhesive layer secures lateral surfaces of the first light transmitting substrate.

(97) There is also provided the semiconductor light emitting device of (95), further comprising: an upper adhesive layer for securing lateral surfaces of the at least two semiconductor light emitting units, from the opposite side of the first light transmitting substrate.

(98) There is also provided the semiconductor light emitting device of (95), further comprising: a black matrix material formed on the lower adhesive layer to a height lower than the at least two semiconductor light emitting units, thereby securing the lateral surfaces of the at least two semiconductor light emitting units.

(99) There is also provided the semiconductor light emitting device of (95), wherein the lower adhesive layer is made of a light transmitting material.

(100) There is also provided the semiconductor light emitting device of (95), wherein the lower adhesive layer is made of a metallic material.

(101) There is also provided the semiconductor light emitting device of (95), wherein the first light transmitting substrate has a thickness of 50 μm or less.

The methods of manufacturing a semiconductor light emitting device according to the present disclosure increase yield and reliability to be able to provide flip chip semiconductor light emitting devices with high mass productivity. In particular, their application to the manufacture of mini- or micro-LEDs can significantly increase the mass productivity.

The semiconductor light emitting device according to the present disclosure has reduced structural tilting (height difference) between the first electrode and the second electrode serving as bonding pads of a flip chip. Hence, direction of lights emitted from the semiconductor light emitting device can be controlled in a uniform manner, which eventually contributes to an increased optical quality in applications including displays and lighting.

With the semiconductor light emitting device of the present disclosure, it is possible to manufacture a mini- or micro-LED package configured with p-side up flip chips for all RGB chips, without compromising the reliability of the device.

The mini- or micro-LED package based on the semiconductor light emitting device of the present disclosure (e.g., interposer) employs a plate-shaped light transmitting substrate (e.g., sapphire, quartz or glass) as a window (an emission part), rather than the conventional transparent encapsulant.

What is claimed is:

1. A method of manufacturing a flip chip semiconductor light emitting device, the method comprising:
    providing a growth substrate on which a first N-type semiconductor region, an active region for generating light by electron-hole recombination, and a second P-type semiconductor region are sequentially grown;
    forming a protective layer on the second semiconductor region;
    bonding a first light transmitting substrate to the second semiconductor region;
    removing the growth substrate from the first semiconductor region;
    attaching a second light transmitting substrate through an adhesive layer to the first semiconductor region from which the growth substrate is removed;
    laser ablating the first light transmitting substrate from the second semiconductor region;
    partially removing the second semiconductor region and the active region to expose part of the first semiconductor region; and
    forming a first flip chip electrode and a second flip chip electrode on the exposed first semiconductor region and the exposed second semiconductor region, respectively,
    wherein forming the protective layer on the second semiconductor region is carried out before bonding the first light transmitting substrate.

2. The method of claim 1, wherein the light transmitting substrate is provided with a sacrificial layer, and the sacrificial layer and the protective layer are bonded by a metal bonding layer.

3. The method of claim 2, wherein after removing the first light transmitting substrate, and before exposing part of the first semiconductor region, sequentially removing the metal bonding layer and the protective layer.

4. The method of claim 3, wherein after sequentially removing the metal bonding layer and the protective layer, removing part of the adhesive layer so as to expose the second light transmitting substrate.

5. The method of claim 3, wherein after sequentially removing the metal bonding layer and the protective layer, forming a light transmitting electrode on the second semiconductor region.

* * * * *